(12) United States Patent
Kim et al.

(10) Patent No.: US 11,646,068 B2
(45) Date of Patent: *May 9, 2023

(54) MEMORY CONTROLLER AND OPERATING METHOD THEREOF

(71) Applicant: SK hynix Inc., Icheon (KR)

(72) Inventors: Hyun Sub Kim, Seongnam (KR); Ie Ryung Park, Suwon (KR); Dong Sop Lee, Yongin (KR); Sung Yeob Cho, Gyeonggi-do (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/477,358

(22) Filed: Sep. 16, 2021

(65) Prior Publication Data

US 2022/0005514 A1 Jan. 6, 2022

Related U.S. Application Data

(60) Division of application No. 16/888,492, filed on May 29, 2020, now Pat. No. 11,501,808, which is a
(Continued)

(30) Foreign Application Priority Data

Sep. 2, 2019 (KR) .................. 10-2019-0108259
Nov. 19, 2019 (KR) .................. 10-2019-0149055
Jan. 31, 2020 (KR) .................. 10-2020-0011548

(51) Int. Cl.
*G11C 8/00* (2006.01)
*G11C 7/22* (2006.01)
(Continued)

(52) U.S. Cl.
CPC ............ *G11C 7/222* (2013.01); *G11C 7/1051* (2013.01); *G11C 7/1072* (2013.01); *H03L 7/089* (2013.01); *H03L 7/0814* (2013.01)

(58) Field of Classification Search
CPC ..... G11C 7/222; G11C 7/1051; G11C 7/1072; H03L 7/0814; H03L 7/089
(Continued)

(56) References Cited

U.S. PATENT DOCUMENTS 4,481,513 A * 11/1984 Mole .................. G07C 9/00174
235/382
6,233,250 B1 5/2001 Liu et al.
(Continued)

FOREIGN PATENT DOCUMENTS

KR 10-0875348 B1 12/2008
KR 10-0940611 B1 2/2010
(Continued)

OTHER PUBLICATIONS

Office Action dated Oct. 27, 2021 in related U.S. Appl. No. 16/868,116.
(Continued)

*Primary Examiner* — Viet Q Nguyen

(57) ABSTRACT

A memory controller may include: a request checker identifying memory devices corresponding to requests received from a host among the plurality of memory devices and generating device information on the identified memory devices to perform operations corresponding to the requests; a dummy manager outputting a request for controlling a dummy pulse to be applied to channels of selected memory devices according to the device information among the plurality of channels; and a dummy pulse generator sequentially applying the dummy pulse to the channels coupled to the selected memory devices, based on the request for controlling the dummy pulse. A memory controller may include an idle time monitor outputting an idle time interval of the memory device and a clock signal generator generating a clock signal based on the idle time interval and
(Continued)

outputting the clock signal to the memory device through the channel to perform a current operation.

21 Claims, 46 Drawing Sheets

Related U.S. Application Data continuation-in-part of application No. 16/730,826, filed on Dec. 30, 2019, now Pat. No. 11,257,530, and a continuation-in-part of application No. 16/868,116, filed on May 6, 2020, now Pat. No. 11,355,213, and a continuation-in-part of application No. 16/841,030, filed on Apr. 6, 2020, now Pat. No. 11,264,086.

(51) Int. Cl.
  *G11C 7/10* (2006.01)
  *H03L 7/081* (2006.01)
  *H03L 7/089* (2006.01)

(58) Field of Classification Search
  USPC ..................................................... 365/233.1
  See application file for complete search history.

(56) References Cited

U.S. PATENT DOCUMENTS

| | | |
|---|---|---|
| 6,466,736 B1 | 10/2002 | Chen et al. |
| 6,529,571 B1 | 3/2003 | Gaudet |
| 6,587,918 B1 | 7/2003 | Christenson |
| 7,054,195 B2 | 5/2006 | Matsunaga |
| 7,315,957 B1 | 1/2008 | Wagner et al. |
| 7,464,282 B1 | 12/2008 | Abdollahi-Alibeik et al. |
| 7,827,424 B2 | 11/2010 | Bounitch |
| 8,592,784 B2 * | 11/2013 | Hautala .............. H01J 37/3171 250/492.2 |
| 9,142,001 B2 | 9/2015 | Samson et al. |
| 9,405,350 B2 | 8/2016 | Kanai et al. |
| 9,424,901 B1 | 8/2016 | An et al. |
| 9,633,737 B2 | 4/2017 | An |
| 10,042,416 B2 | 8/2018 | Tzafrir et al. |
| 10,249,234 B2 | 4/2019 | Kim |
| 10,409,357 B1 | 9/2019 | Li et al. |
| 10,825,535 B1 | 11/2020 | Pawlowski |
| 11,056,176 B2 | 7/2021 | Shin |
| 11,257,530 B2 | 2/2022 | Kim et al. |
| 11,355,213 B2 * | 6/2022 | Kim ....................... G11C 29/52 |
| 2005/0201192 A1 | 9/2005 | Honda |
| 2007/0217356 A1 * | 9/2007 | Kanno .............. H04W 52/0241 370/328 |
| 2009/0002868 A1 | 1/2009 | Van Den Bremt et al. |
| 2009/0244756 A1 | 10/2009 | Itakura et al. |
| 2009/0285061 A1 * | 11/2009 | Nagai ..................... G11B 20/18 |
| 2011/0153923 A1 | 6/2011 | Peng et al. |
| 2014/0023169 A1 | 1/2014 | Valiani et al. |
| 2016/0062930 A1 | 3/2016 | Kijima et al. |
| 2017/0062065 A1 | 3/2017 | Shim et al. |
| 2017/0351316 A1 | 12/2017 | Vratonjic et al. |
| 2018/0165023 A1 | 6/2018 | Oh et al. |
| 2019/0050159 A1 | 2/2019 | Jung et al. |
| 2019/0354300 A1 | 11/2019 | Benisty et al. |
| 2020/0159435 A1 | 5/2020 | Walker et al. |
| 2020/0294571 A1 | 9/2020 | Shin |
| 2021/0241843 A1 * | 8/2021 | Kim ....................... G11C 7/222 |

FOREIGN PATENT DOCUMENTS

| | | |
|---|---|---|
| KR | 20110004165 A | 1/2011 |
| KR | 101620348 B1 | 5/2016 |
| KR | 20180138351 A | 12/2018 |
| KR | 101983463 B1 | 5/2019 |

OTHER PUBLICATIONS

Office Action dated Oct. 14, 2021 in related U.S. Appl. No. 16/888,444.
Office Action dated Dec. 3, 2021 in U.S. Appl. No. 16/888,492.
Office Action dated May 16, 2022 in related U.S. Appl. No. 16/888,492.
Office Action dated Jul. 28, 2021 in related U.S. Appl. No. 16/841,030.
Office Action dated Dec. 24, 2020 in related U.S. Appl. No. 16/730,826.
Notice of Allowance dated Dec. 14, 2022 for U.S. Appl. No. 17/368,652.

* cited by examiner

FIG. 13

|   | CMD_QUEUE1 | CMD_QUEUE2 | CMD_QUEUE3 | CMD_QUEUE4 |
|---|---|---|---|---|
| 1 | CMD1 | CMD6 | CMD8 | CMD12 |
| 2 | CMD2 | CMD7 | CMD9 | CMD13 |
| 3 | CMD3 | -- | -- | CMD14 |
| 4 | -- | -- | CMD10 | -- |
| 5 | CMD4 | -- | CMD11 | -- |
| 6 | CMD5 | -- | -- | -- |

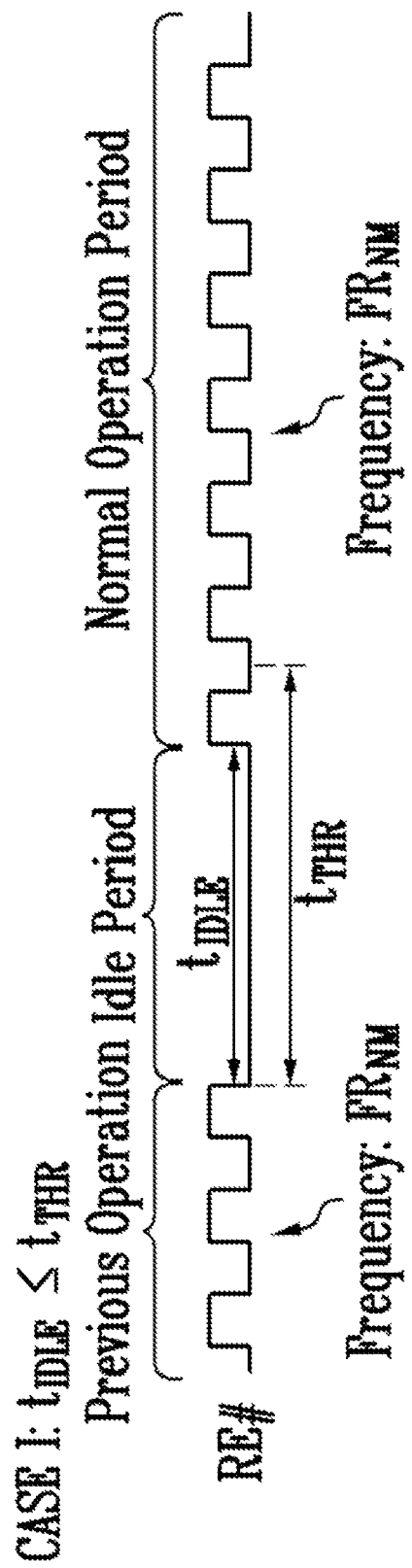

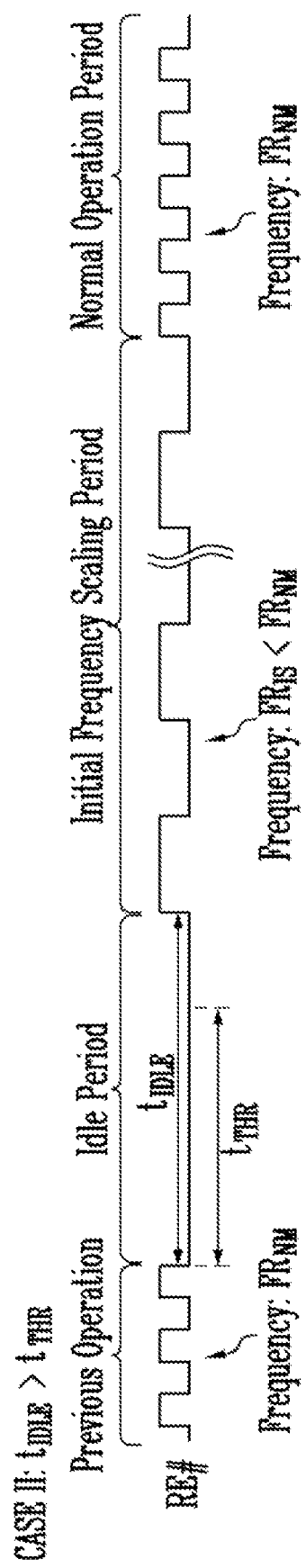

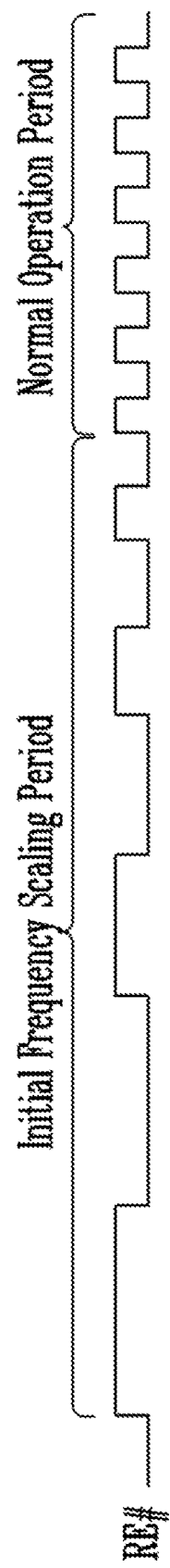

MEMORY CONTROLLER AND OPERATING METHOD THEREOF

CROSS-REFERENCE TO RELATED APPLICATIONS

The present application is a division of U.S. application Ser. No. 16/888,492, filed on May 29, 2020, which is a continuation in part of U.S. application Ser. No. 16/841,030, filed on Apr. 6, 2020, U.S. application Ser. No. 16/868,116, filed on May 6, 2020, and U.S. application Ser. No. 16/730,826, filed on Dec. 30, 2019, which respectively claim priority under 35 U.S.C. § 119(a) to Korean patent application number 10-2019-0108259, filed on Sep. 2, 2019, Korean Patent Application No. 10-2020-0011548, filed on Jan. 31, 2020, and Korean Patent Application Number 10-2019-0149055, filed on Nov. 19, 2019, each of which is incorporated herein by reference in its entirety.

BACKGROUND

Field of Invention

The present disclosure generally relates to an electronic device, and more particularly, to a memory controller and an operating method thereof.

Description of Related Art

A storage device stores data under the control of a host device such as a computer, a smart phone or a smart pad. The storage device may be a type that stores data on a magnetic disk, such as a Hard Disk Drive (HDD), or of a type that stores data on a semiconductor memory, i.e., a nonvolatile memory, such as a Solid State Drive (SSD) or a memory card.

The storage device may include a memory device that stores data and a memory controller that controls the memory device. The memory device may be a volatile memory device or a nonvolatile memory device. The nonvolatile memory device may be any of a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), and/or a Ferroelectric RAM (FRAM).

SUMMARY

Embodiments relate to a memory controller gradually changing a total current consumed by a plurality of memory devices, and an operating method of the memory controller. In an embodiment, the memory controller may control the plurality of memory devices using a dummy pulse sequentially applied to a plurality of channels coupled to the plurality of memory devices. In an embodiment, the memory controller may generate a clock signal based on an initial frequency that is lower than a normal frequency and control the plurality of memory devices using the clock signal. As a result, the memory controller may prevent a sudden change in the total current consumption by the plurality of memory devices.

Embodiments provide a memory controller capable of sequentially increasing or decreasing a total current consumed by a plurality of memory devices, and an operating method of the memory controller. In an embodiment, the memory controller may sequentially apply a dummy pulse to a plurality of channels coupled to the plurality of memory devices to sequentially increase the total current consumed by the plurality of memory devices, or sequentially interrupt the dummy pulse applied to the plurality of channels to sequentially decrease the total current, or both. As a result, noise in a voltage source due to a sudden change in total current consumption in the plurality of memory devices may be substantially prevented.

In accordance with an embodiment of the present disclosure, a memory controller for controlling a plurality of memory devices coupled through a plurality of channels includes a request checker configured to identify memory devices corresponding to requests received from a host among the plurality of memory devices, and generate device information on the identified memory devices to perform operations corresponding to the requests, a dummy manager configured to output a request for controlling a dummy pulse to be applied to channels of memory devices selected according to the device information among the plurality of channels, and a dummy pulse generator configured to sequentially apply the dummy pulse to the channels coupled to the selected memory devices based on the request for controlling the dummy pulse.

Embodiments of the present disclosure relate to a memory controller generating a clock signal to be output to one or more of a plurality of memory devices based on an initial frequency during an initial frequency scaling period, when an idle time exceeds a threshold time. Because the initial frequency of the clock signal is less than a normal frequency, total current consumption in a storage device including the plurality of memory devices may be prevented from rapidly increasing when the plurality of memory devices start operations simultaneously. As a result, noise in a voltage source due to a sudden increase in the total current consumption may be substantially prevented.

In accordance with an embodiment of the present disclosure, a memory controller is configured to control a memory device and the memory device is coupled to the memory controller through a channel. The memory controller includes an idle time monitor configured to output an idle time interval of the memory device, and a clock signal generator configured to generate a clock signal based on the idle time interval and output the clock signal to the memory device through the channel to perform a current operation. The idle time interval is between an end time of a previous operation of the memory device and a start time of the current operation.

Embodiments of the present disclosure relate to a memory system performing a modulation operation on a clock signal to generate a modulation clock signal that includes a plurality of modulation sections, thereby indexing read data into a plurality of section data that respectively correspond to the plurality of modulation sections of the clock signal. When specific section data of the read data includes one or more abnormal bits, the specific section data may be re-read from a memory cell region, rather than re-reading the entire read data, thereby increasing the efficiency of performing a read operation compared to a conventional memory system.

In accordance with an embodiment of the present disclosure, a memory system includes a memory device including a memory cell region for storing data and a memory controller. The memory device loops back a first clock to generate a second clock and outputs read data that are read from the memory cell region in synchronization with the second clock. The memory controller generates the first clock that includes a plurality of modulation sections by performing a modulation operation on a source clock according to a specific scheme, outputs the first clock to the memory device, and receives the read data in response to the second clock. The read data includes a plurality of section data corresponding to the plurality of modulation sections included in the second clock, respectively, and the memory controller verifies reliability of each of the plurality of section data included in the read data by performing a demodulation operation on the second clock according to the specific scheme.

BRIEF DESCRIPTION OF THE DRAWINGS

Various embodiments are described more fully below with reference to the accompanying drawings; however, embodiments of the present disclosure may be implemented in different forms and thus should not be construed as limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s).

FIG. 13 is a diagram illustrating application or interruption of a dummy pulse, which is determined based on a command queue.

FIGS. 28A and 28B are timing diagrams for describing a method of operating a memory controller in accordance with an embodiment of the present disclosure.

FIGS. 30A and 30B are timing diagrams for describing the embodiment illustrated in FIG. 29.

DETAILED DESCRIPTION

The specific structural and functional description disclosed herein is merely for the purpose of describing embodiments according to embodiments of the present disclosure. Embodiments of the present disclosure, however, may be implemented in various forms, and thus is not limited to the embodiments set forth herein.

Various embodiments of the present disclosure are described in detail below with reference to the accompanying drawings in order for those skilled in the art to be able to readily implement and practice embodiments of the present disclosure.

Figure 1:
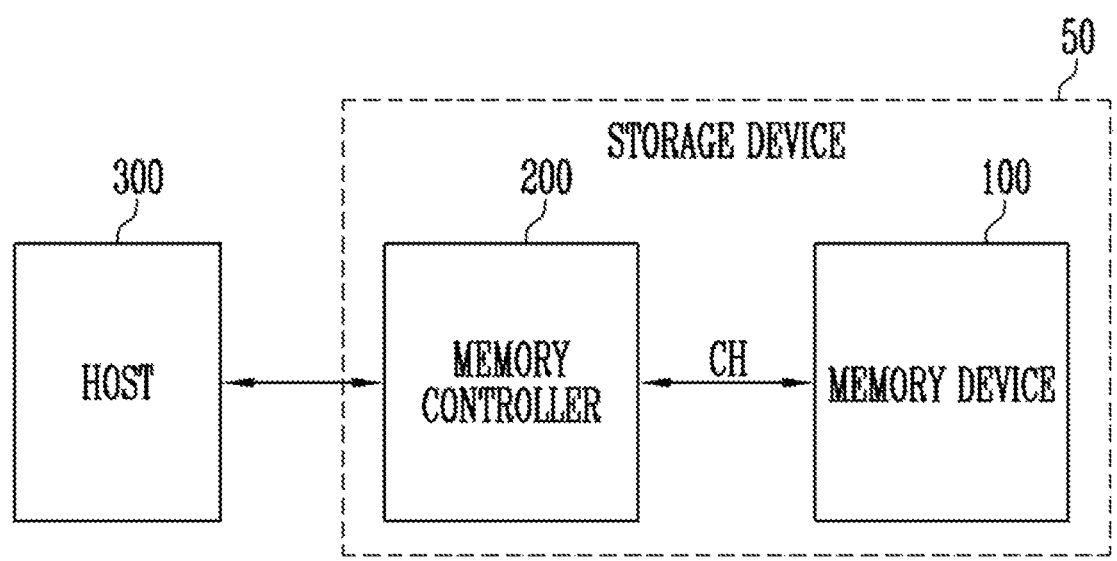
FIG. 1 is a block diagram illustrating a storage device in accordance with an embodiment of the present disclosure.

FIG. 1 is a block diagram illustrating a storage device according to an embodiment of the present disclosure.

Referring to FIG. 1, the storage device 50 may include a memory device 100 and a memory controller 200.

The storage device 50 may be for storing data under the control of a host 300, such as a mobile phone, a smart phone, an MP3 player, a laptop computer, a desktop computer, a game console, a TV, a tablet PC or an in-vehicle infotainment.

The storage device 50 may be configured as any of various types of storage devices according to a host interface that is a communication scheme with the host 300. For example, the storage device 50 may be implemented as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and/or a memory stick.

The storage device 50 may be manufactured as any of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and/or a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells, which may constitute a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example, features and aspects of embodiments of the present disclosure are described in the context in which the memory device 100 is a NAND flash memory.

In an embodiment, the memory device 100 may be implemented in a two-dimensional array structure or three-dimensional array structure. Below, an example in which the memory device 100 is implemented in the three-dimensional array structure is described as an embodiment; however, the present disclosure is not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single Level Cell (SLC) scheme in which one data bit is stored in one memory cell. Alternatively, the memory device 100 may be operated using a scheme in which at least two data bits are stored in one memory cell. For example, the memory device 100 may be operated using a Multi-Level Cell (MLC) scheme in which two data bits are stored in one memory cell, a Triple Level Cell (TLC) scheme in which three data bits are stored in one memory cell, or a Quadruple Level Cell (QLC) scheme in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, multiple instances of the memory device 100 may be provided. That is, a plurality of memory devices may be included in the storage device 50.

The plurality of memory devices may be coupled to, for communication with, the memory controller 200 through channels CH. For example, the memory controller 200 may instruct an operation of each of the plurality of memory devices, and each of the plurality of memory devices may perform an operation corresponding to the instruction of the memory controller 200. Also, each of the plurality of memory devices may output a result obtained by performing the operation to the memory controller 200.

The memory controller 200 may control overall operations of the storage device 50.

When a power supply voltage is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

In an embodiment, the memory controller 200 may include firmware which receives data and a logical block address (LBA) from the host 300, and translates the LBA into a physical block address (PBA) indicating addresses of memory cells in which data is to be stored, the memory cells being included in the memory device 100. The memory controller 200 may store, in a buffer memory, a logical-physical address mapping table indicating mapping relationship between logical block addresses LBA and physical block addresses PBA.

The memory controller 200 may control the memory device 100 to perform a program operation, a read operation, or an erase operation in response to a request from the host 300. For example, if a program request is received from the host 300, the memory controller 200 may change the program request into a program command, and provide the program command, a PBA, and data to the memory device 100. If a read request along with an LBA is received from the host 300, the memory controller 200 may change a read request into a read command, select a PBA corresponding to the LBA, and provide the read command and the PBA to the memory device 100. If an erase request along with an LBA is received from the host 300, the memory controller 200 may change the erase request into an erase command, select a PBA corresponding to the LBA, and provide the erase command and the PBA to the memory device 100.

In an embodiment, the memory controller 200 may autonomously generate a program command, an address, and data without a request from the host 300, and transmit them to the memory device 100. For example, the memory controller 200 may provide a command, an address, and data to the memory device 100 to perform background operations such as a program operation for wear leveling, and a program operation for garbage collection.

In an embodiment, the storage device 50 may further include a buffer memory (not illustrated). The memory controller 200 may control data exchange between the host 300 and the buffer memory (not illustrated). Alternatively, the memory controller 200 may temporarily store system data for controlling the memory device 100 in the buffer memory. For example, the memory controller 200 may temporarily store data input from the host 300 in the buffer memory, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. Alternatively, the buffer memory may store data to be processed by the memory controller 200.

In an embodiment, the buffer memory may be embodied using an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In various embodiments, the buffer memory may be provided outside the storage device 50. In this case, volatile memory devices provided outside the storage device 50 may function as the buffer memory.

In an embodiment, the memory controller 200 may control at least two or more memory devices. In this case, the memory controller 200 may control the memory devices in an interleaving manner so as to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multi-media card (MMC), embedded MMC (eMMC), dual in-line memory module (DIMM), registered DIMM (RDIMM), and load reduced DIMM (LRDIMM) communication methods.

Figure 2:
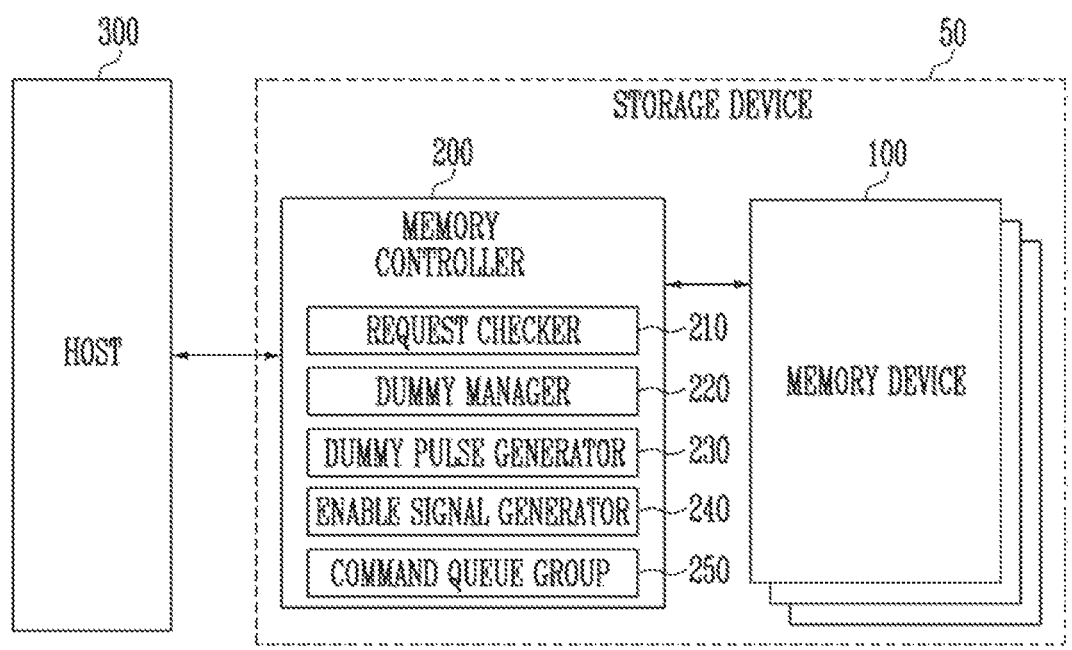
FIG. 2 is a block diagram illustrating the storage device shown in FIG. 1 in accordance with an embodiment of the present disclosure.

FIG. 2 is a block diagram illustrating a storage device according to an embodiment of the present disclosure. For example, the storage device 50 shown in FIG. 2 may be suitable for use as the storage device 50 shown in FIG. 1 and overlapping descriptions may be omitted for the interest of brevity.

The memory controller 200 may include a request checker 210. The request checker 210 may receive a request from the host 300, and may check which memory device among the plurality of memory devices the received request is directed to. The request checker 210 may generate device information by checking a memory device on which an operation corresponding to the request received from the host 300 is to be performed, based on the request. The device information may identify the memory device on which the operation is to be performed.

When operations are simultaneously performed or ended in memory devices, total current consumption of the storage device is rapidly increased or decreased, and hence noise may occur in a voltage source. Therefore, in order to prevent noise from occurring in the voltage source, operations to be performed on the memory devices may be delayed, or a dummy pulse may be applied to the memory devices, before the operations are performed on the memory devices.

Therefore, operations corresponding to requests received from the host 300 may be delayed and performed at a later time. That is, when the requests received from the host 300 allow operations to be simultaneously performed, the operations may be performed in a manner in which a next memory device performs an operation when another of the memory devices completes an operation.

However, when the operations corresponding to the requests received from the host 300 are delayed and performed later, a program time is lengthened, and therefore, program performance may be decreased. That is, latency corresponding to the delayed time may occur.

Accordingly, in an embodiment of the present disclosure, a method for applying a dummy pulse to a plurality of memory devices before operations are performed on the plurality of memory devices is provided.

In accordance with an embodiment of the present disclosure, the memory devices do not delay and perform operations, but simultaneously perform the operations after a dummy pulse is applied to memory devices on which the operations are to be performed, so that fast transmission of data and/or fast transfer of signals is possible.

In an embodiment, before operations are performed on memory devices identified in device information, a dummy pulse may be applied to a channel coupled to each of the corresponding memory devices. A dummy pulse is not simultaneously applied to a plurality of channels, but may be sequentially applied to each channel. That is, after the dummy pulse is applied to one channel of the plurality of channels, the dummy pulse may be applied to another channel whenever a set time elapses.

The memory controller 200 may include a dummy manager 220. The dummy manager 220 may output a request for applying or interrupting a dummy pulse.

Specifically, when it is determined that a plurality of memory devices simultaneously start operations, the dummy manager 220 may output a dummy pulse generation request, based on device information. That is, the dummy manager 220 may output a request for sequentially generating and applying a dummy pulse to channels to which memory devices included in the device information are coupled. For example, the dummy manager 220 may request the dummy pulse to be applied to a second channel after a certain time elapses from when the dummy pulse is applied to a first channel. Moreover, right after operations are performed, the dummy manager 220 may determine interrupting the applying a dummy pulse. Namely, since the memory devices start to operate, the dummy pulse no longer needs to be generated for increasing the total current consumption progressively.

Also, when it is determined that a plurality of memory devices simultaneously suspend or end operations, the dummy manager 220 may output a dummy pulse generation request or dummy pulse interruption request, based on a chip enable signal and a command queue level.

Specifically, at least one memory device of the plurality of memory devices may suspend an operation. Whether the memory device suspends the operation may be determined based on a high-state chip enable signal received from an enable signal generator 240. For example, the enable signal generator 240 may output a low-state chip enable signal to a selected memory device, and output high-state chip enable signal to memory devices in which operations are all ended or which are unselected memory devices.

The dummy manager 220 may receive a command queue level of a memory device corresponding to the high-state chip enable signal. The command queue level may be determined according to a number of commands queued in a command queue. When a command queue level is not 0, the dummy manager 220 may request the dummy pulse to be applied to a channel coupled to a memory device corresponding to the corresponding command queue level.

In order to prevent a plurality of memory devices from simultaneously suspending operations, the dummy manager 220 may apply the dummy pulse to channels coupled to the plurality of memory devices and then sequentially interrupt the applied dummy pulse. For example, when memory devices coupled to first to third channels suspend operations, the dummy manager 220 may request the dummy pulse to be applied to the first to third channels and then request the application of the dummy pulse to be sequentially suspended from the first channel.

The memory controller 200 may include a dummy pulse generator 230. The dummy pulse generator 230 may be a toggle transmitter that generates a dummy toggle and transmits the generated dummy toggle to a memory device. The dummy toggle may represent a set of dummy pulses to be applied to the channels. The toggle transmitter may generate the dummy toggle in one or more channels in addition to a channel for transmitting data. The toggle transmitter may generate the dummy toggle before data is transmitted.

The toggle transmitter may generate the dummy toggle, based on a warm-up enable signal generated on the basis of a request received from the host 300. The warm-up enable signal may identify a number of channels coupled to memory devices on which operations are to be performed in response to the request received from the host 300.

In an embodiment, the toggle transmitter may sequentially increase a current flowing through input/output pins coupled thereto, or sequentially apply the dummy toggle to the input/output pins to increase the number of input/output pins to which the dummy toggle is applied among the input/output pins.

In an embodiment, the dummy pulse generator 230 may generate or interrupt the dummy pulse by receiving the dummy pulse generation request or dummy pulse interruption request from the dummy manager 220.

For example, when the dummy pulse generator 230 receives the dummy pulse generation request, the dummy pulse generator 230 may generate the dummy pulse to be applied to a plurality of channels. Also, when the dummy pulse generator 230 receives the dummy pulse interruption request, the dummy pulse generator 230 may interrupt the dummy pulse applied to the plurality of channels by suspending the generation of the dummy pulse. The plurality of channels to which the dummy pulse is applied or from which the dummy pulse is interrupted may be channels except channels for transmitting data corresponding to requests received from the host.

In an embodiment, when a plurality of memory devices simultaneously start operations, the dummy pulse generator 230 may generate the dummy pulse to be sequentially applied to a plurality of channels. The dummy pulse generator 230 may adjust a degree to which a total current consumption of the plurality of memory devices is increased, by setting a period of the dummy pulse, a level of the dummy pulse, or a time for which the dummy pulse is applied.

In an embodiment, when a plurality of memory devices simultaneously end operations, the dummy pulse generator 230 may generate the dummy pulse to be applied to channels to which the memory devices ending the operations are coupled and then sequentially interrupt the dummy pulse. Similarly, the dummy pulse generator 230 may adjust a degree to which a total current consumption of the plurality of memory devices is decreased, by setting a period of the dummy pulse, a level of the dummy pulse, or a duration of the dummy pulse.

The memory controller 200 may include the enable signal generator 240. The enable signal generator 240 may generate signals for controlling a selected memory device 100 according to an address, and transmit the generated signals through control signal lines coupled to the selected memory device 100. The control signal lines may include a chip enable line CE #, a write enable line WE #, a read enable line RE #, an address latch enable line ALE, a command latch enable line CLE, a write prevention line WP #, and a ready/busy line RB.

For example, the enable signal generator 240 may generate a chip enable signal input through the chip enable line CE #, a write enable signal input through the write enable line WE #, a read enable signal input through the read enable line RE #, an address latch enable signal input through the address latch enable line ALE, a command latch enable signal input through the command latch enable line CLE, and a write prevention signal input through the write prevention line WP #.

In an embodiment, the chip enable signal generated by the enable signal generator 240 may be a signal that enables communication between the memory controller 200 and the memory device 100. For example, when the chip enable signal is in a low state, the communication between the memory controller 200 and the memory device 100 is enabled. When the chip enable signal is in a high state, the communication between the memory controller 200 and the memory device 100 is disabled.

The enable signal generator 240 may generate the chip enable signal to be provided to the memory device 100 and the dummy manager 220. The memory device 100 may communicate with the memory controller 200 by receiving the chip enable signal, and the dummy manager 220 may determine whether the dummy pulse is applied to channels coupled to a plurality of memory devices, by receiving the chip enable signal.

The memory controller 200 may include a command queue group 250. The command queue group 250 may include command queues respectively corresponding to a plurality of memory devices.

For example, the number of command queues in the command queue group 250 may correspond to the number of the memory devices. Therefore, commands executed in each of the plurality of memory devices may be queued in the corresponding command queue. The command queue group 250 may output a number of commands queued in a command queue for a corresponding memory device in response to a request from the dummy manager 220. The number of commands queued in each command queue may be a command queue level. For example, when a number of commands queued in a command queue corresponding to one memory device is "0," the command queue level of the corresponding memory device may be "0." When a number of commands queued in a command queue corresponding to one memory device is "1," the command queue level of the corresponding memory device may be "1."

In an embodiment, a channel to which the dummy pulse is applied may be determined based on the command queue level. That is, although the memory device 100 temporarily ends an operation, when a memory device is to immediately perform another operation, the dummy pulse may be applied to a channel coupled to the corresponding memory device.

The memory controller 200 may include a data transmitter (not shown). The data transmitter may transmit data through channels corresponding to requests received from the host. For example, when a request received from the host is a program request for a first memory device among a plurality of memory devices, the data transmitter may transmit data through a first channel coupled to the first memory device. The channel through which the data is transmitted may be different from the channel through which the dummy pulse is applied or interrupted.

Figure 3:
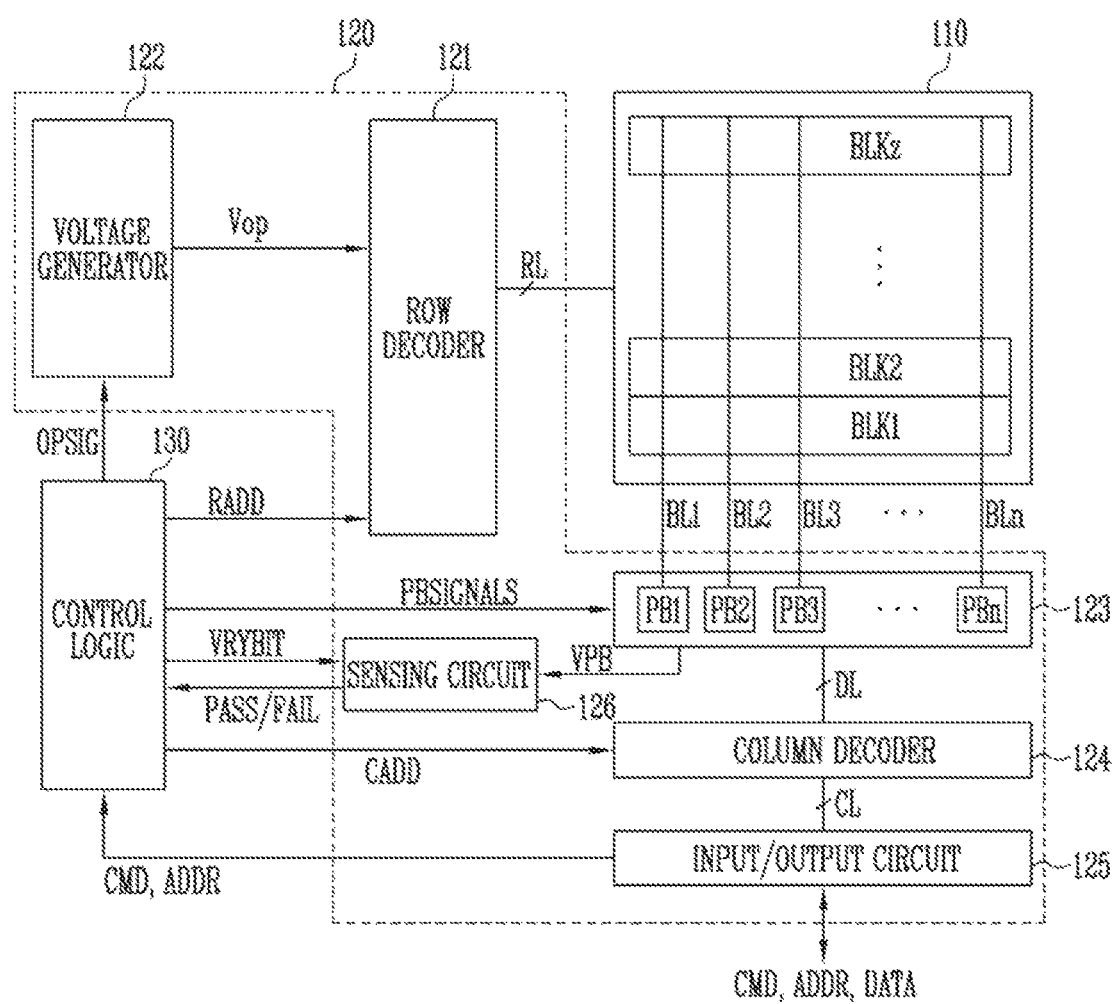
FIG. 3 is a diagram illustrating a structure of a memory device, such as that shown in FIG. 1.

FIG. 3 is a diagram illustrating a structure of the memory device shown in FIG. 1.

Referring to FIG. 3, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn, or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, an erase voltage, and the like under the control of the control logic 130.

In an embodiment, the voltage generator 122 may generate an internal power voltage by regulating the external power voltage. The internal power voltage generated by the voltage generator 122 is used as an operation voltage for the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing voltages or currents received from the selected memory cells through the first to nth bit lines BL1 to BLn.

In a read operation, the first to nth page buffers PB1 to PBn read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example, the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from a memory controller (e.g., the memory controller 200 in FIG. 2), to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation a selected sub-block included in the selected memory block in response to a sub-block erase command and an address. Also, the control logic 130 may determine whether the verify operation has passed or failed in response to the pass or fail signal PASS or FAIL.

Each of the memory cells included in the memory cell array 110 may be programmed to a program state among a plurality of program states according to data stored therein. A target program state of a memory cell may be determined as one of the plurality of program states according to data stored in the memory cell.

Figure 4:
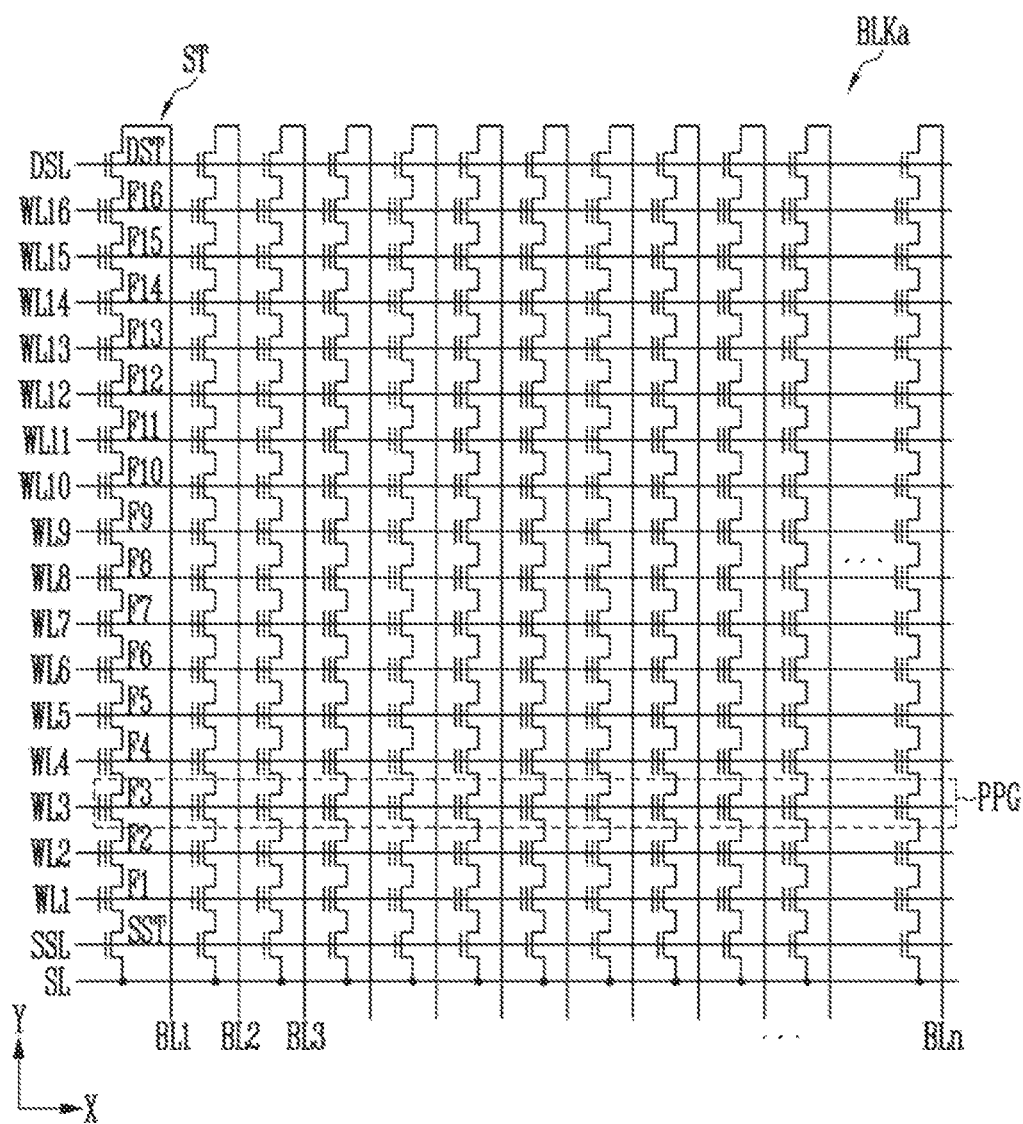
FIG. 4 is a diagram illustrating a memory block.

FIG. 4 is a diagram illustrating a memory block.

Referring to FIGS. 3 and 4, FIG. 4 is a circuit diagram illustrating a memory block BLKa among the plurality of memory blocks BLK1 to BLKz included in the memory cell array 110 shown in FIG. 3.

In the memory block BLKa, a first select line, word lines, and a second select line, which are arranged in parallel, may be coupled to each other. For example, the word lines may be arranged in parallel between the first and second select lines. The first select line may be a source select line SSL, and the second select line may be a drain select line DSL.

More specifically, the memory block BLKa may include a plurality of strings coupled between bit lines BL1 to BLn and a source line SL. The bit lines BL1 to BLn may be respectively coupled to the strings, and the source line SL may be commonly coupled to the strings. The strings may be configured identically to one another, and therefore, a string ST coupled to a first bit line BL1 is described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and more than 16 memory cells (F1 to F16) shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings may be coupled to the source select line SSL, and gates of drain select transistors DST included in different strings may be coupled to the drain select line DSL. Gates of the memory cells F1 to F16 may be respectively coupled to a plurality of word lines WL1 to WL16. A group of memory cells coupled to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include a number of data bits which number correspond to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is generally referred to as the MLC. As memory cells with higher storage capacity have been developed, the term MLC has taken on a more specific meaning, referring to a memory cell for storing data of two bits. In that case, a memory cell for storing data of three or more bits is referred to as a triple level cell (TLC), and a memory cell for storing data of four or more bits is referred to as a quadruple level cell (QLC). Embodiments of the present disclosure may be applied to memory systems with memory cells in which data of two or more bits are stored per cell.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 5:
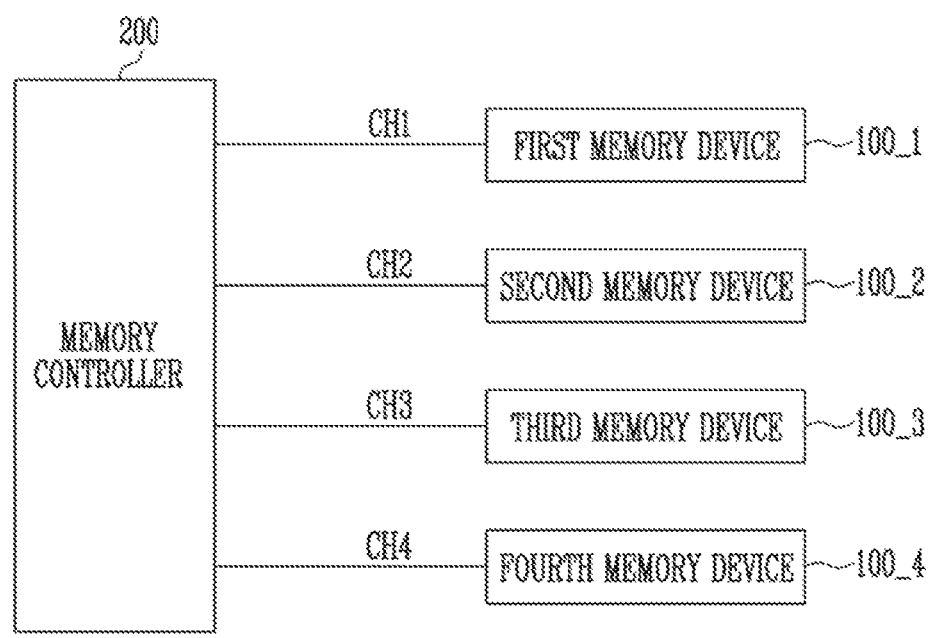
FIG. 5 is a diagram illustrating an embodiment of memory devices coupled to a plurality of channels.

FIG. 5 is a diagram illustrating an embodiment of a plurality of memory devices coupled to a memory controller via a plurality of channels, respectively.

Referring to FIG. 5, FIG. 5 illustrates a plurality of memory devices of the storage device 50 shown in FIG. 2, coupled to the memory controller 200. In FIG. 5, there are four, i.e., first to fourth memory devices 100_1 to 100_4, memory devices, although embodiments of the present disclosure are not limited to that number. In plural memory device embodiments, the storage device 50 may include any suitable number of memory devices.

In the illustrated embodiment, the memory controller 200 may be coupled to the first memory device 100_1 through a first channel CH1, be coupled to the second memory device 100_2 through a second channel CH2, be coupled to the third memory device 100_3 through a third channel CH3, and be coupled to the fourth memory device 100_4 through a fourth channel CH4.

In an embodiment, each of the first to fourth channels CH1 to CH4 may include not only a channel for transmitting data received from the host 300 (shown in FIG. 1) but also a channel for applying or interrupting a dummy toggle.

The memory controller 200 may generate a command corresponding to a request received from the host 300 (shown in FIG. 1), and output the generated command to one of the first to fourth memory devices 100_1 to 100_4. The request received from the host 300 may be a program request, read request or erase request for one of the first to fourth memory devices 100_1 to 100_4.

For example, when the request received from the host 300 is a read request for the first memory device 100_1, the memory controller 200 may generate a command corresponding to the read request, and output the generated command to the first memory device 100_1 through the first channel CH1. The memory controller 200 may also output an address corresponding to the read request, in addition to the command corresponding to the read request, to the first memory device 100_1 through the first channel CH1.

When the request received from the host 300 is a program request for the second memory device 100_2, the memory controller 200 may generate a command corresponding to the program request, and output the generated command to the second memory device 100_2 through the second channel CH2. The memory controller 200 may also output an address and data, which correspond to the program request, to the second memory device 100_2 through the second channel CH2.

As described above, the memory controller 200 may generate a command, an address, and/or data, which correspond to a request received from the host 300. When the corresponding request is for the first memory device 100_1, the memory controller 200 may output the generated command, the generated address, and/or the generated data through the first channel CH1. When the corresponding request is for the second memory device 100_2, the memory controller 200 may output the generated command, the generated address, and/or the generated data through the second channel CH2. When the corresponding request is for the third memory device 100_3, the memory controller 200 may output the generated command, the generated address, and/or the generated data through the third channel CH3. When the corresponding request is for the fourth memory device 100_4, the memory controller 200 may output the generated command, the generated address, and/or the generated data through the fourth channel CH4.

Consequently, the memory controller 200 may communicate with a plurality of memory devices through a plurality of channels.

In an embodiment, when each of the plurality of memory devices performs an operation corresponding to a command received through a channel, current may be consumed. In particular, when the plurality of memory devices simultaneously start or end operations, a total current consumption of the plurality of memory devices may be rapidly increased or decreased. When the total current consumption is rapidly increased or decreased, noise occurs in a voltage source, therefore, the reliability of an operation may be deteriorated.

Accordingly, embodiments of the present disclosure provide a method for sequentially applying a dummy pulse to the channels, when the first to fourth memory devices 100_1 to 100_4 simultaneously start operations. Also, embodiments of the present disclosure provide a method for applying a dummy pulse to the channels and then sequentially interrupting the dummy pulse, when the first to fourth memory devices 100_1 to 100_4 simultaneously end operations.

Figure 6:
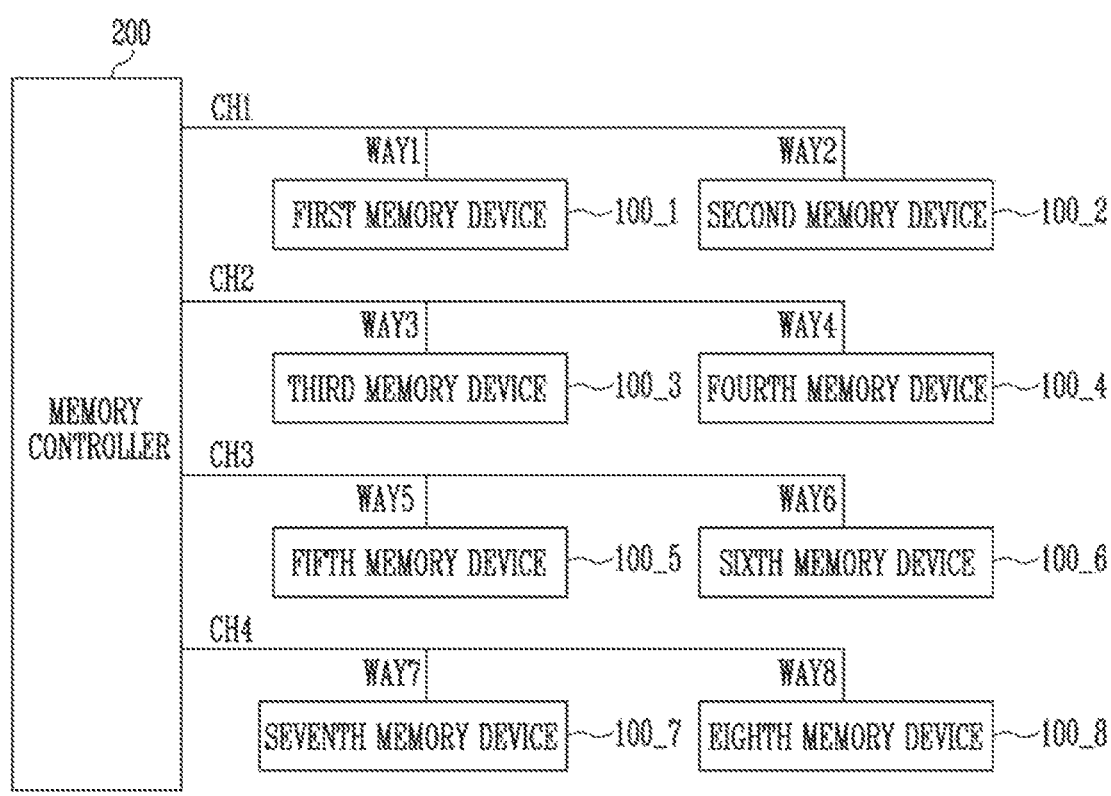
FIG. 6 is a diagram illustrating another embodiment of memory devices coupled to the plurality of channels.

FIG. 6 is a diagram illustrating another embodiment of the memory devices coupled to the plurality of channels.

Like the arrangement shown in FIG. 5, in FIG. 6 multiple memory devices (first to eighth memory devices 100_1 to 100_8 in this case) may be coupled to the memory controller 200 through multiple channels. However, while FIG. 5 illustrates a structure in which one memory device is coupled to one channel, FIG. 6 illustrates a structure in which two memory devices are coupled to one channel. In another embodiment, three or more memory devices may be coupled to one channel.

In an embodiment, the first memory device 100_1 and the second memory device 100_2 are coupled to the first channel CH1 through a first way WAY1 and a second way WAY2, respectively. In addition, the third memory device 100_3 and the fourth memory device 100_4 are coupled to the second channel CH2 through a third way WAY3 and a fourth way WAY4, respectively.

In an embodiment, the fifth memory device 100_5 and the sixth memory device 100_6 are coupled to the third channel CH3 through a fifth way WAY 5 and a sixth way WAY6, respectively. In addition, the seventh memory device 100_7 and the eighth memory device 100_8 are coupled to the fourth channel CH4 through a seventh way WAY 7 and an eighth way WAY8, respectively.

In an embodiment, each of the first to fourth channels CH1 to CH4 may include not only a channel for transmitting data received from the host 300 but also a channel for applying or interrupting a dummy toggle.

In an embodiment, the memory controller 200 may generate a command corresponding to a request received from the host 300, and output the generated command to any one of the first to eighth memory devices 100_1 to 100_8. The request received from the host 300 may be a program request, read request or erase request for any one of the first to eighth memory devices 100_1 to 100_8.

For example, when the request received from the host 300 is a read request for the first memory device 100_1, the memory controller 200 may generate a command corresponding to the read request, and output the generated command to the first memory device 100_1 through the first channel CH1. The memory controller 200 may also output an address corresponding to the read request, in addition to the command corresponding to the read request, to the first memory device 100_1 through the first channel CH1.

When the request received from the host 300 is a program request for the second memory device 100_2, the memory controller 200 may generate a command corresponding to the program request, and output the generated command to the second memory device 100_2 through the first channel CH1. The memory controller 200 may also output an address and data, which correspond to the program request, to the second memory device 100_2 through the first channel CH1.

As described above, when the request received from the host 300 is a request for the first memory device 100_1 or the second memory device 100_2, the memory controller 200 may output a command, an address, and/or data, which correspond to the request from the host 300, to the first memory device 100_1 or the second memory device 100_2 through the first channel CH1. In addition, when the request received from the host 300 is a request for the third memory device 100_3 or the fourth memory device 100_4, the memory controller 200 may output a command, an address, and/or data, which correspond to the request from the host 300, to the third memory device 100_3 or the fourth memory device 100_4 through the second channel CH2.

In an embodiment, when the request received from the host 300 is a request for the fifth memory device 100_5 or the sixth memory device 100_6, the memory controller 200 may output a command, an address, and/or data, which correspond to the request from the host 300, to the fifth memory device 100_5 or the sixth memory device 100_6 through the third channel CH3. In addition, when the request received from the host 300 is a request for the seventh memory device 100_7 or the eighth memory device 100_8, the memory controller 200 may output a command, an address, and/or data, which correspond to the request from the host 300, to the seventh memory device 100_7 or the eighth memory device 100_8 through the fourth channel CH4.

Consequently, as in the arrangement shown in FIG. 5, in the arrangement of FIG. 6, the memory controller 200 may communicate with a plurality of memory devices through a plurality of channels.

In an embodiment, when each of the plurality of memory devices performs an operation corresponding to a command received through a channel, current may be consumed. In particular, when the plurality of memory devices simultaneously start or end operations, a total current consumption of the plurality of memory devices may rapidly increase or decrease. When the total current consumption rapidly increases or decreases, noise occurs in a voltage source, therefore, the reliability of an operation may deteriorate.

According to embodiments of the present disclosure, in order to prevent rapid change of the total current consumption, the memory controller 200 may apply a dummy pulse to the channels before the plurality of memory devices start operations, or apply a dummy pulse to the channels when the memory devices end operations and then sequentially interrupt the dummy pulse, or both.

Figure 7:
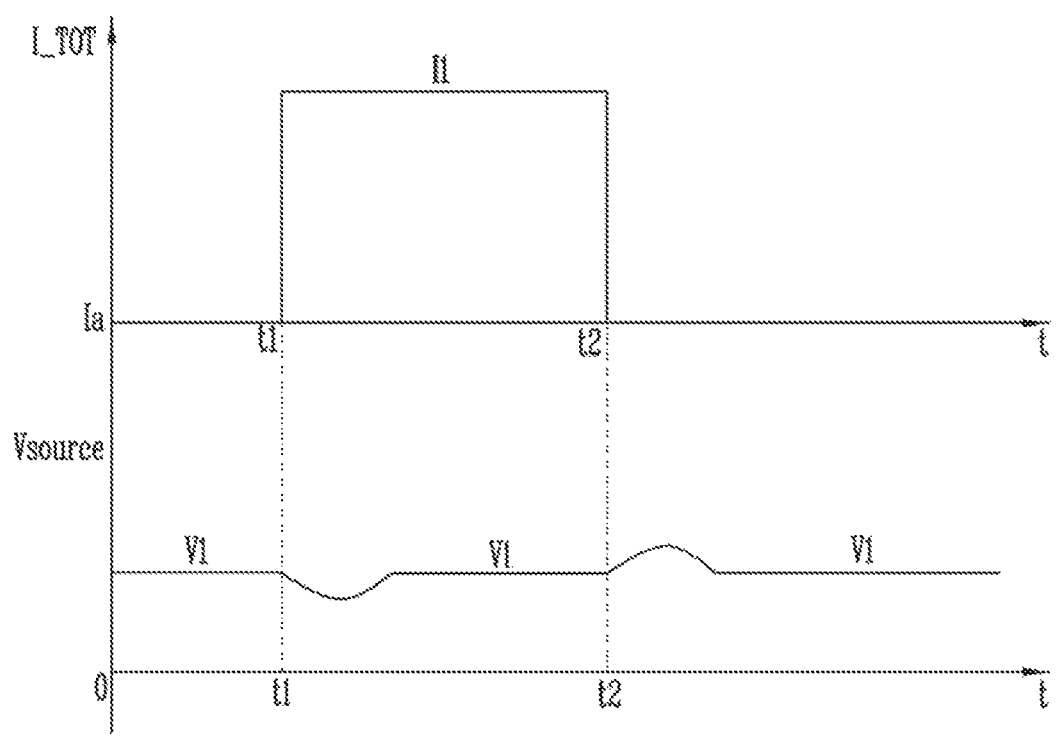
FIG. 7 is a diagram illustrating a change in total current consumption and noise of a voltage source, when memory devices coupled to a plurality of channels simultaneously start or end operations.

FIG. 7 is a diagram illustrating a change in total current consumption and noise of a voltage source, when memory devices coupled to a plurality of channels simultaneously start or end operations.

Referring to FIG. 7, the horizontal axis represents time t, and the vertical axis represents a total current consumption I_TOT of the plurality of memory devices and a voltage source Vsource applied to the plurality of memory devices. The voltage source Vsource applied to the plurality of memory devices is V1 in the present example.

In an embodiment, each of the plurality of memory devices coupled to the memory controller through the plurality of channels may perform an operation corresponding to a command received from the memory controller. The plurality of memory devices may perform operations simultaneously or at different times.

FIG. 7 illustrates a total current consumption I_TOT and a voltage source Vsource when the plurality of memory devices simultaneously perform operations.

Referring to FIG. 7, a voltage applied to the plurality of memory devices may be constantly maintained. However, when the plurality of memory devices simultaneously start or end operations, noise may occur in the voltage source.

For example, at t1, the plurality of memory devices may simultaneously start operations. Therefore, at t1, a total current consumption I_TOT of the plurality of memory devices may rapidly increase from Ia to I1. Noise occurs in the voltage source Vsource, and hence the voltage source may be decreased and then again become V1. The presence of noise in the voltage source Vsource may cause the plurality of memory devices to perform abnormally.

Subsequently, at t2, the plurality of memory devices may simultaneously end operations. Therefore, at t2, a total current consumption I_TOT of the plurality of memory devices may rapidly decrease from I1 to Ia. Noise occurs in the voltage source Vsource, and hence the voltage source Vsource may be increased and again become V1. Furthermore, the presence of noise in the voltage source Vsource may cause the plurality of memory devices to perform abnormally.

Consequently, when the plurality of memory devices simultaneously perform operations, the total current consumption I_TOT may rapidly change, and noise may occur in the voltage source Vsource. The noise in the voltage source Vsource may, in turn, cause the plurality of memory devices to perform abnormally; hence, it is necessary to prevent the total current consumption I_TOT from being rapidly changed.

Therefore, in order to prevent noise from occurring in the voltage source Vsource, operations to be performed on the plurality of memory devices may be delayed and performed later than they otherwise would be performed, or operations may be simultaneously performed after a dummy pulse is applied to memory devices on which the operations are to be performed among the plurality of memory devices.

When operations on which the plurality of memory devices are to be performed are delayed and performed later, the memory devices may be controlled to perform their operations serially. That is, after one memory device completes an operation, another memory device starts an operation, until all of the memory devices have completed their respective operations. However, according to this serial method, overall program time may be lengthened. As a result, program performance may be decreased. That is, latency corresponding to the delayed time may occur.

Accordingly, embodiments of the present disclosure provide a method for applying a dummy pulse to, or interrupting a dummy pulse in, channels coupled to the memory controller and the plurality of memory devices to prevent the total current consumption I_TOT from being rapidly changed.

In accordance with embodiments of the present disclosure, the memory devices do not delay and perform operations, but simultaneously perform the operations after a dummy pulse is applied to those memory devices, so that fast transmission of data or fast transfer of signals is possible.

Figure 8:
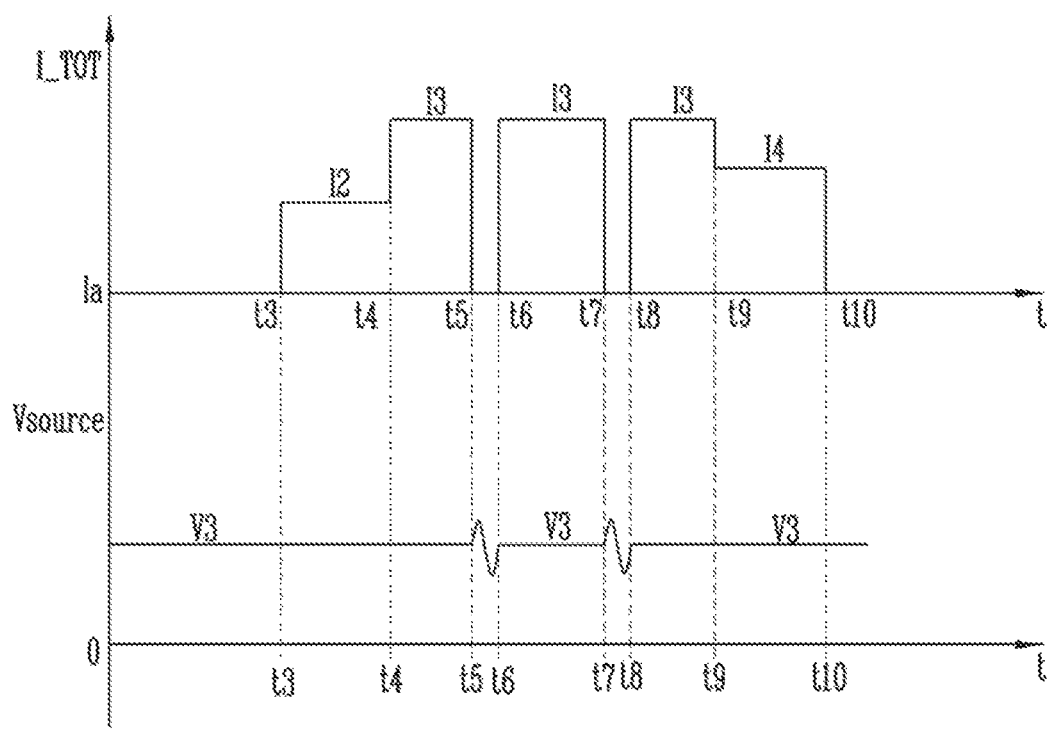
FIG. 8 is a diagram illustrating a change in total current consumption and noise of a voltage source, when a plurality of memory devices simultaneously end operations while performing the operations.

FIG. 8 is a diagram illustrating a change in total current consumption and noise of a voltage source, when a plurality of memory devices simultaneously end operations while performing the operations.

Referring to FIG. 8, the horizontal axis represents time t, and the vertical axis represents a total current consumption I_TOT of the plurality of memory devices and a voltage source Vsource applied to the plurality of memory devices. The voltage source Vsource applied to the plurality of memory devices is V3 in this example.

Referring to FIGS. 7 and 8, while FIG. 7 illustrates a total current consumption I_TOT and a voltage source Vsource when the plurality of memory devices simultaneously start or end operations, FIG. 8 illustrates a total current consumption I_TOT and a voltage source Vsource when the plurality of memory devices simultaneously suspend or end operations then start the operations again. Here, the plurality of memory device initially start the operations at different times.

In FIG. 8, a case where the memory controller is coupled to a first memory device through a first channel and is coupled to a second memory device through a second channel is shown.

In an embodiment, at t3, the first memory device may start an operation. Therefore, the total current consumption I_TOT may increase from Ia to I2. That is, the total current consumption I_TOT when the first memory device performs the operation may be I2. Since the total current consumption I_TOT does not rapidly increase, the voltage source Vsource may be maintained as V3.

Subsequently, at t4, the second memory device may start an operation. Therefore, the total current consumption I_TOT may increase from I2 to I3. When the first memory device starts the operation at t3, the total current consumption I_TOT increases to I2. However, because the additional increase of the total current consumption I_TOT to I3 at t4 when the second memory device starts an operation is not a rapid increase, the voltage source Vsource may be maintained as V3.

At t4 to t5, both the first and second memory devices are performing the operations. Therefore, the total current consumption I_TOT may be I3, and the voltage source Vsource may be V3.

Subsequently, at t5, both the first and second memory devices may end the operations. That is, the first and second memory devices may have an idle period or interval (t5 to t6) in which the first and second memory devices temporarily end (or suspend) the operations. Since the first and second memory devices simultaneously end the operations, the total current consumption I_TOT may rapidly decrease, and then rapidly increase again when the first and second memory devices simultaneously start (or resume) the operations.

Therefore, during the interval t5 to t6, noise may occur in the voltage source Vsource. That is, from t5 to t6, the voltage source Vsource may be increased, when the total current consumption I_TOT rapidly decreases. When the total current consumption I_TOT rapidly increases, the voltage source Vsource may decrease, then become V3 again.

Consequently, from t5 to t6, noise may occur in the voltage source, when the total current consumption I_TOT changes.

In an embodiment, both the first and second memory devices may end the operations and then start the operations again at t6, and continue performing the operations after t6 until t7. That is, the first and second memory devices may have another idle period from t7 to t8. As in the interval t5 to t6, in the interval t7 to t8, noise may occur in the voltage source Vsource, as a result of a rapid decrease followed by a rapid increase in the total current consumption I_TOT.

Subsequently, at t9, the first memory device may end the operation. Therefore, the total current consumption I_TOT may decrease from I3 to I4. That is, the total current consumption I_TOT when the second memory device alone performs the operation may be I4. Since the total current consumption I_TOT does not rapidly decrease, the voltage source Vsource may be maintained as V3.

At t10, the second memory device may also end the operation. Therefore, the total current consumption I_TOT may decrease from I4 to Ia. Similar to t9, since the total current consumption I_TOT does not rapidly decrease, the voltage source Vsource may be maintained as V3.

Consequently, when the total current consumption I_TOT is rapidly decreased or increased, noise may occur in the voltage source Vsource, which, in turn, may result in errors in the operations performed by the memory device(s) during that time. Therefore, it is necessary to ensure that the operations by the plurality of memory devices are performed reliably.

Accordingly, embodiments of the present disclosure provide a method for applying a dummy pulse through channels, or interrupting a dummy pulse so applied, to prevent noise from occurring in the voltage source Vsource. Below, an operation of preventing or minimizing the occurrence of noise in the voltage source Vsource is described.

Figure 9:
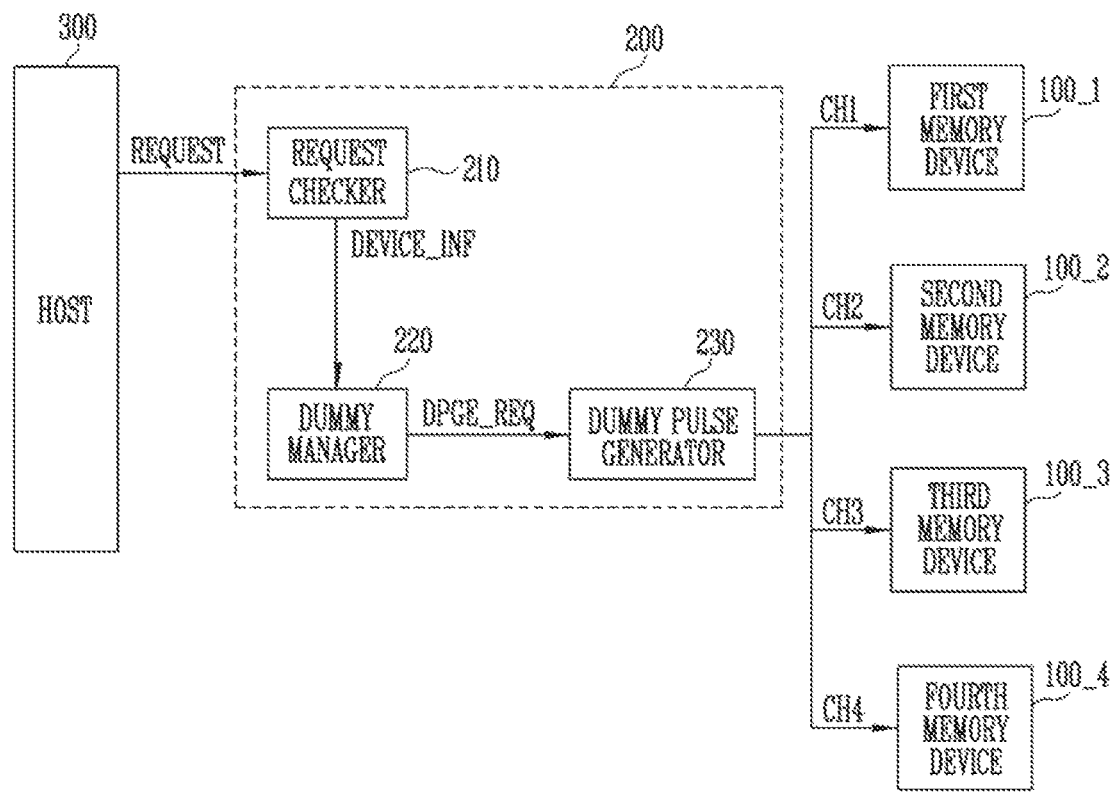
FIG. 9 is a diagram illustrating a structure of a memory controller, such as that shown in FIG. 2, which applies a dummy pulse for each channel.

FIG. 9 is a diagram illustrating a structure of the memory controller 200 shown in FIG. 2, which applies a dummy pulse for each channel, according to an embodiment.

Referring to FIG. 9, the memory controller 200 shown in FIG. 9 may include the request checker 210, the dummy manager 220, and the dummy pulse generator 230. The memory controller 200 may also include the enable signal generator 240 and the command queue group 250 (both shown in FIG. 2), but for clarity, they are omitted in FIG. 9.

In FIG. 9, by way of example, an arrangement in which the memory device 100 in the storage device 50 (shown in FIG. 2) is provided with first to fourth memory devices 100_1 to 100_4 is illustrated. The first to fourth memory devices 100_1 to 100_4 may be coupled to the memory controller 200 respectively through first to fourth channels CH1 to CH4.

Therefore, according to an embodiment of the present disclosure, a dummy pulse may be applied to the first to fourth memory devices 100_1 to 100_4 through the first to fourth channels CH1 to CH4. The dummy pulse may be input to the first to fourth channels CH1 to CH4 through an Input/Output pin (IO pin) of the memory device or through a General-Purpose Input/Output pin (GPIO pin).

In an embodiment, each of the first to fourth channels CH1 to CH4 may include not only a channel for transmitting data received from the host 300 but also a channel for applying or interrupting a dummy toggle.

In another embodiment, the storage device 50 may include a smaller or larger number of memory devices than that shown in FIG. 9.

Although not shown in the drawing, the dummy pulse may be generated through internal elements respectively included in the first to fourth memory devices 100_1 to 100_4, instead of the memory controller 200. That is, a total current consumption of the memory device may be sequentially increased or decreased through such internal elements.

In FIG. 9, an example in which the dummy pulse generator 230 in the memory controller 200 generates the dummy pulse is illustrated.

In an embodiment, the request checker 210 may receive a request (REQUEST) from the host 300. The request received from the host 300 may be a program request, read request or erase request. The request received from the host 300 may be a request for any one of the first to fourth memory devices 100_1 to 100_4.

The request checker 210 may check which memory device among the first to fourth memory devices 100_1 to 100_4 the received request is for. That is, the request checker 210 may identify which memory device(s) among the first to fourth memory devices 100_1 to 100_4, has started an operation based on the request received from the host 300. Subsequently, the request checker 210 may generate device information DEVICE_INF including information identifying the memory device(s) in which an operation is started, and provide the generated device information to the dummy manager 220.

In an embodiment, the request checker 210 may provide the dummy manager 220 with a warm-up enable signal together with or instead of the device information DEVICE_INF. The warm-up enable signal may represent which, and how many, channels are coupled to memory devices in which operations are started among the first to fourth memory devices 100_1 to 100_4. That is, the warm-up enable signal may represent a number of memory devices on which operations are performed, channels coupled to the corresponding memory devices, and numbers of the channels.

In an embodiment, the request checker 210 may identify the memory devices in which operations are started, based on the request received from the host 300, and then output the warm-up enable signal.

Therefore, in order to provide the dummy manager 220 with information on the memory devices in which operations are started, the request checker 210 may output the warm-up enable signal together with or instead of the device information DEVICE_INF.

In an embodiment, the dummy manager 220 may output a dummy pulse generation request DPGE_REG to the dummy pulse generator 230, based on the device information DEVICE_INF and/or the warm-up enable signal, received from the request checker 210. That is, the dummy manager 220 may control a current to be applied to channels coupled to memory devices in which operations are started. The device information DEVICE_INF and the warm-up enable signal may indicate two or more memory devices in which operations are started.

Specifically, when the device information DEVICE_INF and/or the warm-up enable signal represent that only one memory device performs an operation, the dummy manager 220 may not operate to apply current control. However, when the device information DEVICE_INF and/or the warm-up enable signal represent that two or more memory devices perform operations, the dummy manager 220 may control a current to be applied to channels before the memory devices coupled to those channels start the operations.

In an example, information representing that the first and second memory devices 100_1 and 100_2, coupled to channels CH1 and CH2 respectively, are to start operations may be included in the device information DEVICE_INF or the warm-up enable signal and may be output. The dummy manager 220 may output the dummy pulse generation request DPGE_REQ for requesting the dummy pulse to be sequentially applied to the first and second channels CH1 and CH2 based on the device information DEVICE_INF or the warm-up enable signal.

The dummy pulse generator 230 may generate the dummy pulse before the first and second memory devices 100_1 and 100_2 start the operations, based on the dummy pulse generation request DPGE_REQ, and apply the dummy pulse to the first channel CH1 coupled to the first memory device 100_1 or the second channel CH2 coupled to the second memory device 100_2. That is, the dummy pulse generator 230 may first apply the dummy pulse to one of the two channels respectively coupled to two memory devices in which operations are started. Subsequently, after a set time elapses from the first application of the dummy pulse to one channel, the dummy pulse generator 230 may apply the dummy pulse to the other channel associated with the other memory device.

In another example, information representing that the first to fourth memory devices 100_1 to 100_4 are coupled to four channels CH1 to CH4 respectively, are to start operations may be included in the device information DEVICE_INF or the warm-up enable signal and may be output. The dummy manager 220 may output the dummy pulse generation request DPGE_REQ for requesting the dummy pulse to be sequentially applied to the first to fourth channels CH1 to CH4 based on the device information DEVICE_INF or the warm-up enable signal.

The dummy pulse generator 230 may generate the dummy pulse before the first to fourth memory devices 100_1 to 100_4 start the operations, based on the dummy pulse generation request DPGE_REQ, and apply the dummy pulse to the first channel CH1, the second channel CH2, the third channel CH3, or the fourth channel CH4. That is, the dummy pulse generator 230 may apply the dummy pulse to one of four channels coupled to a memory device in which an operation is started. Subsequently, after a set time elapses from a previous application of the dummy pulse, the dummy pulse generator 230 may apply the dummy pulse to a channel coupled to one of the remaining memory devices. Thus, the dummy pulse may be sequentially applied to the channels associated with memory devices in which operations are performed.

Sequentially applying the dummy pulse as described above, prevents instantaneous change in total current consumption of memory devices, and prevents occurrence of noise in the system.

In another embodiment, the memory controller 200 does not receive the request REQUEST from the host 300. Instead, the memory controller 200 may autonomously generate the dummy pulse and apply the dummy pulse to the first to fourth channels CH1 to CH4. That is, before the first to fourth memory devices 100_1 to 100_4 start operations, the memory controller 200 may autonomously generate the dummy pulse and apply the dummy pulse to each channel.

For example, when an operation of any one of the first to fourth memory devices 100_1 to 100_4 is required based on an internal operation of the memory controller 200, such as Garbage Collection (GC), the memory controller 200 may autonomously generate the dummy pulse and apply the dummy pulse to a channel. Therefore, the memory controller 200 may autonomously generate the dummy pulse, even in the absence of the request REQUEST received from the host 300.

Figure 10:
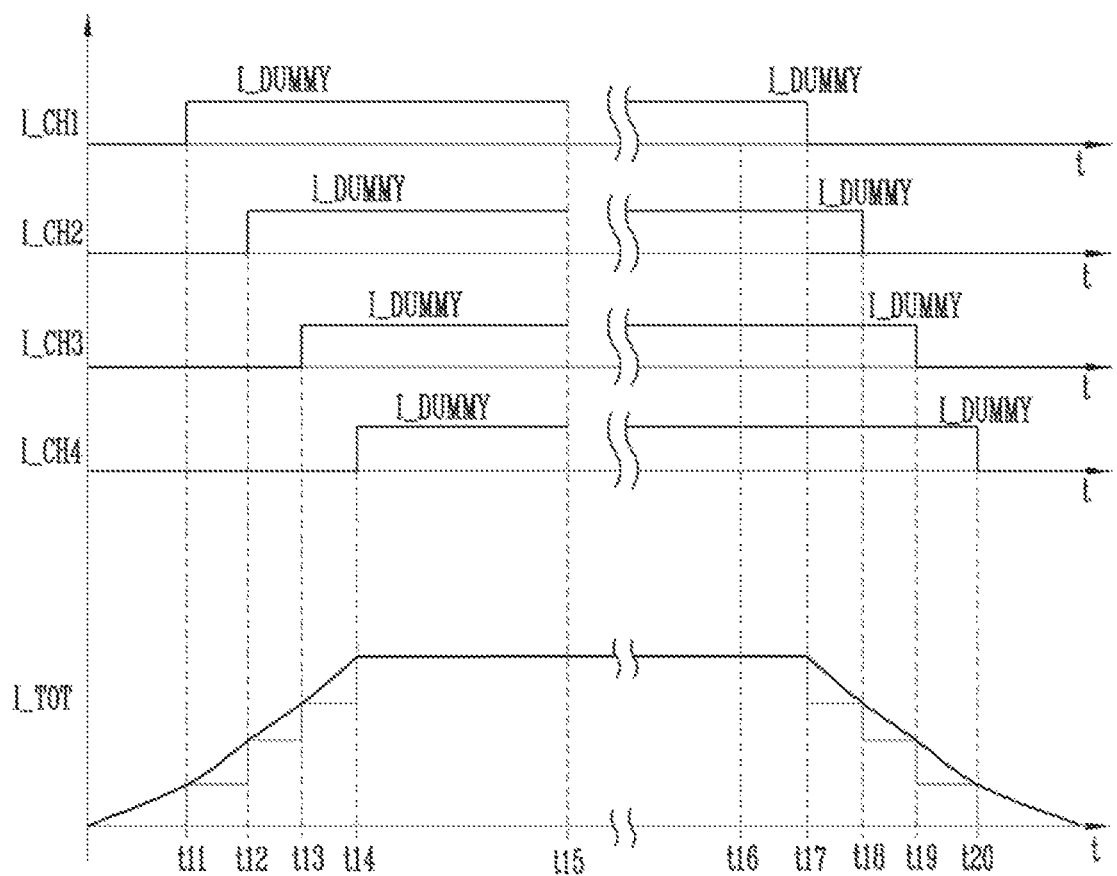
FIG. 10 is a diagram illustrating a method for sequentially increasing and decreasing a total current consumption.

FIG. 10 is a diagram illustrating a method for sequentially increasing and decreasing a total current consumption.

Referring to FIGS. 9 and 10, FIG. 10 illustrates channel currents I_CH1 to I_CH4 and a total current consumption I_TOT according to an operation of the dummy pulse generator 230 shown in FIG. 9 after information representing that the first to fourth memory devices 100_1 to 100_4 are to start operation is included in the device information DEVICE_INF or the warm-up enable signal, and the dummy manager 220 outputs the dummy pulse generation request DPGE_REQ for requesting the dummy pulse to be sequentially applied to the first to fourth channels CH1 to CH4 respectively coupled to the first to fourth memory devices 100_1 to 100_4, based on the device information DEVICE_INF or the warm-up enable signal.

In an embodiment, when it is determined that the first to fourth memory devices are to start the operations, at t11, the dummy pulse may be applied to one channel coupled to one memory device, which channel may be the first, second, third or fourth. Here, by way of example, the dummy pulse is first applied to the first channel.

At t11, when the dummy pulse is applied to the first channel, a first channel current I_CH1 may increase to a dummy current I_DUMMY. Therefore, the total current consumption I_TOT may also increase.

Subsequently, at t12, the dummy pulse may be applied to one of the remaining channels coupled to the second memory device. t12 may occur a set time after t11. Here, by way of example, that channel is the second channel.

At t12, when the dummy pulse is applied to the second channel, a second channel current I_CH2 may increase to the dummy current I_DUMMY. Therefore, the total current consumption I_TOT may also increase.

Subsequently, the dummy pulse may be sequentially applied to the other remaining channels. For example, at t13, the dummy pulse may be applied to the third channel, so that a third channel current I_CH3 becomes the dummy current I_DUMMY. At t14, which may occur a set amount of time after t13, the dummy pulse may be applied to the fourth channel, so that a fourth channel current I_CH4 becomes the dummy current I_DUMMY.

That is, the dummy manager 220 shown in FIG. 9 may sequentially increase the total current consumption I_TOT by determining a set time and a channel to which the dummy pulse is to be applied. In addition, the total current consumption I_TOT may be sequentially increased by adjusting a level of the dummy pulse or a duration of the dummy pulse.

A method for sequentially increasing the total current consumption I_TOT by adjusting the level of the dummy pulse according to another embodiment will be described below with reference to FIG. 11.

Therefore, the total current consumption I_TOT may be sequentially increased from t11 to t14. When the sequentially increased current reaches a certain level, memory devices determined to perform operations may perform the respective operations. That is, after t15, the memory devices may perform the respective operations. Here, right after the respective operations are performed, the dummy manager 220 may determine interrupting the applying a dummy pulse. Namely, since the memory devices start to operate, the dummy pulse no longer needs to be generated for increasing the total current consumption progressively.

Consequently, when the total current consumption I_TOT is sequentially increased, noise may not occur in the voltage source Vsource. Thus, the dummy pulse generator 230 sequentially applies the dummy pulse to channels, so that the reliability of operations performed by memory devices can be ensured.

It may be determined that the first to fourth memory devices all end the operations after the first to fourth memory devices perform the operations.

When the first to fourth memory devices simultaneously end the operations, the total current consumption I_TOT of the memory devices may be rapidly decreased. Therefore, the dummy pulse may be applied to the first to fourth channels respectively coupled to the first to fourth memory devices. Subsequently, the dummy pulses applied to the respective channels may be sequentially interrupted. That is, after applying the dummy pulse is interrupted, the dummy pulses are applied to respective channels coupled to the first to fourth memory devices.

For example, at t16, when it is determined that the first to fourth memory devices do not perform the operations, the dummy pulse may be applied to the first to fourth channels. That is, at t16, the first to fourth channel currents I_CH1 to I_CH4 may become the dummy current I_DUMMY.

Subsequently, at t17, which may occur a set amount of time after t16, the dummy pulse generator 230 may interrupt the dummy pulse applied to one of the channels, which may be the first, second, third or fourth channel. Here, by way of example, the dummy pulse in the first channel is interrupted at t17.

At t17, when the application of the dummy pulse to the first channel is ended, the first channel current I_CH1 may be decreased. Therefore, the total current consumption I_TOT may also be decreased.

Subsequently, at t18, the dummy pulse applied to the second channel coupled to the second memory device may be interrupted. t18 may occur a set amount of time after t17. More generally, at t18, the channel in which the dummy pulse is interrupted may be any of the channels in which the dummy pulse has not yet been interrupted.

At t18, when the dummy pulse is interrupted from the second channel, the second channel current I_CH2 may be decreased. Therefore, the total current consumption I_TOT may also be decreased.

Subsequently, the dummy pulse may be sequentially interrupted in the other channels. For example, at t19, which may occur a set amount of time after t18, the dummy pulse applied to the third channel may be interrupted. At t20, which may occur a set amount of time after t19, the dummy pulse applied to the fourth channel may be interrupted.

Therefore, the total current consumption I_TOT may be sequentially decreased from t17 to t20. Consequently, when the total current consumption I_TOT is sequentially decreased, noise may not occur in the voltage source Vsource. Thus, the dummy pulses applied to the channels are sequentially interrupted, so that the reliability of the operations performed by the memory devices can be ensured.

Figure 11:
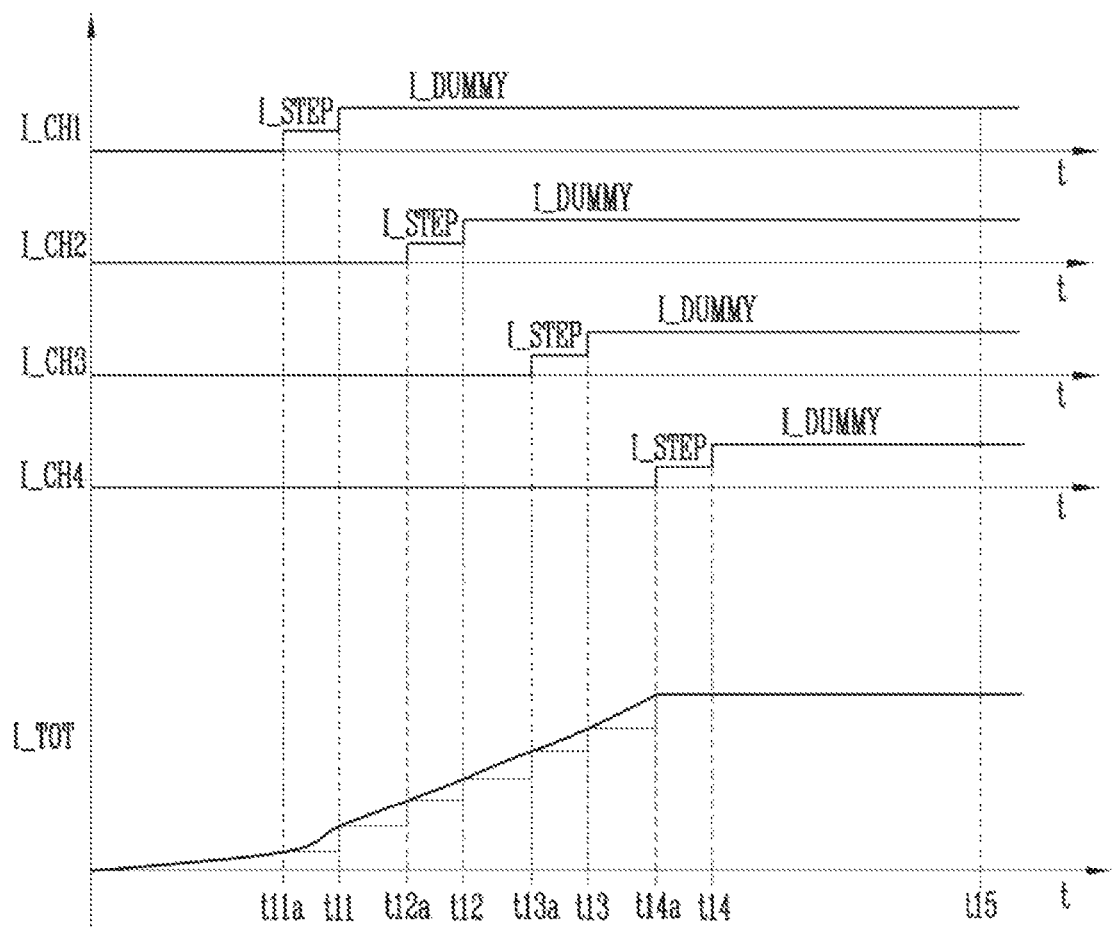
FIG. 11 is a diagram illustrating another embodiment of sequentially increasing and decreasing a total current consumption.

FIG. 11 is a diagram illustrating another embodiment of sequentially increasing and decreasing a total current consumption.

Referring to FIGS. 9, 10, and 11, FIG. 11 illustrates an embodiment in which more subdivided dummy pulses are applied from t11 to t14 shown in FIG. 10. FIG. 11 illustrates channel currents I_CH1 to I_CH4 and a total current consumption I_TOT according to an operation of the dummy pulse generator 230 after information representing that the first to fourth memory devices 100_1 to 100_4 shown in FIG. 9 are to start operation is included in the device information, and the dummy manager 220 outputs the dummy pulse generation request for requesting the dummy pulse to be sequentially applied to the first to fourth channels CH1 to CH4 respectively coupled to the first to fourth memory devices 100_1 to 100_4, based on the device information.

In describing FIG. 11, content already described in connection with FIG. 10 is omitted.

In an embodiment, the dummy manager 220 may determine that the dummy pulse is to be applied first to the first channel coupled to the first memory device among the first to fourth memory devices. The dummy pulse generator 230 may generate the dummy pulse step by step. The dummy pulse generator 230 may generate the dummy pulse by adjusting a level of the dummy pulse. Therefore, the dummy pulse generator 230 may generate the dummy pulse such that the total current consumption I_TOT is increased step by step.

For example, at t11a, the dummy pulse generator 230 may generate a dummy pulse and apply the dummy pulse to the first channel, and the first channel current I_CH1 may become a step current I_STEP. Subsequently, at t11, the dummy pulse generator 230 may generate a dummy pulse having a level higher than that of the previous dummy pulse and apply the dummy pulse to the first channel, and the first channel current I_CH1 may become the dummy current I_DUMMY.

Like the arrangement in FIG. 10, in the arrangement of FIG. 11, the dummy pulse generator 230 applies the dummy pulse through the first channel, and the first channel current I_CH1 becomes the dummy current I_DUMMY. However, in the arrangement of FIG. 11, the dummy pulse generator 230 applies pulses having different levels to the first channel, so that a change in the total current consumption I_TOT can be minimized.

The dummy pulse may also be applied step by step to the second to fourth channels.

For example, after a reference time elapses, at t12a, the second channel current I_CH2 may become the step current I_STEP by applying a dummy pulse to the second channel. At t12, the second channel current I_CH2 may become the dummy current I_DUMMY by applying, to the second channel, a dummy pulse having a level higher than that of the previous dummy pulse.

In addition, after the reference time elapses, at t13a, the third channel current I_CH3 may become the step current I_STEP by applying a dummy pulse to the third channel. At t13, the third channel current I_CH3 may become the dummy current I_DUMMY by applying, to the third channel, a dummy pulse having a level higher than that of the previous dummy pulse.

Finally, at t14a, the fourth channel current I_CH4 may become the step current I_STEP by applying a dummy pulse to the fourth channel. At t14, the fourth channel current I_CH4 may become the dummy current I_DUMMY by applying, to the fourth channel, a dummy pulse having a level higher than that of the previous dummy pulse.

Consequently, the dummy pulse applied to the first to fourth channels is subdivided, so that the total current consumption can be more gradually increased. Thus, it is less likely that noise will occur in the voltage source, so that the reliability of an operation performed by the memory device can be increased.

The above-described method may be also be applied when the dummy pulses applied to the respective channels are sequentially interrupted. That is, the dummy pulse interrupted for each channel is subdivided, so that the total current consumption can be more gradually decreased. Thus, it is less likely that noise will occur in the voltage source, so that the reliability of an operation performed by the memory device can be ensured.

Figure 12:
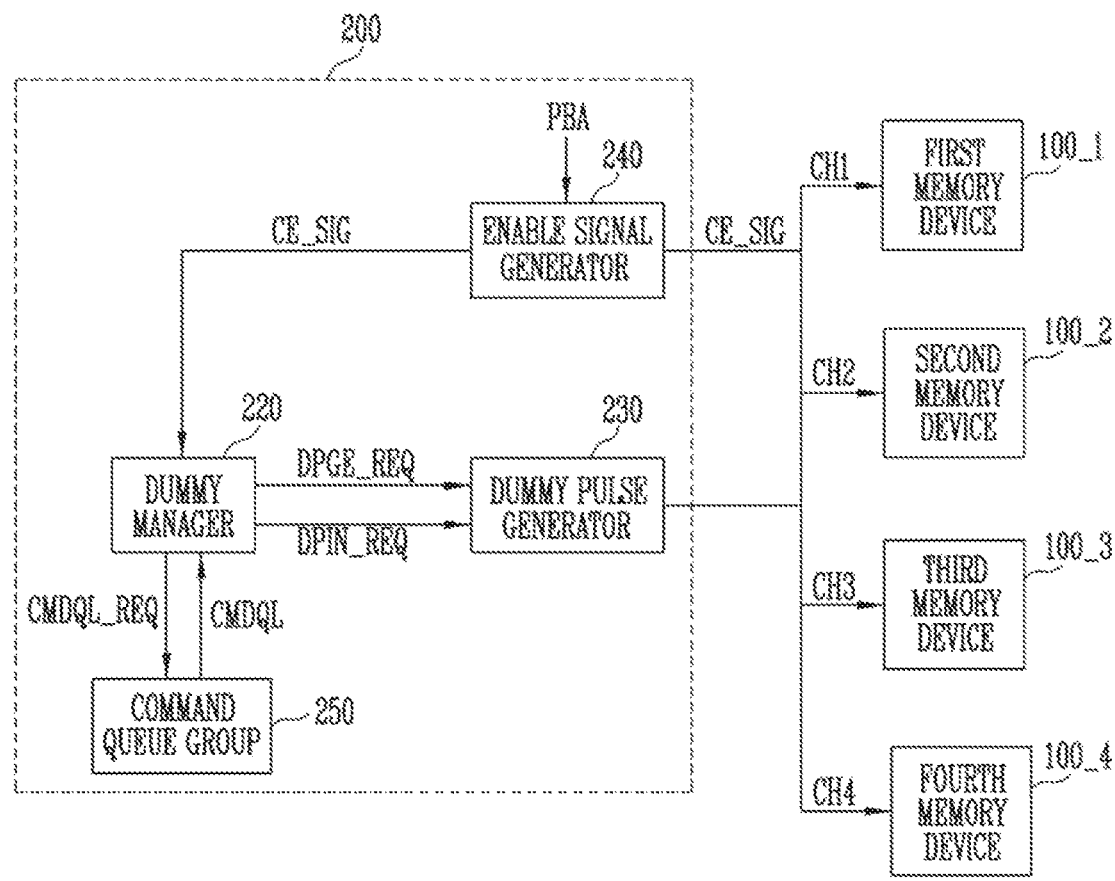
FIG. 12 is a diagram illustrating a structure of the memory controller shown in FIG. 2, which sequentially decreases a total current consumption.

FIG. 12 is a diagram illustrating a structure of the memory controller 200 shown in FIG. 2, which sequentially decreases a total current consumption, according to an embodiment.

Referring to FIG. 12, the memory controller 200 may include the dummy manager 220, the dummy pulse generator 230, the enable signal generator 240, and the command queue group 250. The memory controller 200 may also include the request checker 210 shown in FIG. 1 but such component is omitted here for clarity.

FIG. 12 illustrates a method for interrupting a dummy pulse when it is determined that at least one memory device among the first to fourth memory devices 100_1 to 100_4 has ended or suspended performance of an operation.

In an embodiment, each of first to fourth channels CH1 to CH4 may include not only a channel for transmitting data received from the host 300 but also a channel for applying or interrupting a dummy toggle.

In an embodiment, the enable signal generator 240 may generate a chip enable signal CE_SIG corresponding to a physical block address PBA, and output the generated chip enable signal CE_SIG to a selected memory device and the dummy manager 220. The chip enable signal CE_SIG may be for selecting a memory device on which an operation is performed or releasing the selection. The chip enable signal CE_SIG may be in a high state or low state. When the chip enable signal CE_SIG is in the high state, the selection of the memory device may be released. When the chip enable signal CE_SIG in the low state, the memory device may be selected. In other words, a high-state chip enable signal CE_SIG may be input to the memory device in a standby state, and a low-state chip enable signal CE_SIG may be input to the memory device that is operating.

For example, when the first memory device 100_1 is to end an operation, the enable signal generator 240 may generate a chip enable signal CE_SIG in the high state, which releases the selection of the first memory device 100_1. The enable signal generator 240 may provide the generated chip enable signal CE_SIG to the dummy manager 220.

The dummy manager 220 may determine whether a chip enable signal CE_SIG in the high state, which corresponds to at least two memory devices, has been received in response to the chip enable signal CE_SIG received from the enable signal generator 240.

When the dummy manager 220 receives a chip enable signal CE_SIG in the high state, which corresponds to two or more memory devices, the dummy manager 220 may output, to the command queue group 250, a command queue level request CMDQL_REQ for checking a command queue level CMDQL of a corresponding memory device. The command queue level CMDQL may be indicative of a number of commands queued in a command queue. That is, when the number of the queued command is "0," the command queue level CMDQL may be "0." When the number of the queued command is "5," the command queue level CMDQL may be "5."

The command queue group 250 may output a command queue level CMDQL corresponding to the corresponding memory device, to the dummy manager 220 in response to the command queue level request CMDQL_REQ received from the dummy manager 220.

In an embodiment, the dummy manager 220 may determine a channel to which the dummy pulse is to be applied, based on the chip enable signal CE_SIG in the high state and the command queue level CMDQL.

For example, when command queue levels CMDQL of all the memory devices are "0," the dummy manager 220 may determine to apply the dummy pulse to all the memory devices and then sequentially interrupt the dummy pulse. In an embodiment, the dummy manager 220 may output a dummy pulse input request DPIN_REQ to the dummy pulse generator 230. In response to the input request DPIN_REQ, the dummy pulse generator 230 may sequentially interrupt applying the dummy pulse.

However, when command queue levels CMDQL of some but not all memory devices are "0," the dummy manager 220 may apply the dummy pulse to only channels coupled to the memory devices of which command queue levels CMDQL are not "0." That is, the dummy pulse is applied to memory devices predicted to again perform operations within a short time, so that a total current consumption is prevented from being rapidly increased or decreased. The number of memory devices of which command queue levels CMDQL are not "0" may be 1.

After the dummy pulse is applied to only remaining memory devices of which command queue levels CMDQL are not "0," the dummy manager 220 may again receive the chip enable signal CE_SIG in the high state from the enable signal generator 240. When the dummy manager 220 receives a chip enable signal CE_SIG in the high state, which corresponds to at least two memory devices, the dummy manager 220 may receive command queue levels CMDQL corresponding to memory devices of the high-state chip enable signal CE_SIG and then determine whether the dummy pulse is to be applied or interrupted.

FIG. 13 is a diagram illustrating application or interruption of a dummy pulse, which is determined based on a command queue, according to an embodiment.

Referring to FIGS. 12 and 13, first to fourth command queues CMD_QUEUE1 to CMD_QUEUE4 shown in FIG. 13 respectively correspond to the first to fourth memory devices (e.g., the first to fourth memory devices 100_1 to 100_4 shown in FIG. 12), and each column shown in FIG. 13 represents a sequence of commands to be executed by a corresponding memory device.

In an embodiment, first to fifth commands CMD1 to CMD5 may be queued in the first command queue CMD_QUEUE1 corresponding to the first memory device, sixth and seventh commands CMD6 and CMD7 may be queued in the second command queue CMD_QUEUE2 corresponding to the second memory device, eighth to eleventh commands CMD8 to CMD11 may be queued in the third command queue CMD_QUEUE3 corresponding to the third memory device, and twelfth to fourteenth commands CMD12 to CMD14 may be queued in the fourth command queue CMD_QUEUE4 corresponding to the fourth memory device.

FIG. 13 shows specific numbers and sequences of commands queued in the respective queues. The numbers and sequences, however, may vary.

In an embodiment, the first to fourth memory devices may simultaneously perform operations. That is, the first memory device, the second memory device, the third memory device, and the fourth memory device may simultaneously perform operations respectively corresponding to the first command CMD1, the sixth command CMD6, the eighth command CMD8, and the twelfth command CMD12.

Referring to FIG. 10, before the first to fourth memory devices perform operations corresponding to the respective commands, a dummy pulse may be sequentially applied to the first to fourth channels respectively coupled to the first to fourth memory devices. When the dummy pulse is sequentially applied to the first to fourth channels, a total current consumption of the memory devices may be sequentially increased. Therefore, when the total current consumption is sequentially increased, voltage noise may not occur.

When the first to fourth channel currents become the dummy current as the dummy pulse is applied to the first to fourth channels, the first to fourth memory devices may perform the operations corresponding to the respective commands.

In an embodiment, the first to fourth memory devices may execute next commands. That is, the first memory device may perform an operation corresponding to the second command CMD2, the second memory device may perform an operation corresponding to the seventh command CMD7, the third memory device may perform an operation corresponding to the ninth command CMD9, and the fourth memory device may perform an operation corresponding to the thirteenth command CMD13.

Since no memory device among the first to fourth memory devices has ended or suspended operation, the enable signal generator 240 may generate a chip enable signal in a low state, which corresponds to the first to fourth memory devices. Therefore, it is unnecessary for the dummy manager 220 to perform an operation for sequentially decreasing the total current consumption of the memory devices.

However, when it is determined that, for example, the second and third memory devices end their operations after the first to fourth memory devices perform the respective operations, the enable signal generator 240 may generate a chip enable signal in a high state, which corresponds to the second and third memory devices. After the second memory device performs the operation corresponding to the seventh command CMD7, the second memory device may end the operation. After the third memory device performs the operation corresponding to the ninth command CMD9, the third memory device may end the operation.

Since no current is consumed in the two memory devices, the total current consumption may be rapidly decreased. Therefore, the dummy manager 220 may receive the chip enable signal in the high state, which corresponds to the second and third memory devices, and then output, to the command queue group 250, a command queue level request for checking command queue levels of the second and third memory devices.

In an embodiment, the command queue group 250 may output a command queue level in response to the command queue level request from the dummy manager 220. Since the second memory device performed the operations corresponding to the sixth and seventh commands CMD6 and CMD7, a number of commands queued in a command queue corresponding to the second memory device may be "0." In addition, since the third memory device performed the operations corresponding to the eighth and ninth commands CMD8 and CMD9, commands queued in a command queue corresponding to the third memory device may be the tenth and eleventh commands CMD10 and CMD11, and a number of the commands may be "2."

Consequently, in response to the command queue level request from the dummy manager 220, the command queue group 250 may output, to the dummy manager 220, the command queue level "0" corresponding to the second memory device and the command queue level "2" corresponding to the third memory device.

Since the command queue level corresponding to the third memory device is not "0," the dummy manager 220 may determine that the dummy pulse is applied to only the third memory device of which the command queue level is not "0." The dummy manager 220 may output, to the dummy pulse generator 230, a dummy pulse generation request for requesting application of the dummy pulse to the third memory device, and the dummy pulse generator 230 may apply the dummy pulse to the third channel coupled to the third memory device.

In an embodiment, although not shown in the drawing, when both the command queue levels corresponding to the second and third memory devices are "0," the dummy pulse may be applied to the channels respectively coupled to the second and third memory devices. When a set time elapses after the dummy pulse is applied to the second and third channels, the dummy pulses applied to the second and third channels may be sequentially interrupted.

Subsequently, it may be determined that the first and fourth memory devices end operations. That is, a chip enable signal in the high state corresponding to the first and fourth memory devices may be generated. After the first memory device performs an operation corresponding to the third command CMD3, the first memory device may end the operation. After the fourth memory device performs an operation corresponding to the fourteenth command CMD14, and the fourth memory device may end the operation.

Since no current is consumed in the two memory devices, the total current consumption may be rapidly decreased. Therefore, the dummy manager 220 may receive the chip enable signal in the high state, which corresponds to the first and fourth memory devices, and then output, to the command queue group 250, a command queue level request for checking command queue levels of the first and fourth memory devices.

In an embodiment, the command queue group 250 may output a command queue level in response to the command queue level request from the dummy manager 220. Since the first memory device performed the operations corresponding to the first, second, and third commands CMD1, CMD2, and CMD3, commands queued in a command queue corresponding to the first memory device may be the fourth and fifth commands CMD4 and CMD5, and a number of the commands may be "2." In addition, since the fourth memory device performed the operations corresponding to the twelfth to fourteenth commands CMD12 to CMD14, a number of commands queued in a command queue corresponding to the fourth memory device may be "0."

Consequently, in response to the command queue level request from the dummy manager, the command queue group 250 may output, to the dummy manager 220, the command queue level "2" corresponding to the first memory device and the command queue level "0" corresponding to the fourth memory device.

Since the command queue level corresponding to the first memory device is not "0," the dummy manager 220 may determine that the dummy pulse is applied to only the first memory device of which the command queue level is not "0." The dummy manager 220 may output, to the dummy pulse generator 230, a dummy pulse generation request for requesting application of the dummy pulse to the first memory device, and the dummy pulse generator 230 may apply the dummy pulse to the first channel coupled to the first memory device.

Subsequently, the first memory device may perform an operation corresponding to the fourth command CMD4, and the third memory device may perform an operation corresponding to the eleventh command CMD11.

In an embodiment, it may be determined that, after the third memory device performs the operation corresponding to the eleventh command CMD11, the third memory device ends the operation. That is, a chip enable signal in the high state corresponding to the third memory device may be generated. The third memory device may end the operation after the third memory device performs the operation corresponding to the eleventh command CMD11. However, since only the third memory device among the plurality of memory devices ends the operation, it is unnecessary for the dummy manager 220 to perform an operation for applying or interrupting the dummy pulse.

Consequently, when the memory devices start operations, the total current consumption of the memory devices may be sequentially increased. Then, when the memory devices end operations, the total current consumption of the memory devices may be sequentially decreased. Thus, through the above-described process, a case in which the total current consumption is rapidly increased or decreased is prevented, so that occurrence of power noise can be prevented.

Figure 14:
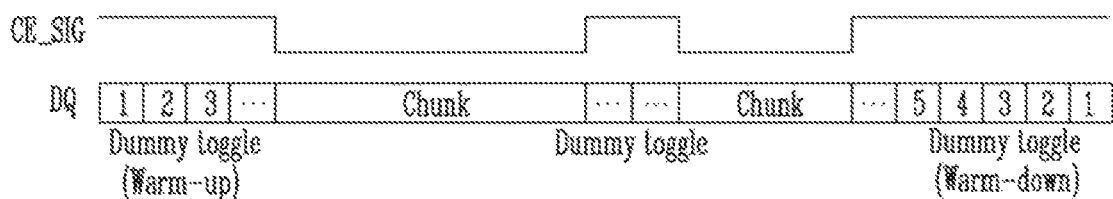
FIG. 14 is a diagram illustrating a dummy pulse output based on a chip enable signal.

FIG. 14 is a diagram illustrating a dummy pulse output based on a chip enable signal according to an embodiment.

Referring to FIG. 14, FIG. 14 illustrates a dummy toggle (Dummy toggle) and data (Chunk), input through an input/output pin DQ, based on a chip enable signal CE_SIG.

In an embodiment, when the memory device 100 does not operate, a chip enable signal CE_SIG corresponding to the corresponding memory device may be output in a high state. However, when the memory device 100 is operating (e.g., when data is transmitted or received through the input/output pin DQ), a chip enable signal CE_SIG corresponding to the corresponding memory device may be output in a low state.

In an embodiment, when data is transmitted or received through the input/output pin DQ, the total current consumption of the memory device 100 may be instantaneously increased or decreased. Therefore, in order to prevent the total current consumption of the memory device 100 from being instantaneously increased, a dummy toggle may be applied to the memory device 100 through the input/output pin DQ. Here, the dummy toggle is a pulse of a certain magnitude that is applied to the memory device 100.

That is, when the chip enable signal CE_SIG is in the high state, the dummy toggle may be applied through the input/output pin DQ of the memory device 100, and the total current consumption of the memory device 100 may be increased step by step (Warm-up). The magnitude of the dummy toggle may be sequentially increased (1, 2, 3, . . . ).

Consequently, before the memory device starts an operation, the dummy toggle of which magnitude is sequentially increased, is applied to the memory device 100, so that an instantaneous increase in total current consumption can be prevented.

When the total current consumption of the memory device 100 is instantaneously increased through the dummy toggle and then reaches a certain level, the memory device 100 may transmit or receive data.

Although the transmission or reception of the data is ended, i.e., when it is predicted that the memory device 100 will transmit or receive the data Chunk, a dummy toggle may be applied to the memory device 100. That is, since the memory device 100 immediately starts an operation, the dummy toggle for maintaining the total current consumption to a certain level may be applied to the memory device 100. Subsequently, the memory device 100 may again transmit or receive data.

In an embodiment, even when the memory device 100 ends the operation, a dummy toggle may be applied to the memory device 100 to prevent the total current consumption from being instantaneously decreased.

For example, when the chip enable signal CE_SIG is output in the high state since it is determined that the memory device 100 ends the operation, dummy toggle may be applied to the memory device 100 and then sequentially interrupted (Warm-down). That is, after the dummy toggle is applied to the memory device 100 determined to end the operation, the magnitude of the dummy toggle may be sequentially decreased.

Consequently, before the memory device ends the operation, the dummy toggle of which the magnitude is sequentially decreased is applied to the memory device 100, so that an instantaneous decrease in total current consumption can be prevented.

Figure 15:
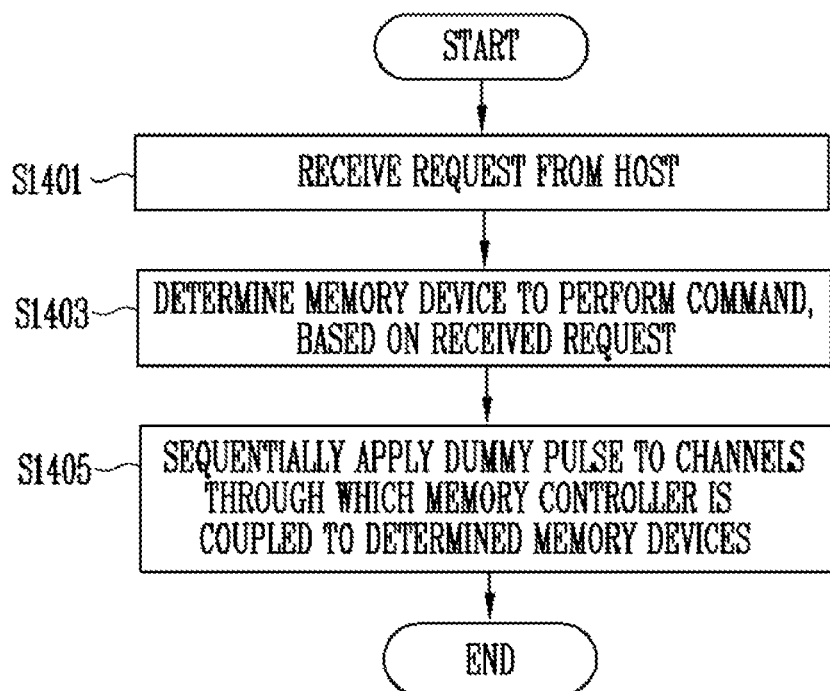
FIG. 15 is a diagram illustrating an operation of the memory controller in accordance with an embodiment of the present disclosure.

FIG. 15 is a diagram illustrating an operation of a memory controller in accordance with an embodiment of the present disclosure.

FIG. 15 illustrates a sequence in which, when memory devices start operations, a dummy pulse is applied to channels connecting the memory controller to the memory devices.

In step S1401, the memory controller may receive a request from the host. The request received from the host may be a program request, read request or erase request for any one memory device among a plurality of memory devices included in the storage device. That is, the memory controller may determine which memory device among the plurality of memory devices an operation is to be performed on, based on the request received from the host.

In step S1403, the memory controller may determine memory devices in which a command is executed, based on the request received from the host. A number of memory devices in which the command is executed may be two or more.

In an embodiment, when multiple memory devices simultaneously perform an operation corresponding to the command, a total current consumption of the memory devices may be rapidly increased. Thus, a dummy pulse may be sequentially applied to the memory devices, so that the total current consumption can be gradually increased.

That is, when the memory devices to perform the operation are determined in response to the request received from host, the dummy pulse may be sequentially applied to channels through which the memory controller is coupled to such memory devices (S1405).

For example, when memory devices to execute a command corresponding to the request received from the host are determined as first and second memory devices, a dummy pulse may be sequentially applied to first and second channels through which the memory controller is coupled to the first and second memory devices. That is, the dummy pulse is first applied to the first or second channel, and then after a set time elapses from that application of the dummy pulse, the dummy pulse may be applied to the other channel. Thus, the total current consumption of the memory devices can be prevented from being instantaneously increased. Moreover, right after the operations are performed, the memory controller may determine interrupting the applying a dummy pulse. Namely, since the memory devices start to operate, the dummy pulse no longer needs to be generated for increasing the total current consumption progressively.

Figure 16:
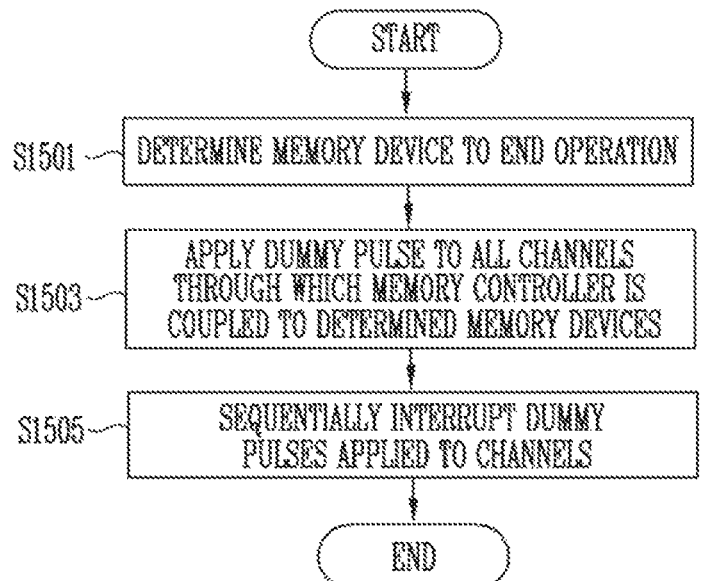
FIG. 16 is a diagram illustrating an operation of the memory controller in accordance with an embodiment of the present disclosure.

FIG. 16 is a diagram illustrating an operation of the memory controller in accordance with an embodiment of the present disclosure.

Referring to FIG. 16, when memory devices end operations, a dummy pulse is applied to, or interrupted in, channels through which the memory controller is coupled to the memory devices.

In step S1501, the memory controller may determine a memory device to end an operation among a plurality of memory devices included in the storage device. The memory device to end the operation among the plurality of memory devices may be determined based on a chip enable signal. That is, when a chip enable signal in a high state is generated, the memory controller may determine that a memory device corresponding to the chip enable signal is to end the operation.

When memory devices to end operations are determined, a dummy pulse may be applied to all channels through which the memory controller is coupled to the determined memory devices, after the determined memory devices end the operations (S1503). That is, since the memory devices simultaneously end the operations, the end of the operations of the memory devices may be delayed to prevent a total current consumption of the memory devices from being instantaneously decreased.

After the dummy pulse is applied to the channels through which the memory controller is coupled to the memory devices to end the operations, the dummy pulses applied to the channels may be sequentially interrupted (S1505). That is, after the dummy pulse is applied to the channels, the memory controller may interrupt the dummy pulse applied to any one channel, and sequentially interrupt the dummy pulses applied to the other channels after a set time elapses.

Thus, the total current consumption of the memory devices can be prevented from being instantaneously decreased.

Figure 17:
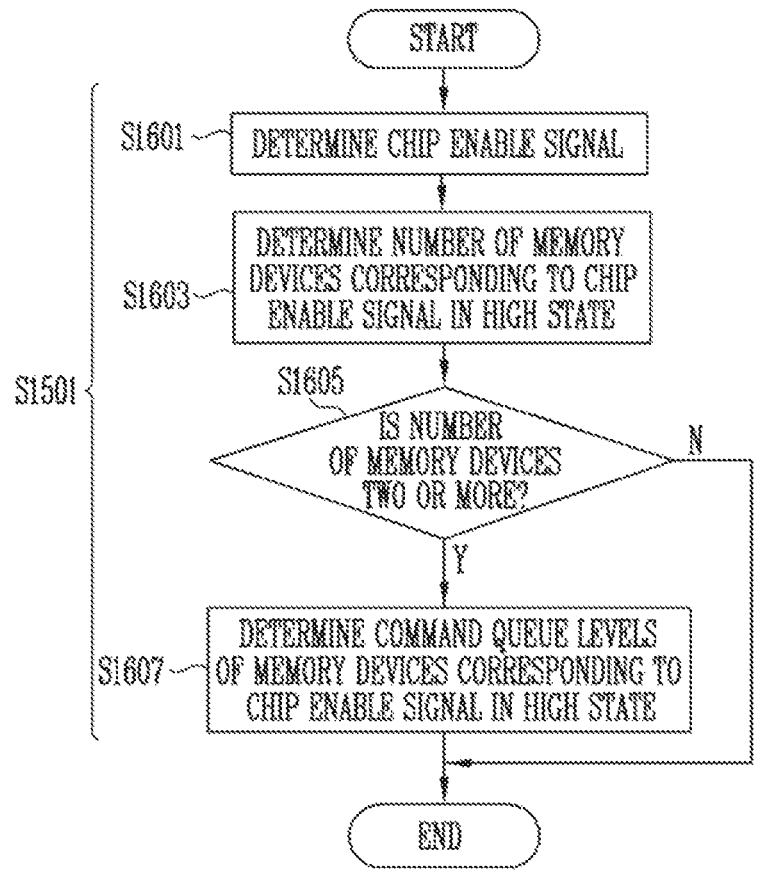
FIG. 17 is a diagram illustrating an operation of the memory controller in accordance with an embodiment of the present disclosure.

FIG. 17 is a diagram illustrating an operation of the memory controller in accordance with an embodiment of the present disclosure.

Referring to FIGS. 16 and 17, steps S1601 to S1607 correspond to step S1501. That is, steps S1601 to S1607 may be steps of determining a memory device to end an operation among a plurality of memory devices that are operating.

In step S1601, the memory controller may determine whether the generated chip enable signal is in a high state or low state. The chip enable signal may correspond to a physical block address PBA. Also, the chip enable signal may be generated for each memory device.

In an embodiment, the memory controller may determine the number of memory devices corresponding to a chip enable signal in the high state among chip enable signals corresponding to the plurality of memory devices (S1603). The memory devices corresponding to the chip enable signal in the high state may be memory devices to end operations.

Subsequently, the memory controller may determine whether a number of the memory devices corresponding to the chip enable signal in the high state is two or more (S1605). When the number of the memory devices corresponding to the chip enable signal in the high state is not two or more (N at S1605), i.e., when the number of the memory devices corresponding to the chip enable signal in the high state is 1, a total current consumption of the memory devices is not rapidly decreased even when current does not flow in the corresponding memory device. Hence, it is unnecessary for the memory controller to perform an operation for sequentially decreasing the total current consumption.

However, when the number of the memory devices corresponding to the chip enable signal in the high state is two or more (Y at S1605), the total current consumption of the memory devices may be rapidly decreased, when current does not simultaneously flow in the corresponding memory devices. Therefore, it is necessary for the memory controller to perform an operation for sequentially decreasing the total current consumption.

In an embodiment, in order to sequentially decrease the total current consumption, the memory controller may determine command queue levels of the memory devices corresponding to the chip enable signal in the high state (S1607). That is, the memory controller may determine whether a dummy pulse is to be applied to, and interrupted in, channels through which the memory controller is coupled to the corresponding memory devices.

For example, the memory controller may determine whether the dummy pulse is to be applied and interrupted, based on whether the command queue levels are all "0."

Figure 18:
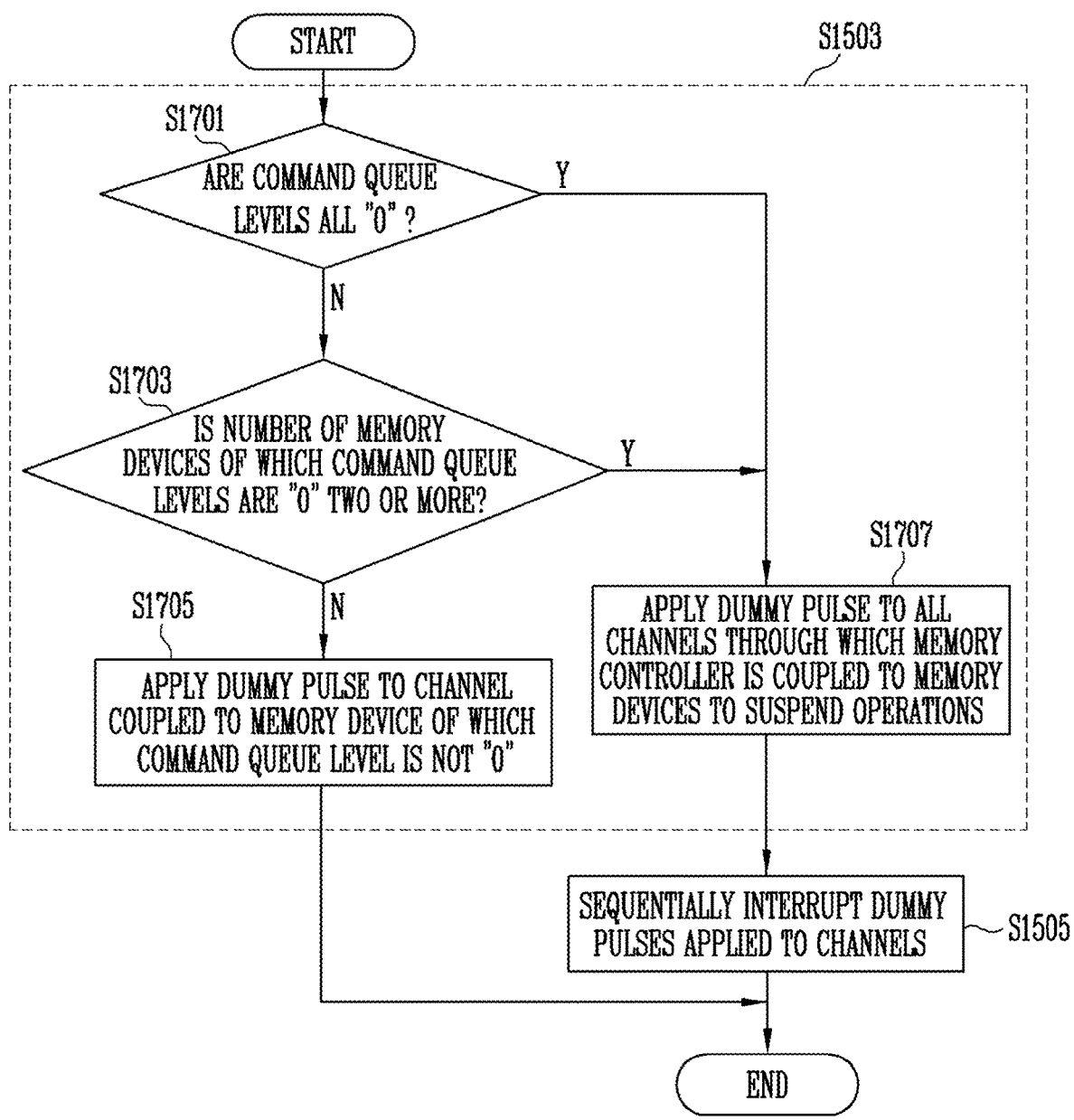
FIG. 18 is a diagram illustrating an operation of the memory controller in accordance with an embodiment of the present disclosure.

FIG. 18 is a diagram illustrating an operation of the memory controller in accordance with an embodiment of the present disclosure.

Referring to FIGS. 16 and 18, steps S1701 to S1707 correspond to step S1503.

In step S1701, the memory controller may determine whether command queue levels are all "0." That is, channels to which a dummy pulse is to be applied may be determined based on the command queue levels.

In an embodiment, when the command queue levels are not all "0" (N at S1701), the memory controller may determine whether the number of memory devices of which command queue levels are "0" is two or more (S1703). When the number of memory devices of which command queue levels are "0" is not two or more (N at S1703), i.e., when the number of memory devices of which command queue levels are "0" is 1, the memory controller may apply the dummy pulse to a channel coupled to the memory device of which command queue level is not "0" (S1705). That is, the dummy pulse may be applied to channels coupled to memory devices that currently end operations but are immediately to perform other operations again. Here, the dummy pulse is applied to the channels at the same time or gradually.

Therefore, current is not consumed in a channel coupled to a memory device to end an operation. Since the number of memory devices to end operations is 1, a total current consumption of the memory devices may not be rapidly decreased.

When the command queue levels are all "0," as determined in step S1701 (Y) or when the number of memory devices of which command queue levels are "0" is two or more, as determined in step S1703 (Y), the memory controller may apply a dummy pulse to all channels through which the memory controller is coupled to the memory devices to end or suspend the operations (S1707). That is, since it is determined that all the memory devices end operations or since it is determined that two or more memory devices end operations, the dummy pulse may be applied to all channels coupled to memory devices determined to end operations. Here, the dummy pulse is applied to the channels at the same time or gradually. Subsequently, the dummy pulses applied to the channels may be sequentially interrupted (S1505).

When the number of memory devices of which command queue levels are "0" is two or more, as determined in step S1703, the dummy pulses may be sequentially interrupted in only the channels coupled to the memory devices of which command queue levels are "0" in step S1505.

Therefore, when the dummy pulses applied to the channels are sequentially interrupted, the total current consumption of the memory devices may not be rapidly decreased.

Figure 19:
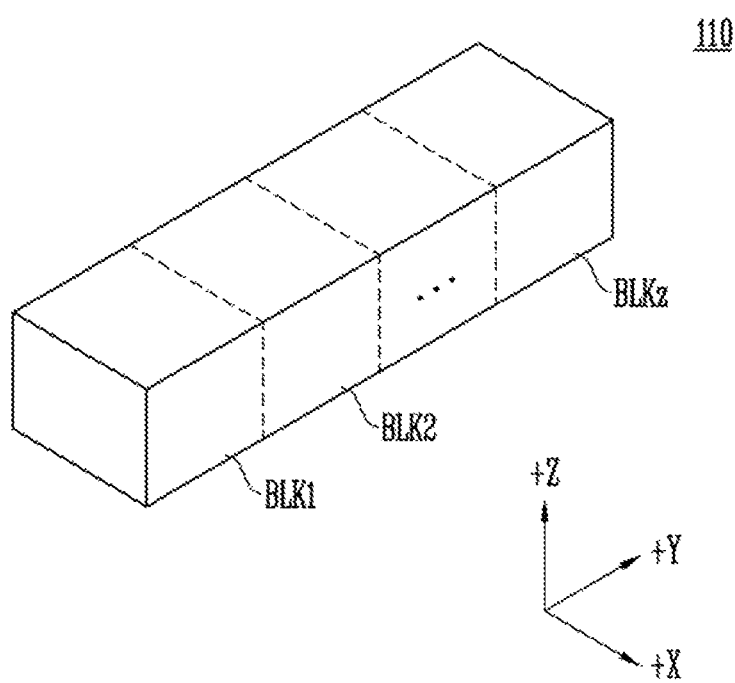
FIG. 19 is a diagram illustrating the memory cell array of FIG. 3 in accordance with an embodiment of the present disclosure.

FIG. 19 is a diagram illustrating the memory cell array 110 of FIG. 3 in accordance with an embodiment.

Referring to FIG. 19, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 20 and 21.

Figure 20:
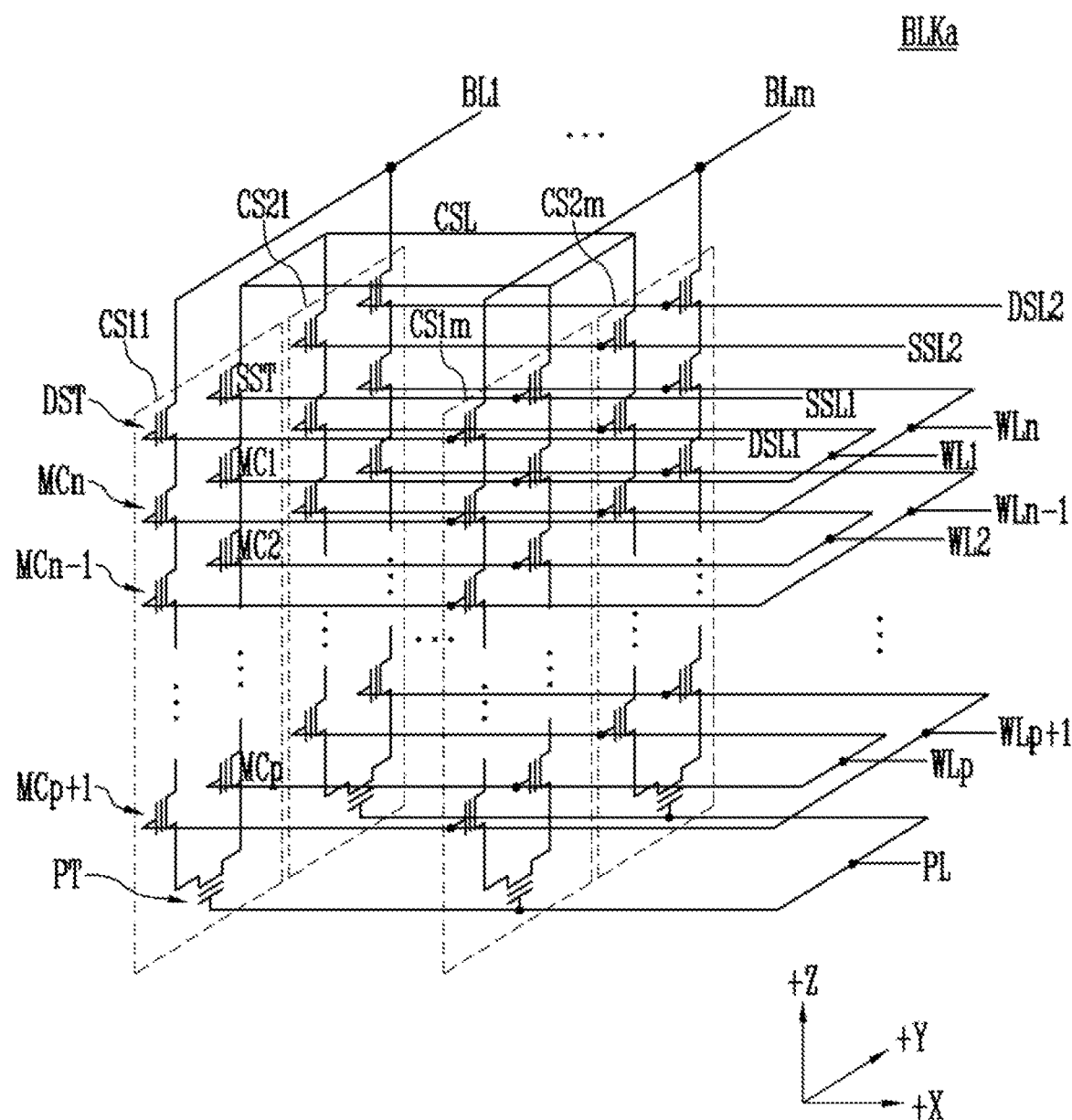
FIG. 20 is a circuit diagram illustrating a memory block of the memory blocks of FIG. 3 in accordance with an embodiment.

FIG. 20 is a circuit diagram illustrating a memory block BLKAa of the memory blocks BLK1 to BLKz of FIG. 3 in accordance with an embodiment.

Referring to FIG. 20, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 20, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 20, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 20, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number cell strings of the cell strings CS11 to CS1m or CS21 to CS2m arranged in the row direction may be coupled to respective even bit lines. Odd-number cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 21:
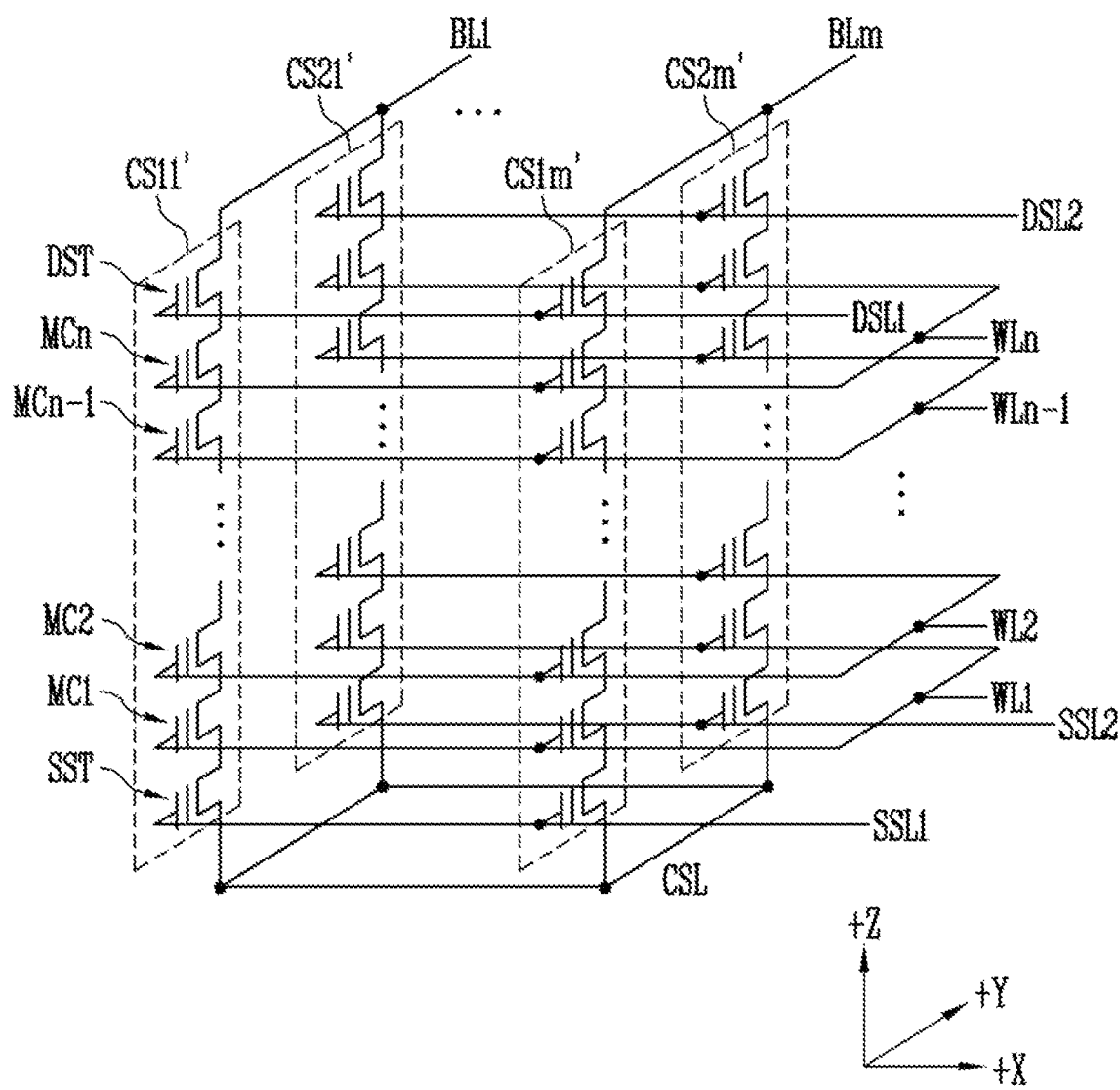
FIG. 21 is a circuit diagram illustrating a memory block of the memory blocks of FIG. 3 in accordance with an embodiment.

FIG. 21 is a circuit diagram illustrating a memory block BLKb of the memory blocks BLK1 to BLKz of FIG. 3, in accordance with an embodiment.

Referring to FIG. 21, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 21 may have an equivalent circuit similar to that of the memory block BLKa of FIG. 20 except that a pipe transistor PT of FIG. 20 is excluded from each cell string of the memory block BLKb of FIG. 21.

In an embodiment, even bit lines and odd bit lines may be provided in lieu of the first to m-th bit lines BL1 to BLm. Even-number cell strings among the cell strings CS11' to CS1m' or CS21' to CS2m' arranged in the row direction may be coupled to the respective even bit lines, and odd-number cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 22:
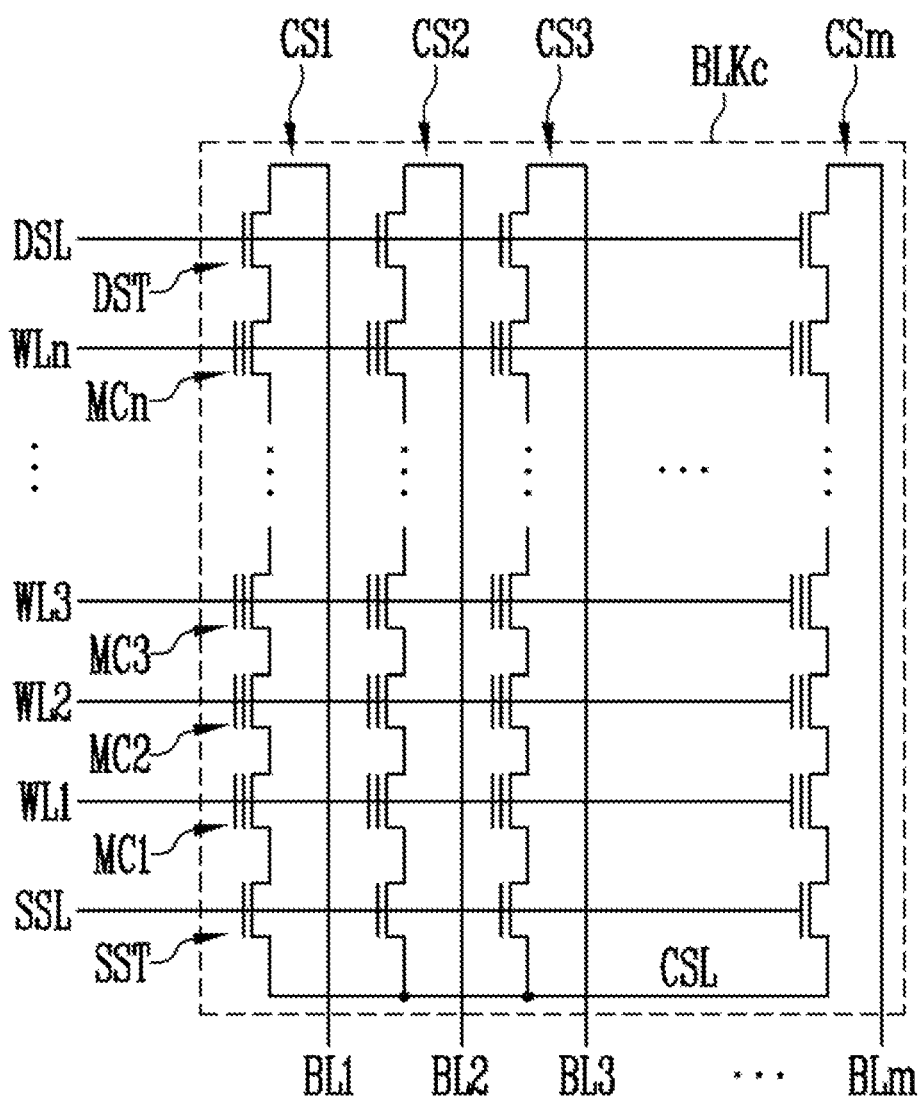
FIG. 22 is a circuit diagram illustrating a memory block of the memory blocks included in the memory cell array of FIG. 3 in accordance with an embodiment.

FIG. 22 is a circuit diagram illustrating a memory block BLKc of the memory blocks BLK1 to BLKz included in the memory cell array 110 of FIG. 3, in accordance with an embodiment.

Referring to FIG. 22, the memory block BLKc includes a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number cell strings of the cell strings CS1 to CSm may be coupled to the respective even bit lines, and odd-number cell strings may be coupled to the respective odd bit lines.

As illustrated in FIGS. 19 to 21, the memory cell array 110 of the memory device 100 may be formed of a memory cell array having a three-dimensional structure. Furthermore, as illustrated in FIG. 22, the memory cell array 110 of the memory device 100 may be formed of a memory cell array having a two-dimensional structure.

Figure 23:
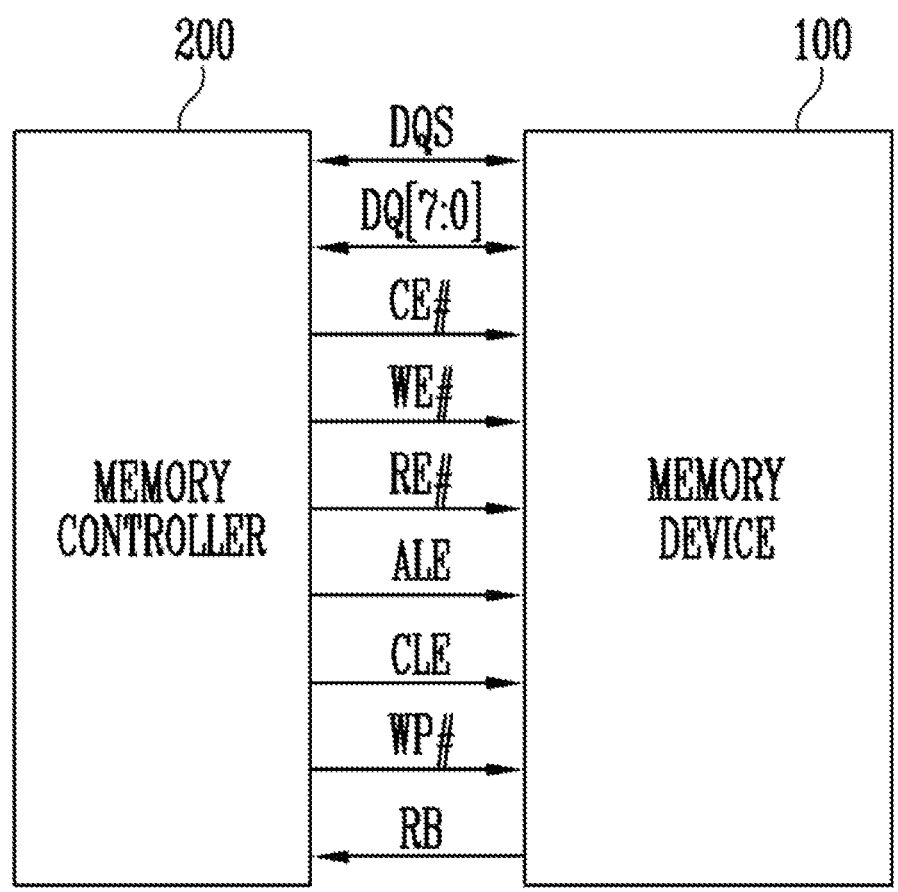
FIG. 23 is a diagram illustrating signals which are exchanged between a memory controller and a memory device in accordance with an embodiment.

FIG. 23 is a diagram illustrating signals which are exchanged between a memory controller 200 and a memory device 100 in accordance with an embodiment. Referring to FIG. 23, the memory controller 200 and the memory device 100 may exchange one or more signals DQ[7:0] each indicating a command, data, and an address through a data pad. Furthermore, the memory controller 200 and the memory device 100 may exchange a data strobe signal DQS through a data strobe pad. The memory device 100 may receive a chip enable signal CE #, a write enable signal WE #, a read enable signal RE #, an address latch enable signal ALE, a command latch enable signal CLE, a write protection signal WP #, etc. Also, the memory device 100 may output a ready/busy signal RB through a ready/busy pad.

To perform a program operation of the memory device 100, the memory controller 200 may output a data strobe signal DQS through the data strobe pad. In synchronization with the data strobe signal DQS output through the data strobe pad, the memory controller 200 may output a program command, an address, and program data through the data pad.

To perform a read operation of the memory device 100, the memory controller 200 may output a read enable signal RE # through a read enable pad. In response to the read enable signal RE #, the memory device 100 may output a data strobe signal DQS. In synchronization with the data strobe signal DQS, the memory device 100 may output read data through the data pad.

During a program operation of the memory device 100, the memory controller 200 may output a data strobe signal DQS to the memory device 100, and output program data to the memory device 100 through the data pad. During a read operation of the memory device 100, the memory device 100 may output a data strobe signal DQS to the memory controller 200, and output read data to the memory controller 200 through the data pad.

Referring back to FIG. 5, a plurality of memory devices 100_1 to 100_4 are coupled to a plurality of channels CH1 to CH4, respectively, in accordance with an embodiment.

In the memory controller 200 according to an embodiment of the present disclosure, when each of the memory devices 100_1 to 100_4 starts an operation, an initial frequency of a clock signal output may be controlled based on an idle time of each of the memory devices 100_1 to 100_4. In an embodiment, the clock signal that is output from the memory controller 200 may be a read enable signal RE # which is output during a read operation, or a data strobe signal DQS which is output during a program operation. In the memory controller 200 in accordance with an embodiment of the present disclosure, if the idle time of a memory device 100_1, 100_2, 100_3, or 100_4 exceeds a threshold time, a clock signal to be output to the memory device may be generated based on an initial frequency (or initial operation frequency) less than a normal frequency during an initial frequency scaling period. In an embodiment, when the idle time of a memory device 100_1, 100_2, 100_3, or 100_4 exceeds a threshold time, the memory controller 200 may generate a clock signal having an initial frequency during an initial frequency scaling period, the initial frequency being less than a normal frequency. If the initial frequency scaling period has passed and the process enters a normal operation period, the memory controller 200 may generate clock signals to be output to the memory devices 100_1 to 100_4 based on the normal frequency. Therefore, if the plurality of memory devices 100_1 to 100_4 start operations substantially at the same time, the entire current consumption of the storage device 50 may be prevented from rapidly increasing by reducing an initial operation frequency of each of the clock signals output from the memory devices 100_1 to 100_4 during the initial frequency scaling period compared to the normal frequency.

Referring back to FIG. 6, a plurality of memory devices 100_1 to 100_8 are coupled to a plurality of channels CH1 to CH4 in accordance with an embodiment.

In the memory controller 200 in accordance with an embodiment of the present disclosure, when each of the memory devices 100_1 to 100_8 starts an operation, an initial frequency of a clock signal output may be controlled based on an idle time of each of the memory devices 100_1 to 100_8. In an embodiment, the clock signal that is output from the memory controller 200 may be a read enable signal RE # which is output through the read enable pad during a read operation, or a data strobe signal DQS which is output through the DQS pad during a program operation. In the memory controller 200 in accordance with an embodiment of the present disclosure, if the idle time of one of the memory devices 100_1 to 100_8 exceeds a threshold time, a clock signal to be output to the memory device may be generated based on an initial frequency less than a normal frequency during an initial frequency scaling period. If the initial frequency scaling period has passed and the process enters a normal operation period, the memory controller 200 may generate clock signals to be output to the memory devices 100_1 to 100_8 based on the normal frequency. Therefore, if the plurality of memory devices 100_1 to 100_8 start operations substantially at the same time, the entire current consumption of the storage device 50 may be prevented from rapidly increasing by reducing the initial operation frequency of each of the clock signals output from the memory devices 100_1 to 100_8 during the initial frequency scaling period compared to the normal frequency.

Figure 24:
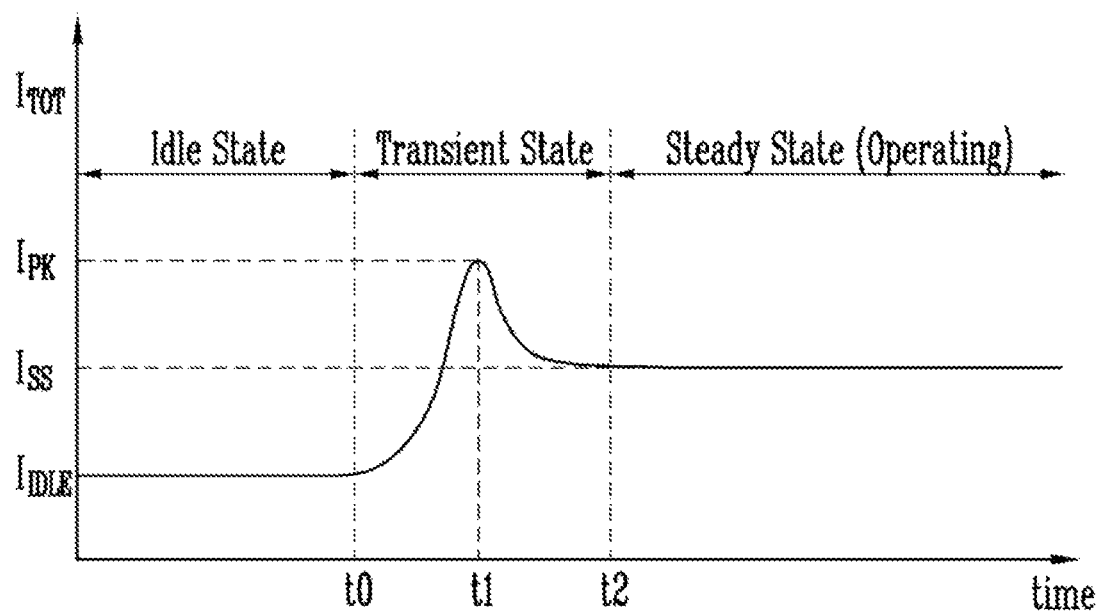
FIG. 24 is a diagram for describing a change in entire current consumption when memory devices coupled to a plurality of channels start operations substantially at the same time in accordance with an embodiment.

FIG. 24 is a diagram for describing a change in entire current consumption when memory devices coupled to a plurality of channels start operations substantially at the same time in accordance with an embodiment. Referring to FIG. 24, if a plurality of memory devices start or end operations substantially at the same time, a noise may occur on a voltage source Vsource.

For example, the plurality of memory devices may remain idle until time t0. In the idle state, a total current $I_{TOT}$ that is consumed in a storage device (e.g., the storage device 50 in FIG. 1) may be maintained at a relatively low idle state current $I_{IDLE}$. At a first time t0, the plurality of memory devices may start operations substantially at the same time. As the plurality of memory devices start the operations substantially at the same time, the total current $I_{TOT}$ that is consumed in the storage device 50 during a period from the first time t0 to a second time t1 may rapidly increase from the idle state current $I_{IDLE}$ to a peak current $I_{PK}$. The total current $I_{TOT}$ that has increased to the peak current $I_{PK}$ at the second time t1 may be reduced to a steady state current $I_{SS}$ from the second time t1 to a third time t2 as the operation of the storage device 50 is stabilized. The storage device 50 is in a transient state during a period from the first time t0 to the third time t2.

From the third time t2 after the transient state has been terminated, the storage device 50 may operate in a steady state. The total current $I_{TOT}$ that is consumed by the storage device 50 in the steady state may be stably maintained at the steady state current $I_{SS}$.

As illustrated in FIG. 24, in the case where the plurality of memory devices included in the storage device 50 start operations substantially at the same time, the total current $I_{TOT}$ that is consumed by the storage device 50 in the transient state may rapidly increase to the peak current $I_{PK}$. If each of the plurality of memory devices operates at a relatively high speed, the peak current $I_{PK}$ may have a relatively large magnitude.

In a memory controller (e.g., the memory controller 200 in FIG. 1) in accordance with an embodiment of the present disclosure, when a memory device in the storage device 50 starts an operation, an initial frequency of a clock signal output may be controlled based on an idle time of the memory device. In the memory controller 200 in accordance with an embodiment of the present disclosure, if the idle time of the memory device exceeds a threshold time, a clock signal to be output to the memory device may be generated based on an initial frequency less than a normal frequency during an initial frequency scaling period. If the initial frequency scaling period has passed and the process enters a normal operation period, the memory controller 200 may generate a clock signal to be output to the memory device based on the normal frequency. Therefore, even if a plurality of memory devices start operations substantially at the same time, the entire current consumption of the storage device 50 may be prevented from rapidly increasing by reducing the initial operation frequency of the clock signal from the memory device during the initial frequency scaling period compared to the normal frequency.

Figure 25:
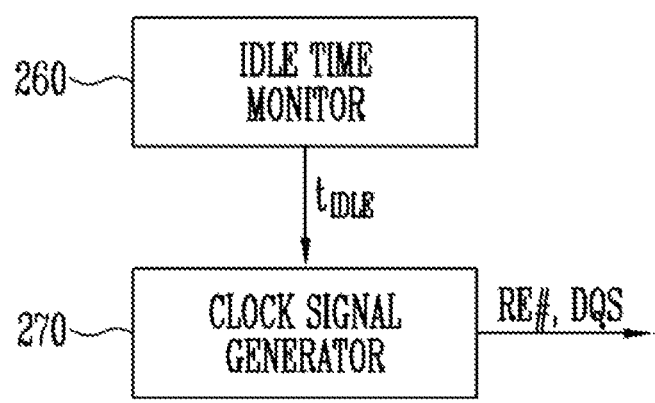
FIG. 25 is a block diagram illustrating a memory controller in accordance with an embodiment of the present disclosure.

FIG. 25 is a block diagram illustrating a memory controller 200 in accordance with an embodiment of the present disclosure.

Referring to FIG. 25, the memory controller 200 in accordance with an embodiment of the present disclosure may include an idle time monitor 260 and a clock signal generator 270. The idle time monitor 260 may monitor an idle time $t_{IDLE}$ of the memory device included in a storage device (e.g., the storage device 50 in FIG. 1) and output it to the clock signal generator 270. For example, the idle time monitor 260 may generate a signal indicative the idle time $t_{IDLE}$ of the memory device and output the generated signal to the clock signal generator 270. The clock signal generator 270 may generate a read enable signal RE # or a data strobe signal DQS based on the received idle time $t_{IDLE}$.

Figure 26:
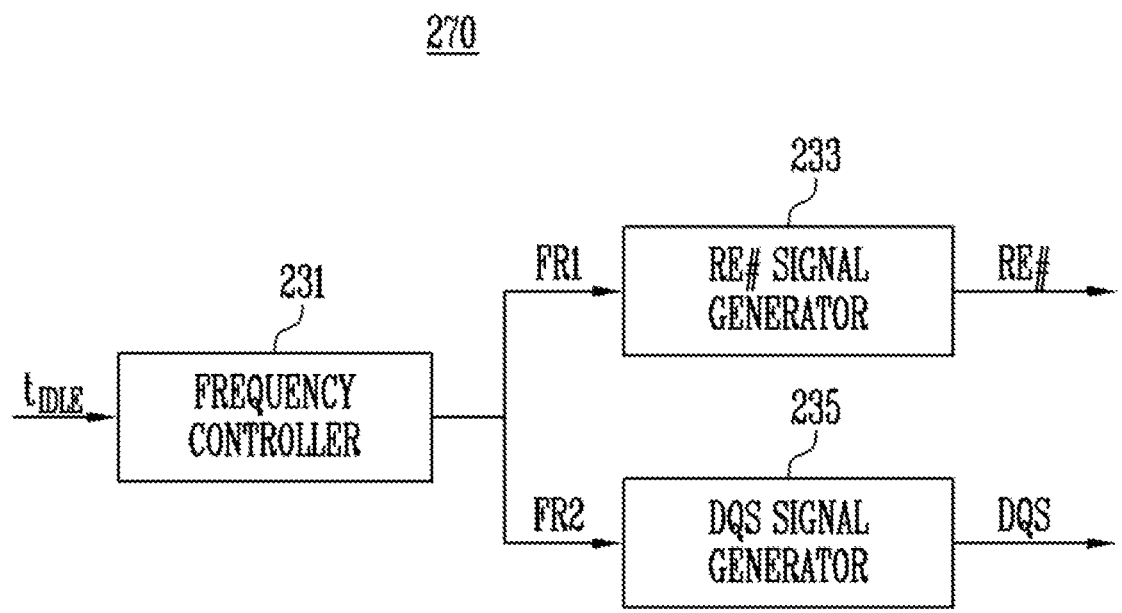
FIG. 26 is a block diagram illustrating a clock signal generator of FIG. 25 in accordance with an embodiment.

FIG. 26 is a block diagram illustrating the clock signal generator 270 of FIG. 25 in accordance with an embodiment of the present disclosure.

Referring to FIG. 26, the clock signal generator 270 may include a frequency controller 231, a read enable signal generator 233, and a data strobe signal generator 235.

The frequency controller 231 may receive an idle time $t_{IDLE}$ of the memory device and control a frequency of a clock signal to be output to the memory device. In other words, the frequency controller 231 may generate a frequency FR1 or FR2 for generating a clock signal and transmit the frequency FR1 or FR2 to the read enable signal generator 233 or the data strobe signal generator 235. For example, the frequency controller 231 may generate a first signal indicative of a first frequency FR1 and transmit the first signal to the read enable signal generator 233, or may generate a second signal indicative of a second frequency FR2 and transmit the second signal to the data strobe signal generator 235.

In more detail, during a read operation of the memory device, the memory controller 200 may generate a read enable signal RE #. In this case, the frequency controller 231 may control the frequency FR1 for generating the read enable signal RE # based on the idle time $t_{IDLE}$. During a program operation of the memory device, the memory controller 200 may generate a data strobe signal DQS. In this case, the frequency controller 231 may control the frequency FR2 for generating the data strobe signal DQS based on the idle time $t_{IDLE}$.

The read enable signal generator 233 may generate a read enable signal RE # based on the frequency FR1 that is controlled by the frequency controller 231. The data strobe signal generator 235 may generate a data strobe signal DQS based on the frequency FR2 that is controlled by the frequency controller 231.

An operation of the memory controller 200 in accordance with an embodiment of the present disclosure will be described below in detail with reference to FIG. 27.

Figure 27:
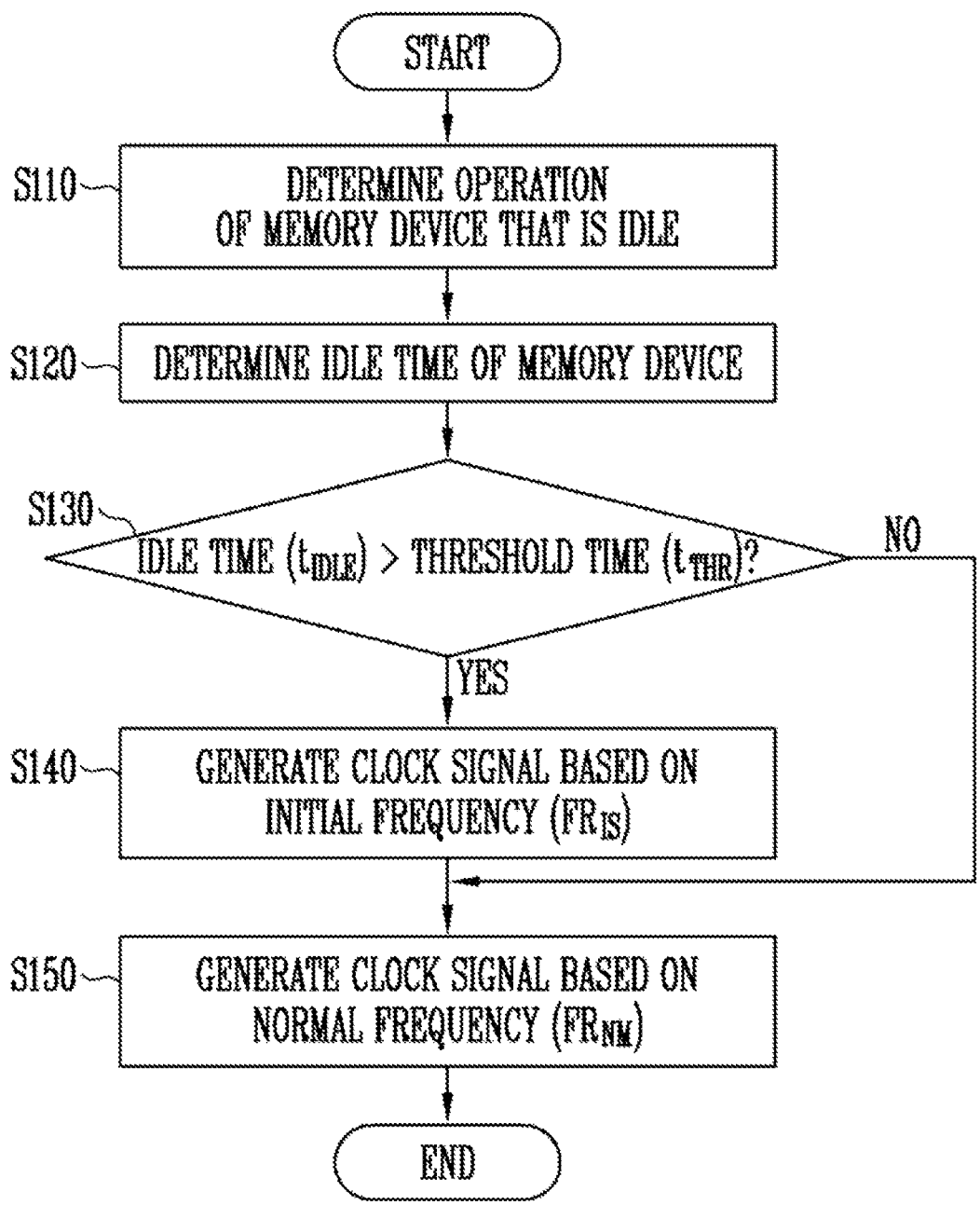
FIG. 27 is a flowchart for describing a method of operating a memory controller in accordance with an embodiment of the present disclosure.

FIG. 27 is a flowchart for describing a method of operating a memory controller (e.g., the memory controller 200 in FIG. 25) in accordance with an embodiment of the present disclosure.

Referring to FIG. 27, at step S110, an operation of a memory device that is idle may be determined. At step S110, it may be determined that an operation of at least one of the first to fourth memory devices 100_1 to 100_4 illustrated in FIG. 5 starts. At step S110, it may be determined that an operation for at least one of the first to eighth memory devices 100_1 to 100_8 illustrated in FIG. 6 starts.

At step S120, an idle time $t_{IDLE}$ of a memory device that has been determined to start the operation may be determined. The idle time $t_{IDLE}$ of the memory device may correspond to a time interval between a first time when a previous operation of the corresponding memory device ends to a second time when a subsequent operation thereof starts. Step S120 may be performed by the idle time monitor 260 of FIG. 25.

At step S130, it is determined whether the determined idle time (or idle time interval) $t_{IDLE}$ is greater than a threshold time (or a threshold time interval) $t_{THR}$. The threshold time $t_{THR}$ may be a value that is determined depending on the design or a result of simulation. If the determined idle time $t_{IDLE}$ is greater than the threshold time $t_{THR}$, it may indicate that the memory device has been idle for a relatively long time. When the memory device that has been idle for a relatively long time starts an operation, there is high possibility for other memory devices to also start operations substantially at the same time.

Therefore, if the idle time $t_{IDLE}$ of the memory device is greater than the threshold time $t_{THR}$ (YES at step S130), a clock signal needed for the operation may be generated based on an initial frequency $FR_{IS}$ (at step S140). Hence, during an initial operation period of the memory device, the clock signal may be generated based on the initial frequency $FR_{IS}$. For example, the generated clock signal may have the initial frequency $FR_{IS}$ during the initial operation period. After the initial operation period of the memory device, a clock signal may be generated based on a normal frequency $FR_{NM}$ (at step S150). Hence, during a normal operation period after the initial operation period of the memory device, the clock signal may be generated based on the normal frequency $FR_{NM}$. For example, the generated clock signal may have the normal frequency $FR_{NM}$ during a normal operation period. The initial frequency $FR_{IS}$ may be a value less than the normal frequency $FR_{NM}$. Therefore, if the idle time $t_{IDLE}$ of the memory device is greater than the threshold time $t_{THR}$ (YES at step S130), the initial operation may be performed based on the initial frequency $FR_{IS}$ having a value less than the normal frequency $FR_{NM}$, and the normal operation may be thereafter performed based on the normal frequency $FR_{NM}$. The operation frequency of the memory device may have great influence on current consumption. Hence, the peak current $I_{PK}$ that occurs in a transient period t0 to t2 of FIG. 24 may be reduced.

If the determined idle time $t_{IDLE}$ is equal to or less than the threshold time $t_{THR}$, it may indicate that the memory device has been idle for a relatively short time. If the memory device that has been idle for a relatively short time starts an operation, there is high possibility for other memory devices each to keep performing current operations or remain in the idle state, rather than starting a new operation. Therefore, if the idle time $t_{IDLE}$ of the memory device is equal to or less than the threshold time $t_{THR}$ (NO at step S130), the process may directly enter the normal operation period without the initial operation period. Therefore, in this case, step S150 may be directly performed without performing step S140. Hence, the operating speed of the memory device may not be significantly reduced because of an unnecessary initial operation.

FIGS. 28A and 28B are timing diagrams for describing a method of operating a memory controller (e.g., the memory controller 200 in FIG. 25) in accordance with an embodiment of the present disclosure. Although FIGS. 28A and 28B illustrate read enable signals RE # as examples of a clock signal, embodiments of the present disclosure are not limited thereto. For example, a data strobe signal DQS which is generated by the memory controller 200 may also be illustrated in the same manner as illustrated in FIGS. 28A and 28B.

FIG. 28A shows a read enable signal RE # that is generated in a first case CASE I where the idle time $t_{IDLE}$ is equal to or less than the threshold time $t_{THR}$ as a result of the determination at step S130 of FIG. 27. The read enable signal RE # that has swung based on the normal frequency $FR_{NM}$ during a previous operation period may not swing during an idle period. Since the idle time $t_{IDLE}$ in the idle period is less than the threshold time $t_{THR}$, the idle period may end and a normal operation period may directly start. Specifically, the idle time $t_{IDLE}$ may correspond to a duration of the idle period. During the normal operation period, the read enable signal RE # may be generated based on the normal frequency $FR_{NM}$ at step S150 of FIG. 27. During the normal operation period, a data transfer operation may be performed between a memory device and a memory controller. In more detail, since a clock signal illustrated in FIG. 28A is a read enable signal RE #, read data may be transmitted from the memory device to the memory controller during the normal operation period.

FIG. 28B shows a read enable signal RE # that is generated in a second CASE II where the idle time $t_{IDLE}$ is greater than the threshold time $t_{THR}$ as a result of the determination at step S130. The read enable signal RE # that has swung based on the normal frequency $FR_{NM}$ during a previous operation period may not swing during an idle period. Since the idle time $t_{IDLE}$ in the idle period is greater than the threshold time $t_{THR}$, the idle period may end and an initial operation period, i.e., an initial frequency scaling period, may start. During the initial frequency scaling period, the read enable signal RE # may be generated based on a scaled initial frequency $FR_{IS}$ at step S140 of FIG. 27. The initial frequency $FR_{IS}$ may have a value less than the normal frequency $FR_{NM}$. Hence, during the initial frequency scaling period, a clock signal, e.g., a read enable signal RE #, may swing at a relatively low speed.

If the initial operation period, i.e., the initial frequency scaling period, is terminated, the normal operation period may start. During the normal operation period, the read enable signal RE # may be generated based on the normal frequency $FR_{NM}$ at step S150. During the initial frequency scaling period and the normal operation period, a data transfer operation may be performed between the memory device and the memory controller. In more detail, since a clock signal illustrated in FIG. 28B is a read enable signal RE #, read data may be transmitted from the memory device to the memory controller during the initial frequency scaling period and the normal operation period.

As illustrated in FIGS. 28A and 28B, when the memory device 100 starts an operation, the memory controller 200 in accordance with an embodiment of the present disclosure may control the initial frequency of a clock signal output based on the idle time $t_{IDLE}$ of the memory device 100. In the memory controller 200 in accordance with an embodiment of the present disclosure, if the idle time $t_{IDLE}$ of the memory device 100 exceeds the threshold time $t_{THR}$, a clock signal to be output to the memory device 100 may be generated based on an initial frequency $FR_{IS}$ less than the normal frequency $FR_{NM}$ during the initial frequency scaling period. If the initial frequency scaling period has passed and the process enters a normal operation period, the memory controller may generate a clock signal to be output to the memory devices 100 based on the normal frequency $FR_{NM}$. Therefore, if the plurality of memory devices 100_1 to 100_8 start operations substantially at the same time, the entire current consumption of the storage device 50 may be prevented from rapidly increasing by reducing the initial operation frequency.

Referring to FIG. 28B, the second case CASE II where the initial frequency $FR_{IS}$ used during the initial frequency scaling period is an invariable constant. In other words, during the initial frequency scaling period of FIG. 28B, the frequency of the read enable signal RE # may remain substantially constant. However, various embodiments of the present disclosure are not limited thereto. For example, the initial frequency $FR_{IS}$ that is used during the initial frequency scaling period may vary over time. For instance, the initial frequency $FR_{IS}$ that is used during the initial frequency scaling period may be gradually increased over time. Embodiments of controlling the frequency of a clock signal generated during the initial frequency scaling period will be described with reference to FIGS. 29 to 32.

Figure 29:
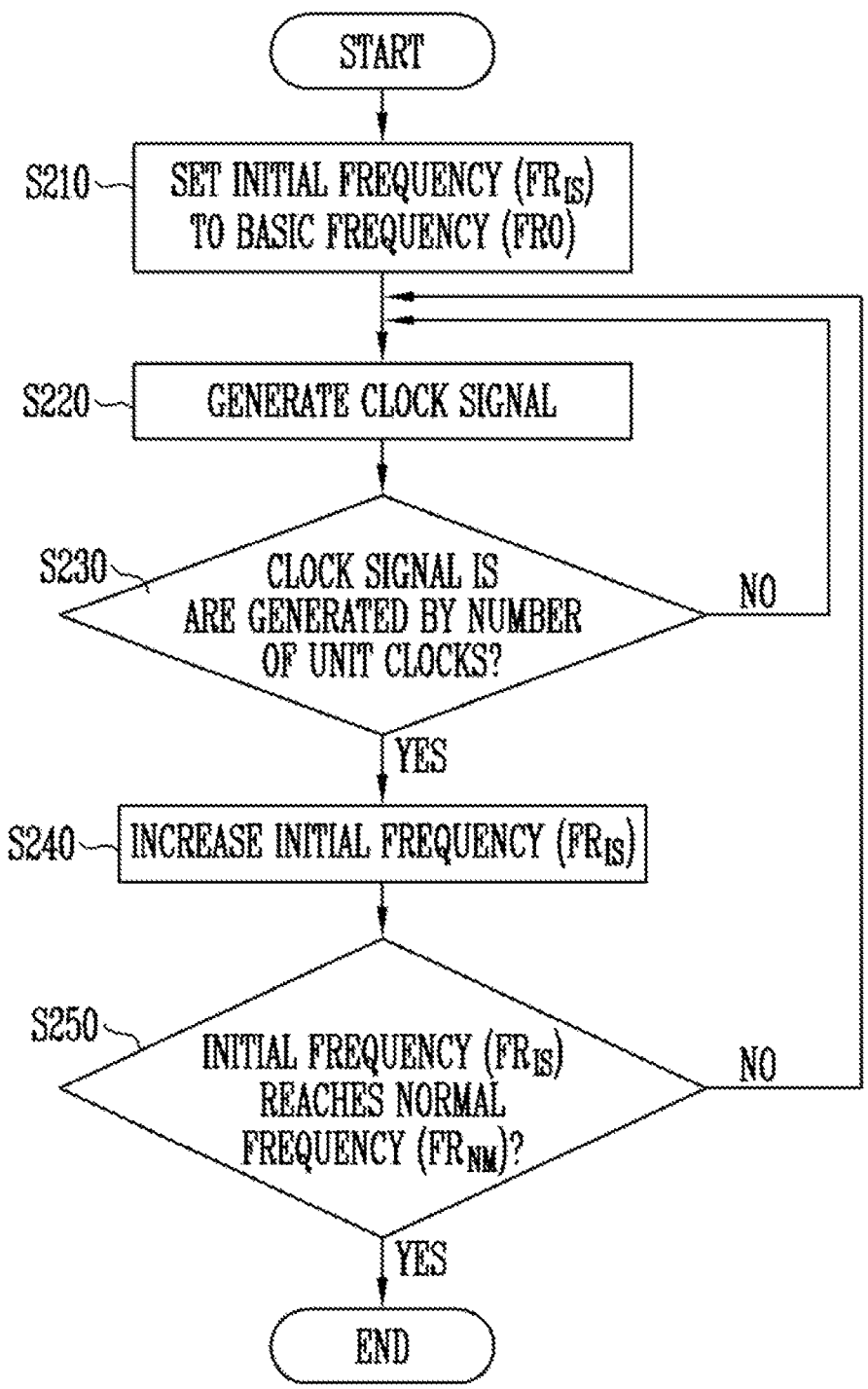
FIG. 29 is a flowchart illustrating step S140 of FIG. 27 in accordance with an embodiment of the present disclosure.

FIG. 29 is a flowchart illustrating step S140 of FIG. 27 in accordance with an embodiment of the present disclosure. FIG. 29 illustrates an example of a method of controlling the frequency of a clock signal generated during an initial frequency scaling period. In other words, FIG. 29 illustrates a method of controlling the initial frequency $FR_{IS}$ according to an embodiment.

Referring to FIG. 29, a frequency controller (e.g., the frequency controller 231 in FIG. 26) may set the initial frequency $FR_{IS}$ to a basic frequency FR0 as an initial value at step S210. The basic frequency FR0 may be a constant value and be less than the normal frequency $FR_{NM}$. Thereafter, at step S220, a clock signal is generated. Step S220 may be performed by a read enable signal generator (e.g., the read enable signal generator 233 in FIG. 26) or a data strobe signal generator (e.g., the data strobe signal generator 235 in FIG. 26). At step S220, a clock signal corresponding to one cycle may be generated. The clock signal may be a read enable signal RE # or a data strobe signal DQS.

After the clock signal corresponding to one cycle has been generated at step S220, it is determined whether clock signals have been generated by a given number of unit clocks at step S230. The number of unit clocks may indicate the number of cycles of clocks that are sequentially generated by the same initial frequency $FR_{IS}$. In an embodiment, the clock signal is generated based on the same initial frequency $FR_{IS}$ until the number of cycles of the generated clock signal reaches a given number. For example, in the case where the number of unit clocks is three, clock signals having the same frequency may be generated during three cycles. The number of unit clocks may be set to various values, as needed.

As a result of the determination at step S230, if clock signals are not generated by the number of unit clocks (NO at step S230), the process may return to step S220 without changing the initial frequency $FR_{IS}$ so that a clock signal corresponding to one cycle is generated again. If the foregoing is repeated and clock signals are thus generated by the number of unit clocks (YES at step S230), the initial frequency $FR_{IS}$ is increased at step S240. At step S240, the initial frequency $FS_{IS}$ may increase by various increments.

After the initial frequency $FR_{IS}$ is increased, it may be determined whether the initial frequency $FR_{IS}$ has reached the normal frequency $FR_{NM}$ at step S250. If the initial frequency $FR_{IS}$ has reached the normal frequency $FR_{NM}$ (YES at step S250), this may indicate that the initial frequency scaling period has been terminated. Therefore, referring back to FIG. 27, step S140 may end, and the process may proceed to step S150 so that the normal operation period may start.

If the initial frequency $FR_{IS}$ has not reached the normal frequency $FR_{NM}$ (NO at step S250), the process may return to step S220 so that a clock signal corresponding to the increased initial frequency $FR_{IS}$ may be generated.

Figure 30A:
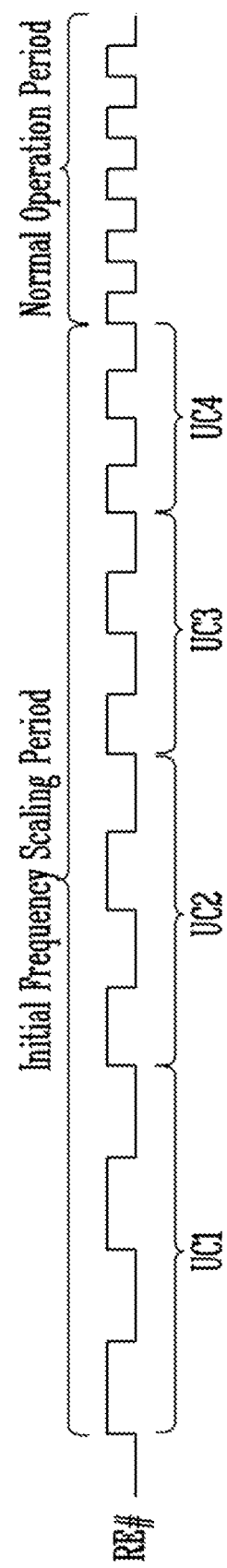

FIGS. 30A and 30B are timing diagrams for describing the process of FIG. 29 according to embodiments.

FIG. 30A illustrates a method of controlling the initial frequency $FR_{IS}$ in the case where the number of unit clocks is two. If the initial frequency scaling period starts, the initial frequency $FR_{IS}$ may be set to the basic frequency FR0, at step S210. Hence, during a first unit clock period UC1, a clock signal (e.g., a read enable signal RE #) corresponding to two cycles may be generated based on the basic frequency FR0.

If the clock signal corresponding to two cycles is generated, the frequency controller 231 may increase the initial frequency $FR_{IS}$ as a result of the determination at step S230. Hence, during a second unit clock period UC2, a clock signal corresponding to two cycles may be generated based on the increased initial frequency $FR_{IS}$. Likewise, during a third unit clock period UC3, a clock signal may be generated based on a further increased initial frequency $FR_{IS}$. During a fourth unit clock period UC4, a clock signal may be generated based on a further increased initial frequency $FR_{IS}$. In the case where the fourth unit clock period ends and the initial frequency $FR_{IS}$ that has increased by step S240 has reached the normal frequency $FR_{NM}$, the initial frequency scaling period may end and the process may enter the normal operation period.

FIG. 30B illustrates a method of controlling the initial frequency $FR_{IS}$ in the case where the number of unit clocks is one. Since the number of unit clocks is one, the read enable signal RE # may be generated based on the initial frequency $FR_{IS}$ that increases for each period. In other words, since the unit clock period in FIG. 30B is a clock period corresponding to one cycle, the initial frequency $FR_{IS}$ may increase at each time when the clock signal completes one cycle.

Although FIGS. 30A and 30B illustrate examples in which the numbers of unit clocks are two and one, respectively, embodiments of the present disclosure are not limited thereto. For example, an embodiment in which the number of unit clocks is 3 or more may also fall within the bounds of the present disclosure.

Figure 31:
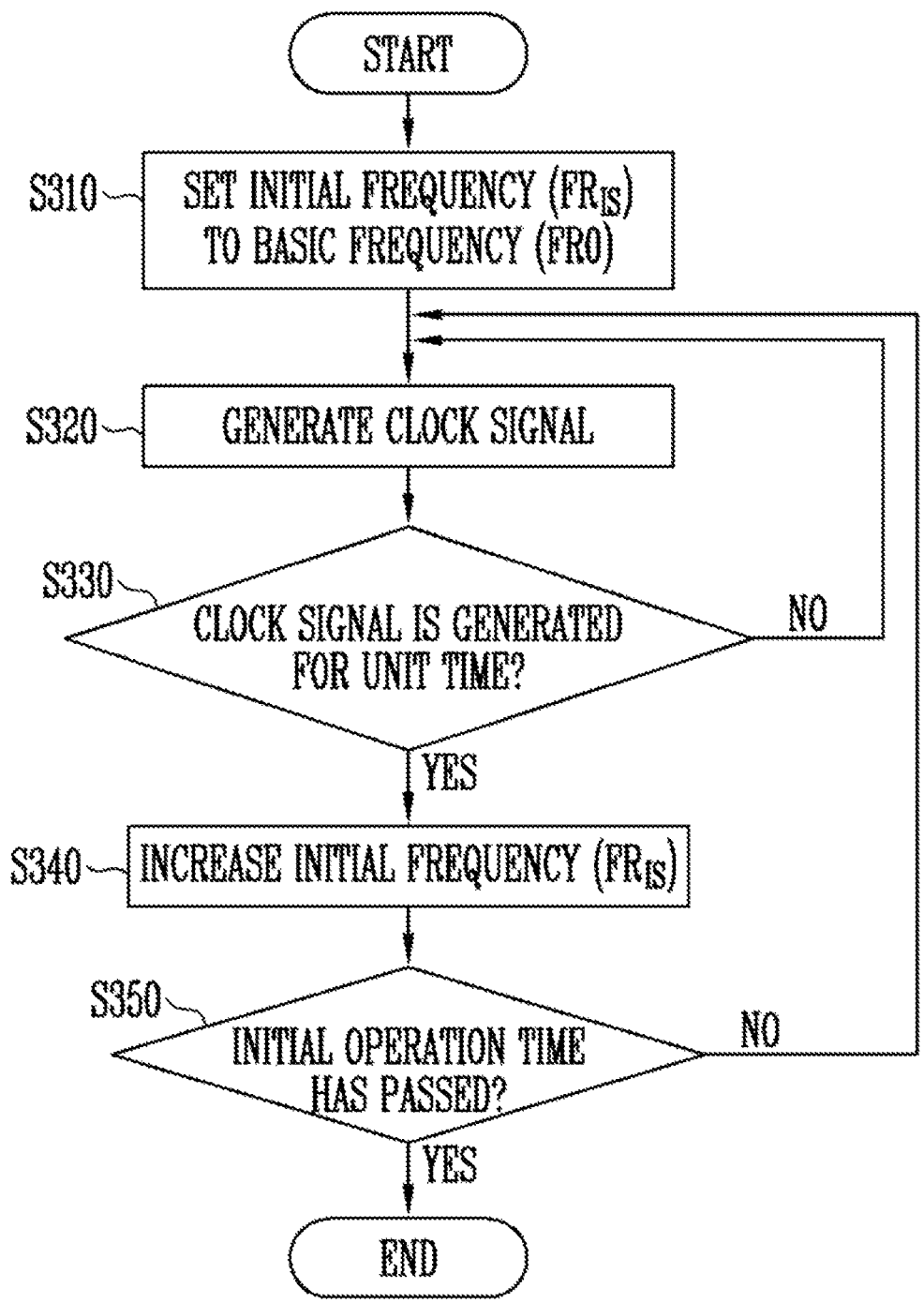
FIG. 31 is a flowchart illustrating step S140 of FIG. 27 in accordance with an embodiment of the present disclosure.

FIG. 31 is a flowchart illustrating step S140 of FIG. 27 according to an embodiment. FIG. 31 illustrates an example of a method of controlling a frequency of a clock signal generated during an initial frequency scaling period.

Referring to FIG. 31, a frequency controller (e.g., the frequency controller 231 in FIG. 26) may set the initial frequency $FR_{IS}$ to a basic frequency FR0 as an initial value at step S310. The basic frequency FR0 may be a constant value and be less than the normal frequency $FR_{NM}$. Thereafter, at step S320, a clock signal is generated. Step S320 may be performed by a read enable signal generator (e.g., the read enable signal generator 233 in FIG. 26) or a data strobe signal generator (e.g., the data strobe signal generator 235 in FIG. 26). At step S320, a clock signal corresponding to one cycle may be generated. The clock signal may be a read enable signal RE # or a data strobe signal DQS.

After the clock signal corresponding to one cycle has been generated at step S320, it is determined whether a clock signal has been generated during a unit time (or unit time interval) at step S330. The unit time may indicate the time it takes to generate a clock signal having the same initial frequency $FR_{IS}$. For example, the unit time may be a time interval during which the clock signal is generated to have the same initial frequency $FR_{IS}$ for a given number of periods. The unit time may be set to various values, as needed.

As a result of the determination at step S330, if a duration during which the clock signal has been generated is shorter than the unit time (NO at step S330), the process may return to step S320 without changing the initial frequency $FR_{IS}$ so that a clock signal corresponding to one cycle is generated again. For example, when the duration during which the clock signal has been generated is shorter than the unit time, the process continues to generate the clock signal during a next cycle while keeping the initial frequency $FR_{IS}$. The foregoing is repeated, and a clock signal is generated based on the same initial frequency $FR_{IS}$ until it reaches the unit time. For example, the process continues to generate the clock signal having the same initial frequency $FR_{IS}$ until the duration during which the clock signal has been generated reaches the unit time.

If a clock signal is generated during the unit time (YES at step S330), the initial frequency value $FR_{IS}$ is increased, at step S340. At step S340, the initial frequency $FS_{IS}$ may increase by various increments.

After the initial frequency $FR_{IS}$ has increased, it is determined whether an initial operation time has passed at step S350. The initial operation time may be a predetermined fixed time and be used to determine the initial frequency scaling period. If the initial operation time has passed (YES at step S350), this may indicate that the initial frequency scaling period has ended. Therefore, referring back to FIG. 27, step S140 may end, and the process may proceed to step S150 so that the normal operation period may start.

If the initial operation time has not yet passed (NO at step S350), the process may return to step S320 so that a clock signal corresponding to the increased initial frequency $FR_{IS}$ is generated.

Figure 32:
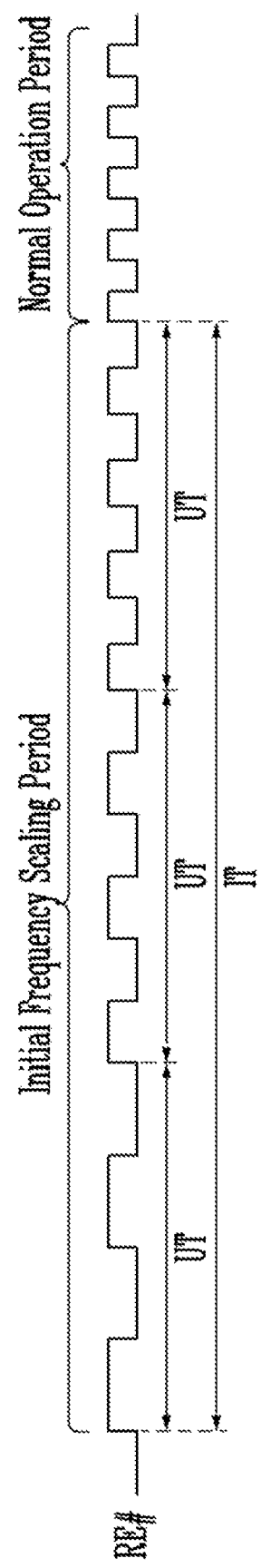
FIG. 32 is a timing diagram for describing the embodiment illustrated in FIG. 31.

FIG. 32 is a timing diagram for describing the process in FIG. 31 according to an embodiment.

Referring to FIG. 32, there are illustrated a unit time UT and an initial operation time IT. During the unit time UT, the initial operation frequency $FR_{IS}$ may remain substantially constant. Each time the unit time UT passes, the initial operation frequency $FR_{IS}$ is increased. If the initial operation time IT passes, the initial frequency scaling period ends, and the normal operation period starts.

Although FIGS. 29 to 32 illustrate embodiments of step S140 of generating a clock signal based on the initial frequency $FR_{IS}$, embodiments of the present disclosure are not limited thereto. Therefore, during the initial frequency scaling period, the initial frequency $FR_{IS}$ may be controlled not only by the methods described in the embodiments of FIGS. 29 to 32 but also by various methods. As described with reference to FIGS. 29 to 32, the initial frequency $FR_{IS}$ may be controlled such that it is gradually increased during the initial frequency scaling period. Referring back to FIG. 30A, the read enable signal RE # has a first initial frequency during the first unit clock period UC1, a second initial frequency during the second unit clock period UC2, a third initial frequency during the third unit clock period UC3, and a fourth initial frequency during the fourth unit clock period UC4. In an embodiment, the second initial frequency is a first given times as great as the first initial frequency, the third initial frequency is a second given times as great as the second initial frequency, and the fourth initial frequency is a third given times as great as the third initial frequency. For example, each of the first, second, and third given times may be in a range from 1.1 times to 5 times. The initial frequency $FR_{IS}$ that is controlled during the initial frequency scaling period may have a value that is always less than the normal frequency $FR_{NM}$.

Figure 33:
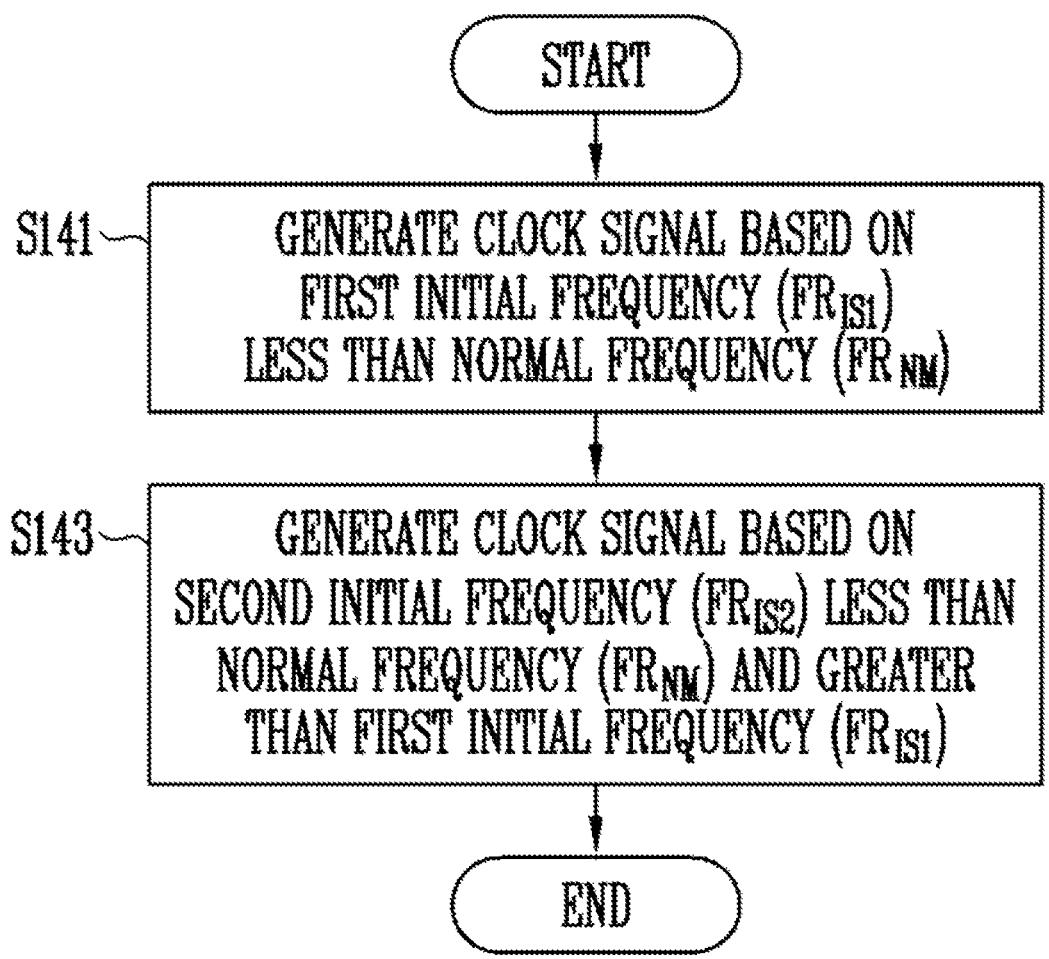
FIG. 33 is a flowchart illustrating step S140 of FIG. 27 in accordance with an embodiment of the present disclosure.

FIG. 33 is a flowchart illustrating step S140 of FIG. 27 according to an embodiment.

Referring to FIG. 33, step S140 of generating a clock signal needed to perform an operation based on the initial frequency $FR_{IS}$ illustrated in FIG. 27 may include step S141 of generating a clock signal based on a first initial frequency $FR_{IS1}$ less than the normal frequency $FR_{NM}$, and the step S143 of generating a clock signal based on a second initial frequency $FR_{IS2}$ less than the normal frequency $FR_{NM}$ and greater than the first initial frequency $FR_{IS1}$.

Referring to FIGS. 27B, 30A, 30B, and 32, the initial frequency scaling period may be set to a single period. However, in a method of operating the memory controller in accordance with an embodiment of the present disclosure, the initial frequency scaling period may include two or more periods. Hereinafter, the embodiment of FIG. 33 will be described with reference to FIG. 34 together.

Figure 34:
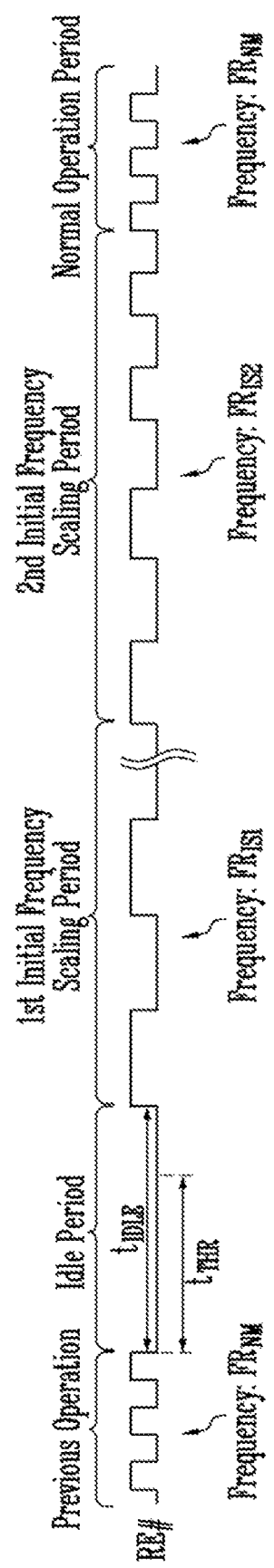
FIG. 34 is a timing diagram for describing the embodiment illustrated in FIG. 33.

FIG. 34 is a timing diagram for describing the process illustrated in FIG. 33 according to an embodiment.

FIG. 34 shows a read enable signal RE # that is generated in the case where the idle time $t_{IDLE}$ is greater than the threshold time $t_{THR}$ as a result of the determination at step S130 of FIG. 27. The read enable signal RE # that has swung based on the normal frequency $FR_{NM}$ during a previous operation period may not swing during an idle period. Since the idle time $t_{IDLE}$ in the idle period is greater than the threshold time $t_{THR}$, the idle period ends and an initial operation period, i.e., an initial frequency scaling period, starts. During an initial frequency scaling period including a first initial frequency scaling period and a second initial frequency scaling period, the read enable signal RE # may be generated based on scaled first and second initial frequencies $FR_{IS1}$ and $FR_{IS2}$ at step S140 of FIG. 27. During the first initial frequency scaling period, the second initial frequency scaling period, and a normal operation period, a data transfer operation may be performed between a memory device and a memory controller. In more detail, since a clock signal illustrated in FIG. 34 is a read enable signal RE #, read data may be transmitted from the memory device to the memory controller during the first initial frequency scaling period, the second initial frequency scaling period, and the normal operation period.

In an embodiment illustrated in FIG. 34, the initial frequency scaling period may include a first initial frequency scaling period and a second initial frequency scaling period. During the first initial frequency scaling period, a read enable signal RE # may be generated based on the first initial frequency $FR_{IS1}$ at step S141. The first initial frequency $FR_{IS1}$ may be a value less than the normal frequency $FR_{NM}$. During the second initial frequency scaling period, a read enable signal RE # may be generated based on the second initial frequency $FR_{IS2}$ at step S143. The second initial frequency $FR_{IS2}$ may have a value less than the normal frequency $FR_{NM}$ and greater than the first initial frequency $FR_{IS1}$.

In an embodiment, the first initial frequency $FR_{IS1}$ may have a constant value. In this case, during the first initial frequency scaling period, the read enable signal RE # may be generated based on a constant frequency less than the normal frequency $FR_{NM}$. However, embodiments of the present disclosure are not limited thereto. For example, the first initial frequency $FR_{IS1}$ may have a value that is gradually increased during the first initial frequency scaling period.

In an embodiment, the second initial frequency $FR_{IS2}$ may have a value that is gradually increased during the second initial frequency scaling period. In this case, the read enable signal RE # based on the second initial frequency $FR_{IS2}$ may be generated in the same manner as described with reference to FIGS. 29 to 32. However, embodiments of the present disclosure are not limited thereto. For example, the second initial frequency $FR_{IS2}$ may have a constant value during the second initial frequency scaling period.

If the initial operation period including the first and second initial frequency scaling periods is terminated, the normal operation period may start. During the normal operation period, the read enable signal RE # may be generated based on the normal frequency $FR_{NM}$ at step S150 of FIG. 27.

As illustrated in FIGS. 33 and 34, when the memory device 100 starts an operation, the memory controller 200 in accordance with an embodiment of the present disclosure may control the initial frequency of a clock signal output based on the idle time $t_{IDLE}$ of the memory device 100. In the memory controller 200 in accordance with an embodiment of the present disclosure, if the idle time $t_{IDLE}$ of the memory device 100 exceeds the threshold time $t_{THR}$, a clock signal to be output to the memory device 100 may be generated based on the first and second initial frequencies $FR_{IS1}$ and $FR_{IS2}$ that are less than the normal frequency $FR_{NM}$ during the first and second initial frequency scaling periods. If the initial frequency scaling period has passed and the process enters a normal operation period, the memory controller 200 may generate a clock signal to be output to the memory devices 100 based on the normal frequency $FR_{NM}$. Therefore, if the plurality of memory devices 100_1 to 100_8 start operations substantially at the same time, the entire current consumption of the storage device 50 may be prevented from rapidly increasing by reducing the initial operation frequency.

Figure 35:
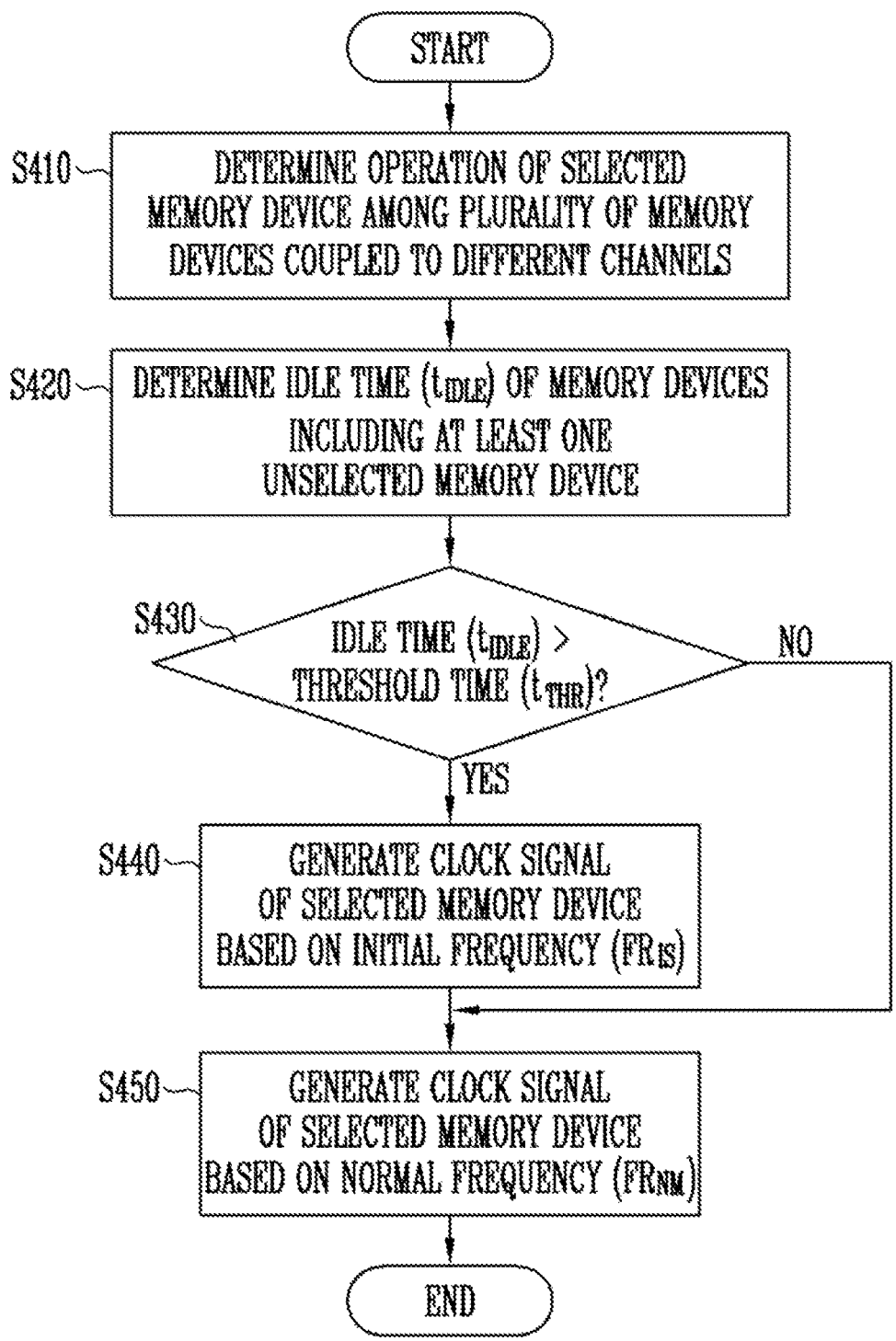
FIG. 35 is a flowchart illustrating a method of operating a memory controller in accordance with an embodiment of the present disclosure.
Figure 36:
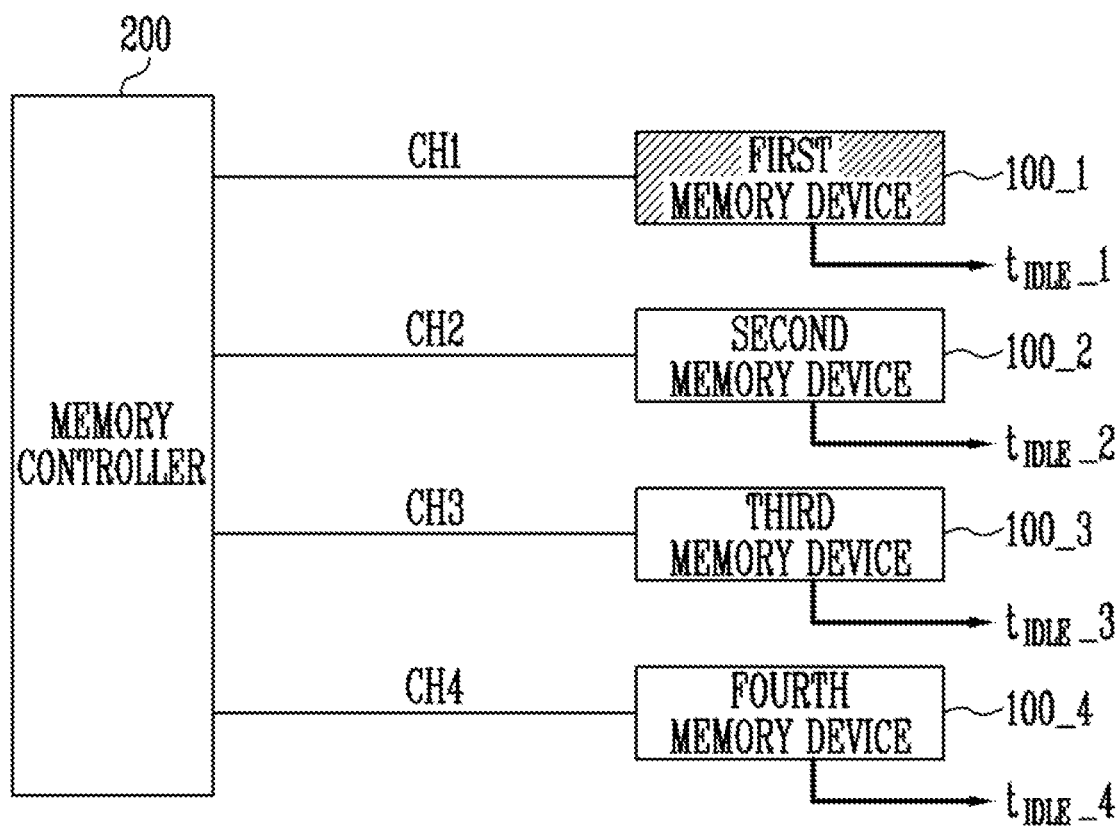
FIG. 36 is a diagram for describing a method of determining an idle time according to steps S410 and S420 of FIG. 35 in accordance with an embodiment of the present disclosure.

FIG. 35 is a flowchart illustrating a method of operating a memory controller in accordance with an embodiment of the present disclosure. FIG. 36 is a diagram for describing a method of determining an idle time at steps S410 and S420 of FIG. 35 according to an embodiment. Referring to FIGS. 35 and 36 together, a frequency scaling operation may be performed based on an idle time of one or more memory devices other than a memory device that starts an operation. Hereinafter, description will be made with reference to FIGS. 35 and 36 together.

Referring to FIGS. 35 and 36, at step S410, an operation of a memory device selected from among a plurality of memory devices 100_1 to 100_4 coupled to respective different channels CH1 to CH4 may be determined. Here, the selected memory device may be idle. Referring to FIG. 36, there is illustrated an example in which, at step S410, the first memory device 100_1 of the first to fourth memory devices 100_1 to 100_4 is the selected memory device. In FIG. 36, idle times of the first to fourth memory devices 100_1 to 100_4 are illustrated as being respectively first to fourth idle times $t_{IDLE\_1}$ to $t_{IDLE\_4}$. According to the embodiment illustrated in FIGS. 27 to 28B, the idle time $t_{IDLE}$ at step S120 of FIG. 27 may be determined to be the first idle time $t_{IDLE\_1}$ of the first memory device 100_1 that is the selected memory device. According to the embodiment of FIGS. 35 and 36, the idle time $t_{IDLE}$ may be determined based on an idle time of the unselected memory devices rather than the selected memory device. Since the selected memory device 100_1 has been idle, the first idle time $t_{IDLE\_1}$ may have a value other than 0. If any one memory device of the second to fourth memory devices 100_2 to 100_4 is in operation, the idle time of the operating memory device may be determined to be 0.

At step S420, an idle time (or an idle time interval) $t_{IDLE}$ of memory devices including at least one unselected memory device among the plurality of memory devices may be determined. The unselected memory device may be a memory device other than the selected memory device. In FIG. 36, the at least one unselected memory device may include second to fourth memory devices 100_2 to 100_4. At step S420, an idle time $t_{IDLE}$ of memory devices including at least one memory device among the second to fourth memory devices 100_2 to 100_4 may be determined.

In an embodiment, the idle time $t_{IDLE}$ at step S420 may be determined to be any one idle time among the second to fourth idle times $t_{IDLE\_2}$ to $t_{IDLE\_4}$.

In an embodiment, the idle time $t_{IDLE}$ at step S420 may be determined to be the sum of two idle times among the first to fourth idle times $t_{IDLE\_1}$ to $t_{IDLE\_4}$.

In an embodiment, the idle time $t_{IDLE}$ at step S420 may be determined to be the sum of three idle times among the first to fourth idle times $t_{IDLE\_1}$ to $t_{IDLE\_4}$.

In an embodiment, the idle time $t_{IDLE}$ at step S420 may be determined to be the sum of all of the first to fourth idle times $t_{IDLE\_1}$ to $t_{IDLE\_4}$.

Figure 37:
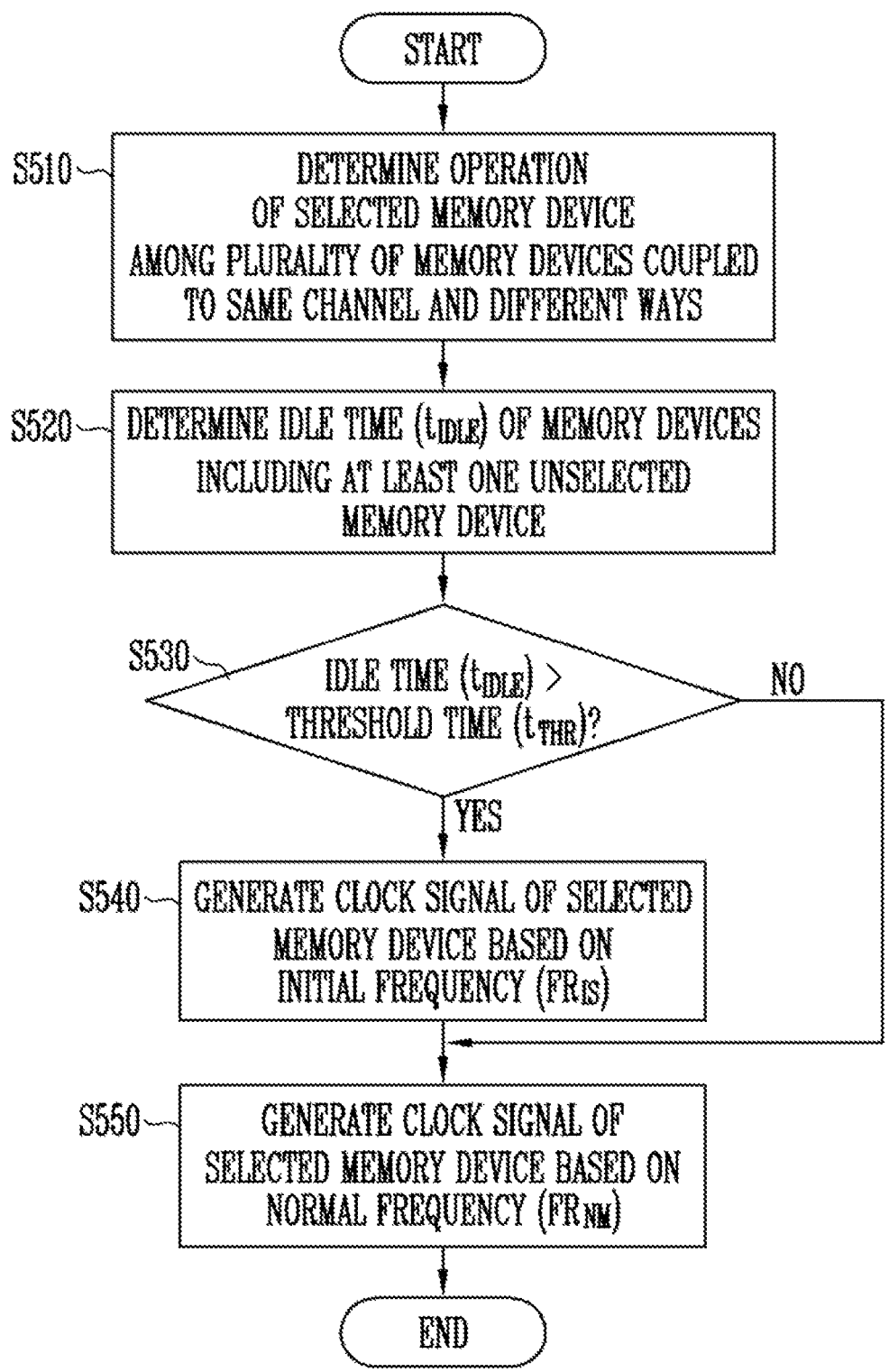
FIG. 37 is a flowchart illustrating a method of operating the memory controller in accordance with an embodiment of the present disclosure.
Figure 38:
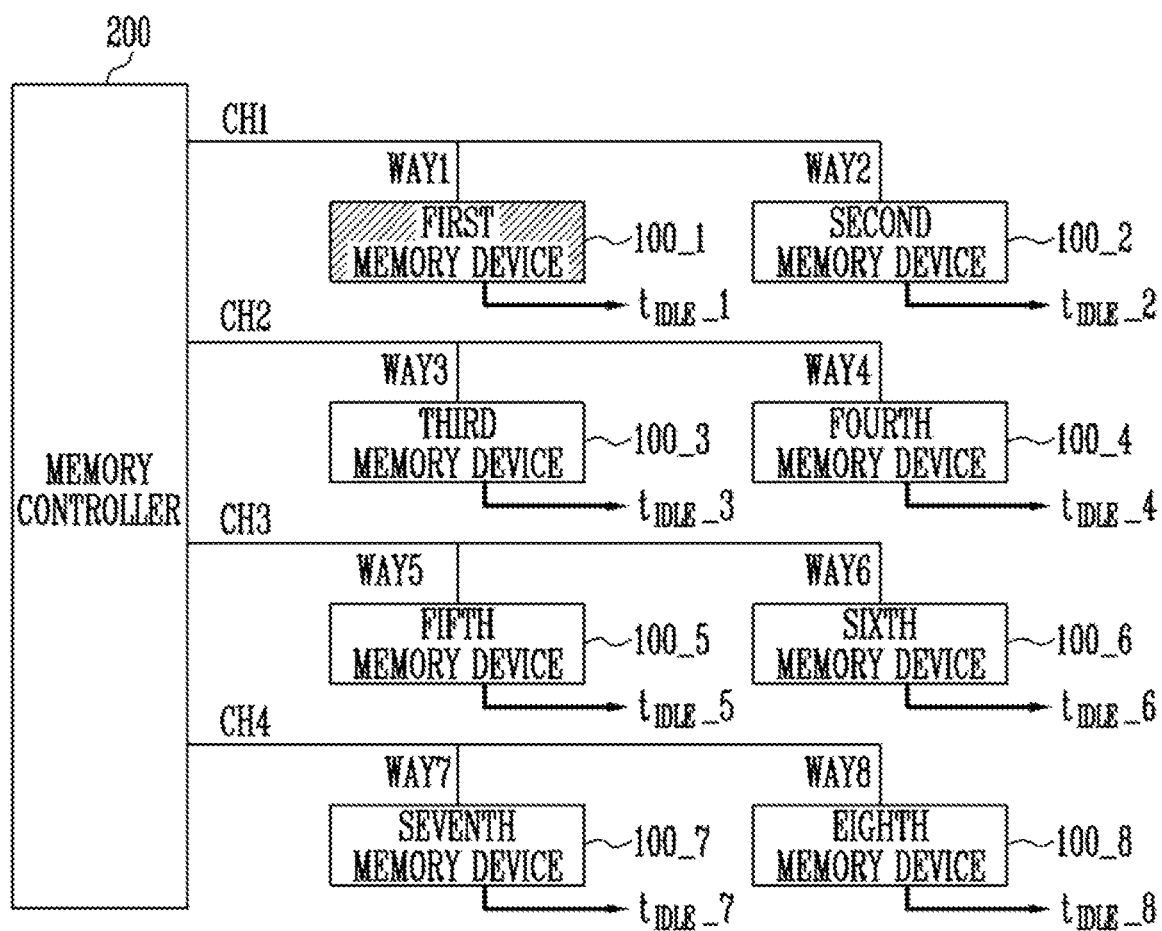
FIG. 38 is a diagram for describing a method of determining an idle time according to steps S510 and S520 of FIG. 37 in accordance with an embodiment of the present disclosure.

FIG. 37 is a flowchart illustrating a method of operating a memory controller in accordance with an embodiment of the present disclosure. FIG. 38 is a diagram for describing a method of determining an idle time at steps S510 and S520 of FIG. 37 according to an embodiment. Referring to FIGS. 37 and 38 together, a frequency scaling operation may be performed based on an idle time of memory devices other than a memory device that starts an operation. Hereinafter, description will be made with reference to FIGS. 37 and 38 together. FIG. 38 shows an example where two memory devices are coupled to each channel. In other embodiments, three or more memory devices may be coupled to each channel. In the embodiment shown in FIG. 38, the first memory device 100_1 is coupled to the first channel CH1 through a first way WAY1 and the second memory device 100_2 is coupled to the first channel CH1 through a second way WAY2. The first and second memory devices 100_1 and 100_2 may be coupled to the memory controller 200 through the first channel CH1. The third memory device 100_2 is coupled to the second channel CH2 through a third way WAY3, and the fourth memory device 100_4 is coupled to the second channel CH2 through a fourth way WAY4. Hence, the third and fourth memory devices 100_3 and 100_4 may be coupled to the memory controller 200 through the second channel CH2.

Referring to FIGS. 37 and 38, at step S510, an operation of a memory device selected from among the plurality of memory devices 100_1 to 100_8 coupled to the plurality of channels CH1 to CH4 and the respective different ways WAY1 to WAY8 may be determined. Here, the selected memory device may be idle. Referring to FIG. 38, there is illustrated an example in which, at step S510, the first memory device 100_1 of the first to eighth memory devices 100_1 to 100_8 is the selected memory device. In FIG. 38, idle times of the first to eighth memory devices 100_1 to 100_8 are illustrated as being respectively first to eighth idle times $t_{IDLE\_}1$ to $t_{IDLE\_}8$. According to the embodiment illustrated in FIGS. 27 to 28B, the idle time $t_{IDLE}$ at step S120 of FIG. 27 may be determined to be the first idle time $t_{IDLE\_}1$ of the first memory device 100_1 that is the selected memory device. According to the embodiment of FIGS. 37 and 38, the idle time $t_{IDLE}$ may be determined based on an idle time of an unselected memory device that is coupled to the same channel as that of the selected memory device and coupled to a way different from that of the selected memory device. Since the selected memory device 100_1 has been idle, the first idle time $t_{IDLE\_}1$ may have a value other than 0. If any one memory device of the second to eighth memory devices 100_2 to 100_8 is in operation, the idle time of the operating memory device may be determined to be 0.

At step S520, an idle time $t_{IDLE}$ of memory devices including at least one unselected memory device among the plurality of memory devices may be determined. In this case, the idle time $t_{IDLE}$ of memory devices including the unselected memory device that is coupled to the same channel as that of the selected memory device and to a way different from that of the selected memory device may be determined. In FIG. 38, the unselected memory device that is coupled to the same channel CH1 as that of the first memory device 100_1 and to a way WAY2 different from that WAY1 of the first memory device 100_1 may be the second memory device 100_2. At step S520, the idle time $t_{IDLE}$ of the memory devices including the second memory device 100_2 may be determined.

In an embodiment, the idle time $t_{IDLE}$ at step S520 may be determined to be the second idle time $t_{IDLE\_}2$.

In an embodiment, the idle time $t_{IDLE}$ at step S520 may be determined to be the sum of the first idle time $t_{IDLE\_}1$ and the second idle time $t_{IDLE\_}2$. In an embodiment, the idle time $t_{IDLE}$ at step S520 may be determined to be the sum of the second idle time $t_{IDLE\_}2$ and any one of the third to eighth idle times $t_{IDLE\_}3$ to $t_{IDLE\_}8$.

In an embodiment, the idle time $t_{IDLE}$ at step S520 may be determined to be the sum of the second idle time $t_{IDLE\_}2$ and any two of the first and the third to eighth idle times $t_{IDLE\_}1$ and $t_{IDLE\_}3$ to $t_{IDLE\_}8$.

In an embodiment, the idle time $t_{IDLE}$ at step S520 may be determined to be the sum of the second idle time $t_{IDLE\_}2$ and any three of the first and the third to eighth idle times $t_{IDLE\_}1$ and $t_{IDLE\_}3$ to $t_{IDLE\_}8$.

In an embodiment, the idle time $t_{IDLE}$ at step S520 may be determined to be the sum of the second idle time $t_{IDLE\_}2$ and any four of the first and the third to eighth idle times $t_{IDLE\_}1$ and $t_{IDLE\_}3$ to $t_{IDLE\_}8$.

In an embodiment, the idle time $t_{IDLE}$ at step S520 may be determined to be the sum of the second idle time $t_{IDLE\_}2$ and any five of the first and the third to eighth idle times $t_{IDLE\_}1$ and $t_{IDLE\_}3$ to $t_{IDLE\_}8$.

In an embodiment, the idle time $t_{IDLE}$ at step S520 may be determined to be the sum of the second idle time $t_{IDLE\_}2$ and any six of the first and the third to eighth idle times $t_{IDLE\_}1$ and $t_{IDLE\_}3$ to $t_{IDLE\_}8$.

In an embodiment, the idle time $t_{IDLE}$ at step S520 may be determined to be the sum of all of the first to eighth idle times $t_{IDLE\_}1$ to $t_{IDLE\_}8$.

Figure 39:
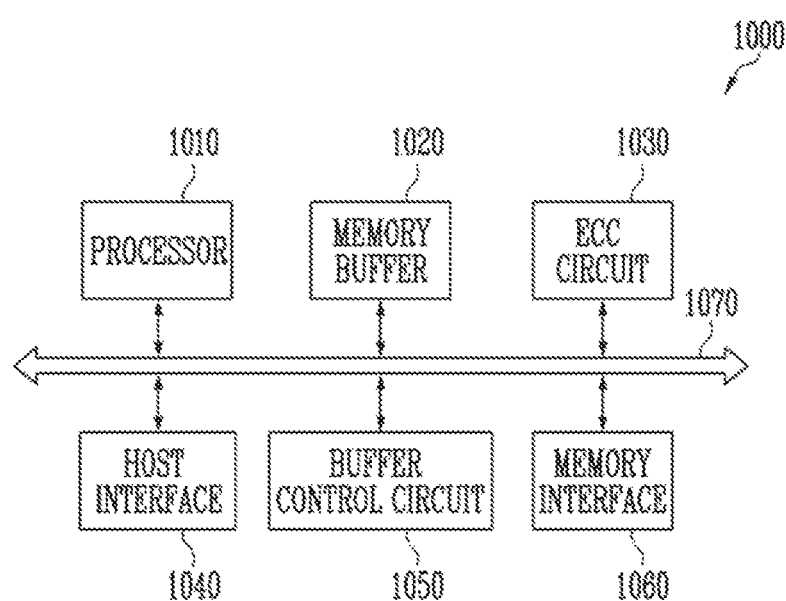
FIG. 39 is a diagram illustrating another embodiment of a memory controller, such as that shown in FIG. 1.

FIG. 39 is a diagram illustrating a memory controller suitable for use as the memory controller 200 shown in FIG. 1 according to an embodiment.

Referring to FIG. 39, a memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, and translate it into a PBA using a mapping table. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

In an embodiment, the processor 1010 may record a foggy program completion time by receiving a foggy program completion response corresponding to a foggy program command from the memory device (100 shown in FIG. 2), and output a fine program command to the memory device (100 shown in FIG. 2) according to whether a time elapsed from the foggy program completion time has exceeded a reference time.

Before the processor 1010 outputs the fine program command, the processor 1010 may output a dummy program command to the memory device (100 shown in FIG. 2) according to whether a page on which a fine program operation is performed is influenced by interference.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD) card, a Multi-Media Card (MMC), an embedded MMC (eMMC), a Dual In-line Memory Module (DIMM), a Registered DIMM (RDIMM), and/or a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

When the memory device included in the storage device (50 of FIG. 1) starts an operation, the processor 1010 may control an initial operation frequency based on the idle time of the corresponding memory device. In an embodiment, the processor 1010 may monitor the idle time of the memory device included in the storage device (50 of FIG. 1) and update the monitored idle time to the memory buffer 1020. When the memory device that has been idle starts the operation, the processor 1010 may determine the initial operation frequency based on the idle time stored in the memory buffer 1020. The memory interface 1060 may generate a clock signal to be transmitted to the memory device, based on the initial operation frequency determined by the processor 1010.

Therefore, the idle time monitor 260 of FIG. 25 may be implemented as the processor 1010 and the memory buffer 1020 of FIG. 39. The clock signal generator 270 of FIG. 25 may be implemented as the memory interface 1060 of FIG. 39.

In an example, the memory controller 1000 may not include the memory buffer 1020 and the buffer control circuit 1050. Either or both of these components may be provided separately, or either or both of their functions may be distributed among other components of the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may transmit data in the memory controller 1000, and the control bus may transmit control information such as a command and an address in the memory controller 1000. The data bus and the control bus are separated from each other, so that neither interferes with nor influences the other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 40:
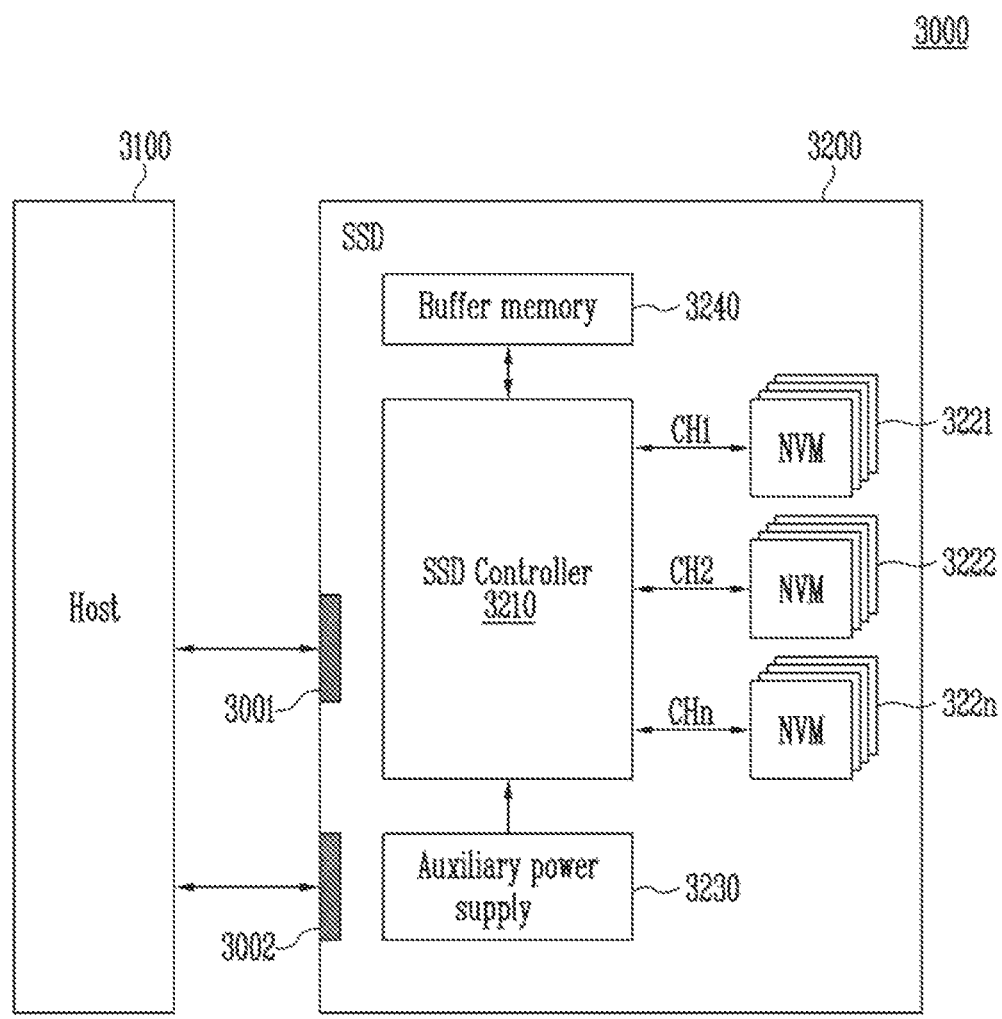
FIG. 40 is a block diagram illustrating a Solid State Drive (SSD) system to which the storage device is applied in accordance with an embodiment of the present disclosure.

FIG. 40 is a block diagram illustrating a Solid State Drive (SSD) system to which the storage device is applied in accordance with an embodiment of the present disclosure.

Referring to FIG. 40, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322$n$, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322$n$ in response to a signal SIG received from the host 3100. In an example, the signal SIG may be based on an interface between the host 3100 and the SSD 3200. For example, the signal SIG may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and/or an NVMe.

In an embodiment, when the plurality of flash memories 3221 to 322$n$ simultaneously start or end operations, the SSD controller 3210 may apply or interrupt a dummy pulse to or from first to nth channels CH1 to CHn through which the SSD controller 3210 is coupled to the plurality of flash memories 3221 to 322$n$.

In an embodiment, before the plurality of flash memories 3221 to 322$n$ simultaneously start operations, the SSD controller 3210 may sequentially apply a dummy pulse to the first to nth channels CH1 to CHn. After the dummy pulse is applied to the first to nth channels CH1 to CHn, the plurality of flash memories 3221 to 322n may simultaneously start the operations.

In addition, when the plurality of flash memories 3221 to 322n simultaneously end operations, the SSD controller 3210 may apply a dummy pulse to the first to nth channels CH1 to CHn after the plurality of flash memories 3221 to 322n end the operations, and sequentially interrupt the dummy pulses applied to the first to nth channels CH1 to CHn.

In an embodiment, when any one of the plurality of flash memories 3221 to 322n starts an operation, the SSD controller 3210 may control an initial frequency of an output clock signal based on an idle time $t_{IDLE}$ of the corresponding flash memory. In the case where the idle time $t_{IDLE}$ of the corresponding flash memory exceeds the threshold time $t_{THR}$, the SSD controller 3210 may generate a clock signal based on an initial frequency $FR_{IS}$ less than the normal frequency $FR_{NM}$ during an initial frequency scaling period. If the initial frequency scaling period has passed and the process enters a normal operation period, the SSD controller 3210 may generate a clock signal to be output to the corresponding flash memory based on the normal frequency $FR_{NM}$. Therefore, if the plurality of memory devices 3221 to 322n start operations at the same time, the entire current consumption of the SSD system 3000 may be prevented from rapidly increasing by reducing the initial operation frequency.

The auxiliary power supply 3230 is connected to the host 3100 through the power connector 3002. When the supply of power from the host 3100 is not smooth, the auxiliary power supply 3230 may provide power to the SSD 3200. In an example, the auxiliary power supply 3230 may be located in the SSD 3200, or be disposed externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include any of various types of volatile memories such as a DRAM, an SDRAM, a DDR SDRAM, an LPDDR SDRAM, and/or a GRAM or any of various types of nonvolatile memories such as a FRAM, a ReRAM, an STT-MRAM, and/or a PRAM.

Figure 41:
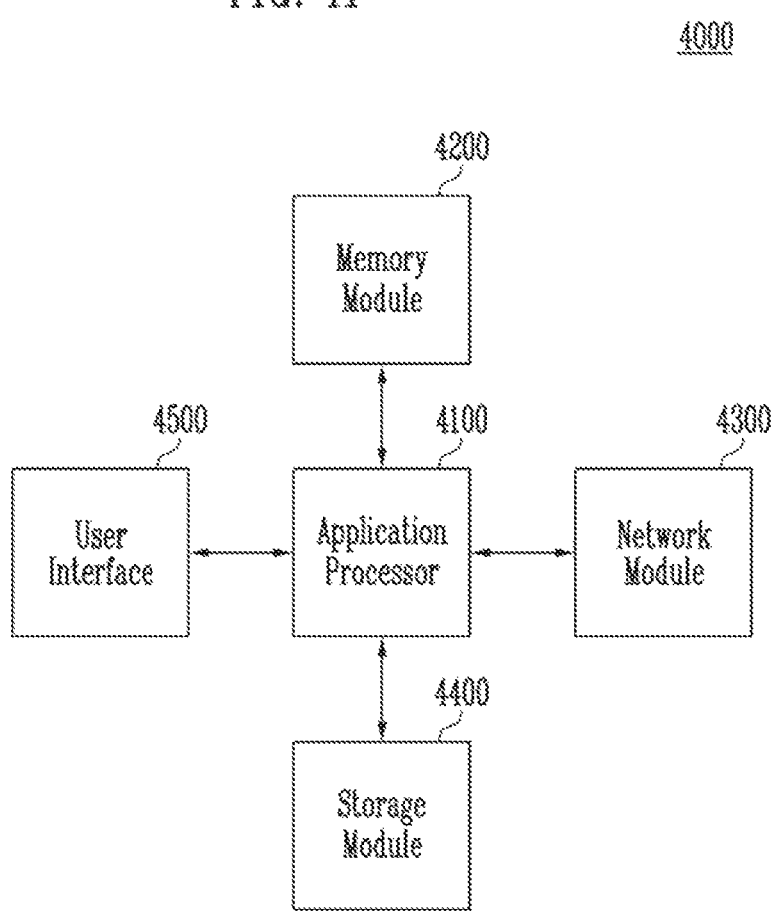
FIG. 41 is a block diagram illustrating a user system to which the storage device is applied in accordance with an embodiment of the present disclosure.

FIG. 41 is a block diagram illustrating a user system to which the storage device is applied in accordance with an embodiment of the present disclosure.

Referring to FIG. 41, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

In an embodiment, when a plurality of memory devices included in the storage module 4400 simultaneously start or end operations, the application processor 4100 may apply or interrupt a dummy pulse to or from channels through which the application processor 4400 is coupled, to the plurality of memory devices.

In an embodiment, before the plurality of memory devices included in the storage module 4400 simultaneously start operations, the application processor 4100 may sequentially apply a dummy pulse to the channels. After the dummy pulse is applied to all the channels, the plurality of memory devices in the storage module 4400 may simultaneously start the operations.

In addition, when the plurality of memory devices in the storage module 4400 simultaneously end operations, the application processor 4100 may apply a dummy pulse to the channels after the plurality of memory devices end the operations, and sequentially interrupt the dummy pulses applied to the channels.

In an embodiment, when any one of a plurality of memory devices included in the storage module 4400 starts an operation, the application processor 4100 may control an initial frequency of a clock signal to be output to a channel the application processor 4100 and the corresponding memory device, based on an idle time $t_{IDLE}$ of the corresponding memory device. In the case where the idle time $t_{IDLE}$ of the corresponding memory device exceeds the threshold time $t_{THR}$, the application processor 4100 may output a generated clock signal to the channel between the application processor 4100 and the corresponding memory device, based on an initial frequency $FR_{IS}$ less than the normal frequency $FR_{NM}$ during an initial frequency scaling period. If the initial frequency scaling period has passed and the process enters a normal operation period, the application processor 4100 may output a generated clock signal to the channel between the application processor 4100 and the corresponding memory device based on the normal frequency $FR_{NM}$. Therefore, if the plurality of memory devices included in the storage module 4400 start operations at the same time, the entire current consumption of the user system 4000 may be prevented from rapidly increasing by reducing the initial operation frequency.

The memory module 4200 may operate as a main memory, working memory, buffer memory or cache memory of the user system 4000. The memory module 4200 may include any of various types of volatile random access memories such as a DRAM, an SDRAM, a DDR SDRAM, a DDR2 SDRAM, a DDR3 SDRAM, an LPDDR SDRAM, an LPDDR2 SDRAM, and/or an LPDDR3 SDRAM or any of various types of nonvolatile random access memories such as a PRAM, a ReRAM, an MRAM, and/or a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, each of which may operate the same as the memory device described with reference to FIGS. 3 and 4. The storage module 4400 may operate the same as the storage device 50 described with reference to FIG. 2.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a number of channels coupled to memory devices to start operations is determined based on a request received from the host, total current is sequentially increased based on the determined number of channels, a number of channels coupled to memory devices to end operations is determined based on a chip enable signal and a command queue, and current may be sequentially decreased based on the determined number of channels.

Figure 42:
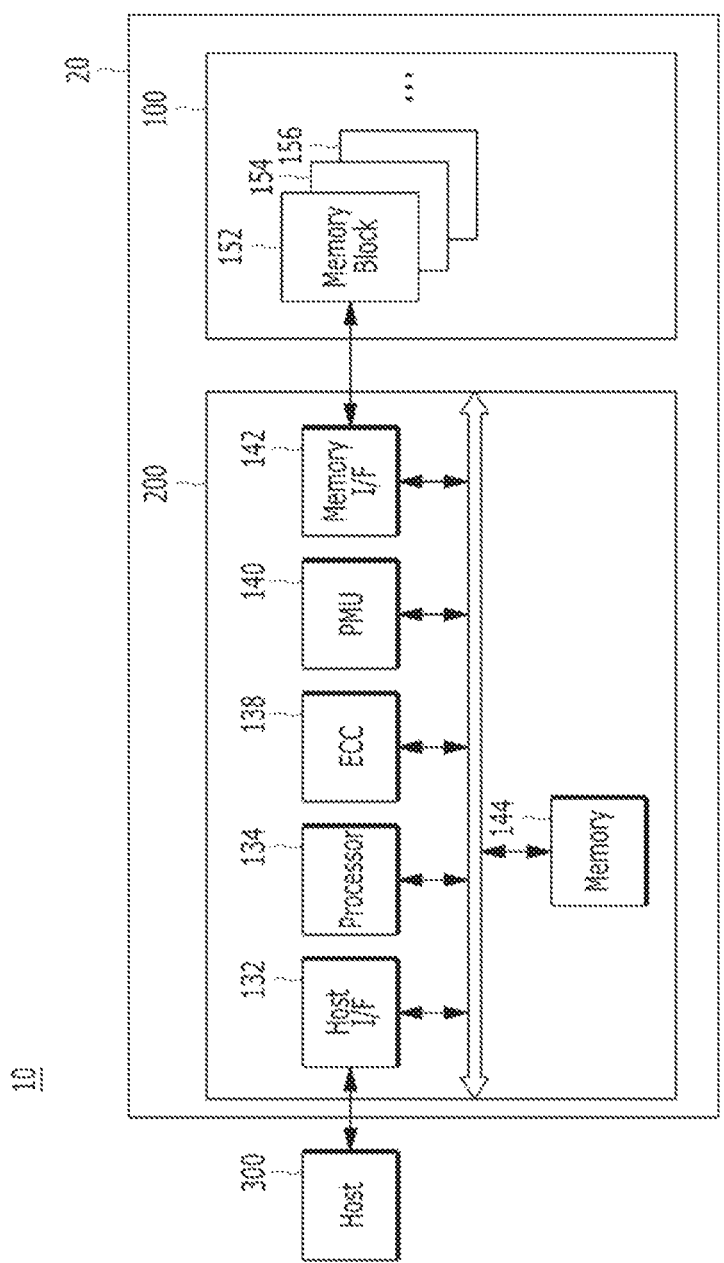
FIG. 42 is a block diagram illustrating a data processing system including a memory system in accordance with an embodiment of the present disclosure.

FIG. 42 is a block diagram illustrating a data processing system 10 including a memory system 20 in accordance with an embodiment of the present disclosure.

Referring to FIG. 42, the data processing system 10 may include a host 300 operably coupled with a memory system 20. In an embodiment, the host 300, a controller 200, and a memory device 100 shown in FIG. 42 may be suitable for use as the host 300, the memory controller 200, and the memory device 100 shown in FIG. 1, respectively.

The host 300 may include any of a variety of portable electronic devices, such as a mobile phone, an MP3 player, and a laptop computer, or an electronic device such as a desktop computer, a game player, a television (TV), a projector, and the like.

The host 300 also includes at least one operating system (OS), which can generally manage, and control functions and operations performed in the host 300. The OS may provide interoperability between the host 300 coupled with the memory system 20 and the user of the memory system 20. The OS may support functions and operations corresponding to user's requests. By way of example but not limitation, the OS may include a general operating system and a mobile operating system according to mobility of the host 300. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux, and Unix. Further, the mobile operating system may include an Android and iOS. The mobile operating system may be subject to support services or functions for mobility (e.g., a power saving function). The host 300 may include a plurality of operating systems. The host 300 may execute multiple operating systems in cooperation with the memory system 20, corresponding to a user's request. The host 300 may transmit a plurality of commands corresponding to the user's requests to the memory system 20, thereby performing operations corresponding to commands within the memory system 20. Handling plural commands in the memory system 20 will be described below with reference to FIGS. 45 and 46.

The memory system 20 may perform a specific function or operation in response to a request from the host 300 and, particularly, may store data to be accessed by the host 300. The memory system 20 may be used as a main memory system or an auxiliary memory system of the host 300. The memory system 20 may be implemented with any one of various types of storage devices, which may be electrically coupled with the host 300, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, and a memory stick.

The storage devices for the memory system 20 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), or a flash memory.

The memory system 20 may include a controller (or a memory controller) 200 and a memory device 100. The memory device 100 may store data to be accessed by the host 300. The controller 200 may control storage of data in the memory device 100.

The controller 200 and the memory device 100 may be integrated into a single semiconductor device, which may be included in any of the various types of memory systems as described above.

By way of example but not limitation, the controller 200 and the memory device 100 may be integrated into a single semiconductor device. The controller 200 and memory device 100 may be integrated to form an SSD with improved operation speed. When the memory system 20 is used as an SSD, the operating speed of a host 300 connected to the memory system 20 can be faster than that of a host 300 connected with a hard disk. In another embodiment, the controller 200 and the memory device 100 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 20 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 100 may be a nonvolatile memory device and may retain data stored therein even while electrical power is not supplied. The memory device 100 may store data provided from the host 300 through a write operation, while providing data stored therein to the host 300 through a read operation. The memory device 100 may include a plurality of memory blocks 152, 154, and 156, each of which may include a plurality of pages. Each of the plurality of pages may include a plurality of memory cells to which a plurality of word lines (WL) are electrically coupled. The memory device 100 also includes a plurality of memory dies, each of which includes a plurality of planes, each of which includes memory blocks, among the plurality of memory blocks 152, 154, and 156. In addition, the memory device 100 may be a non-volatile memory device, for example a flash memory, and the flash memory may have a three-dimensional stack structure.

The controller 200 may control overall operations of the memory device 100, such as read, write, program and erase operations. For example, the controller 200 may control the memory device 100 in response to a request from the host 300. The controller 200 may provide data read from the memory device 100 to the host 300. The controller 200 may store data provided by the host 300 in the memory device 100.

The controller 200 may include a host interface (I/F) 132, a processor 134, error correction code (ECC) unit 138, a power management unit (PMU) 140, a memory interface (I/F) 142, and a memory 144, all operatively coupled via an internal bus.

The host interface 132 may process commands and data provided from the host 300, and may communicate with the host 300 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 300, which may be implemented through firmware called a host interface layer (HIL).

The ECC unit 138 may correct error bits of the data to be processed in (e.g., outputted from) the memory device 100, which may include an ECC encoder and an ECC decoder. Here, the ECC encoder may perform error correction encoding of data to be programmed in the memory device 100 to generate encoded data into which a parity bit is added and store the encoded data in memory device 100. The ECC decoder may detect and correct errors contained in data read from the memory device 100 when the controller 200 reads the data stored in the memory device 100. In other words, after performing error correction decoding on the data read from the memory device 100, the ECC unit 138 may determine whether the error correction decoding has succeeded and output an instruction signal (e.g., a correction success signal or a correction fail signal). The ECC unit 138 may use the parity bit which is generated during the ECC encoding process, for correcting the error bit of the read data. When the number of error bits is greater than or equal to a threshold number of correctable error bits, the ECC unit 138 may not correct error bits but instead may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC unit 138 may include any and all circuits, modules, systems or devices for performing the error correction operation based on at least one of the above described codes.

The PMU 140 may manage electrical power in the controller 200. For example, the PMU 140 may detect power-on and power-off. In addition, the PMU 140 may include a power detector.

The memory interface 142 may serve as an interface for handling commands and data transferred between the controller 200 and the memory device 100, to allow the controller 200 to control the memory device 100 in response to a request delivered from the host 300. The memory interface 142 may generate a control signal for the memory device 100 and may process data entered into or outputted from the memory device 100 under the control of the processor 134 in a case when the memory device 100 is a flash memory and, in particular, when the memory device 100 is a NAND flash memory. The memory interface 142 may provide an interface for handling commands and data between the controller 200 and the memory device 100, for example, to perform operations of NAND flash interface, in particular, operations between the controller 200 and the memory device 100. In accordance with an embodiment, the memory interface 142 may be implemented through firmware called a flash interface layer (FIL) as a component for exchanging data with the memory device 100.

The memory 144 may support operations performed by the memory system 20 and the controller 200. The memory 144 may store temporary or transactional data generated or delivered for operations in the memory system 20 and the controller 200. The controller 200 may control the memory device 100 in response to a request from the host 300. The controller 200 may deliver data read from the memory device 100 into the host 300. The controller 200 may store data entered through the host 300 within the memory device 100. The memory 144 may store data used by the controller 200 and the memory device 100 to perform operations such as read operations or program/write operations.

The memory 144 may be a volatile memory. The memory 144 may be implemented with a static random access memory (SRAM), a dynamic random access memory (DRAM), or both. Although FIG. 42 shows the memory 144 disposed within the controller 200, embodiments are not limited to that arrangement. That is, the memory 144 may be within or external to the controller 200. For instance, the memory 144 may be an external volatile memory having a memory interface transferring data and/or signals between the memory 144 and the controller 200.

The memory 144 may store data for performing operations such as data writing and data reading requested by the host 300 and/or data transfer between the memory device 100 and the controller 200 for background operations such as garbage collection and wear levelling. In accordance with an embodiment, for supporting operations in the memory system 20, the memory 144 may include a program memory, a data memory, a write buffer/cache, a read buffer/cache, a data buffer/cache, and a map buffer/cache.

The processor 134 may be a microprocessor or a central processing unit (CPU). The memory system 20 may include one or more processors 134. The processor 134 may control the overall operations of the memory system 20. By way of example but not limitation, the processor 134 can control a program operation or a read operation of the memory device 100, in response to a write request or a read request entered from the host 300. In accordance with an embodiment, the processor 134 may use or execute firmware to control the overall operations of the memory system 20. Herein, the firmware may be a flash translation layer (FTL). The FTL may serve as an interface between the host 300 and the memory device 100. The host 300 may transmit requests for write and read operations to the memory device 100 through the FTL.

The FTL may manage operations of address mapping, garbage collection, wear-leveling and so forth. Particularly, the FTL may load, generate, update, or store map data. Therefore, the controller 200 may map a logical address, which is entered from the host 300, with a physical address of the memory device 100 through the map data. The memory device 100 may function as a general storage device to perform a read or write operation. Also, through the address mapping operation based on the map data, when the controller 200 tries to update data stored in a particular page, the controller 200 may program the updated data on another empty page and may invalidate old data of the particular page (e.g., update a physical address, corresponding to a logical address of the updated data, from the particular page to the newly programed page) due to a characteristic of a flash memory device. Further, the controller 200 may store map data of the new data into the FTL.

For example, when performing an operation requested from the host 300 in the memory device 100, the controller 200 uses the processor 134. The processor 134 engaged with the memory device 100 may handle instructions or commands corresponding to an inputted command from the host 300. The controller 200 may perform a foreground operation as a command operation, corresponding to a command from the host 300, such as a program operation corresponding to a write command, a read operation corresponding to a read command, an erase/discard operation corresponding to an erase/discard command, and a parameter set operation corresponding to a set parameter command or a set feature command with a set command.

The controller 200 may perform a background operation on the memory device 100 through the processor 134. By way of example but not limitation, the background operation for the memory device 100 includes copying data in a memory block, among the memory blocks 152, 154, and 156, and storing such data in another memory block, for example, a garbage collection (GC) operation. The background operation may include an operation to move data stored in at least one of the memory blocks 152, 154, and 156 in the memory device 100, into at least another of the memory blocks 152, 154, and 156, for example, a wear leveling (WL) operation. During a background operation, the controller 200 may use the processor 134 for storing the map data stored in the controller 200 to at least one of the memory blocks 152, 154, and 156, for example, a map flush operation. A bad block management operation of checking for bad blocks among the plurality of memory blocks 152, 154, and 156 is another example of a background operation performed by the processor 134.

In the memory system 20, the controller 200 performs a plurality of command operations corresponding to a plurality of commands received from the host 300. For example, when performing a plurality of program operations corresponding to plural program commands, a plurality of read operations corresponding to plural read commands, and a plurality of erase operations corresponding to plural erase commands sequentially, randomly, or alternatively, the controller 200 may determine which channel(s) or way(s) for connecting the controller 200 to which memory die(s) in the memory device 100 is/are proper or appropriate for performing each operation. The controller 200 may transmit data or instructions via the channel(s) or way(s) for performing each operation. The plurality of memory dies may transmit an operation result via the same channel(s) or way(s), respectively, after each operation is complete. Then, the controller 200 may transmit a response or an acknowledge signal to the host 300. In an embodiment, the controller 200 may check a status of each channel or each way. In response to a command received from the host 300, the controller 200 may select at least one channel or way based on the status of each channel or each way so that instructions and/or operation results with data may be delivered via selected channel(s) or way(s).

The controller 200 may check the states of a plurality of channels (or ways) coupled to a plurality of memory dies that are included in the memory device 100.

By way of example but not limitation, the controller 200 may recognize statuses regarding channels (or ways) associated with memory dies in the memory device 100. The controller 200 may determine each channel or each way as being in a busy state, a ready state, an active state, an idle state, a normal state, or an abnormal state. The controller's determination of which channel or way an instruction (and/or data) is delivered through can be based on a physical block address, e.g., to which die(s) the instruction (and/or the data) is delivered. The controller 200 may refer to descriptors delivered from the memory device 100. The descriptors may include a block or page of parameters that describe characteristics of the memory device 100, and may have a set format or structure. The descriptors may include device descriptors, configuration descriptors, unit descriptors, and the like. The controller 200 can refer to, or use, the descriptors to determine with which channel(s) or way(s) an instruction or a data is exchanged.

A management unit (not shown) may be included in the processor 134. The management unit may perform bad block management of the memory device 100. The management unit may find bad memory blocks, which are in unsatisfactory condition for further use, as well as perform bad block management on the bad memory blocks. When the memory device 100 is a flash memory such as a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may substantially reduce the utilization efficiency of the memory device 100 having a 3D stack structure and the reliability of the memory system 20. Thus, reliable bad block management may enhance or improve performance of the memory system 20.

Figure 43:
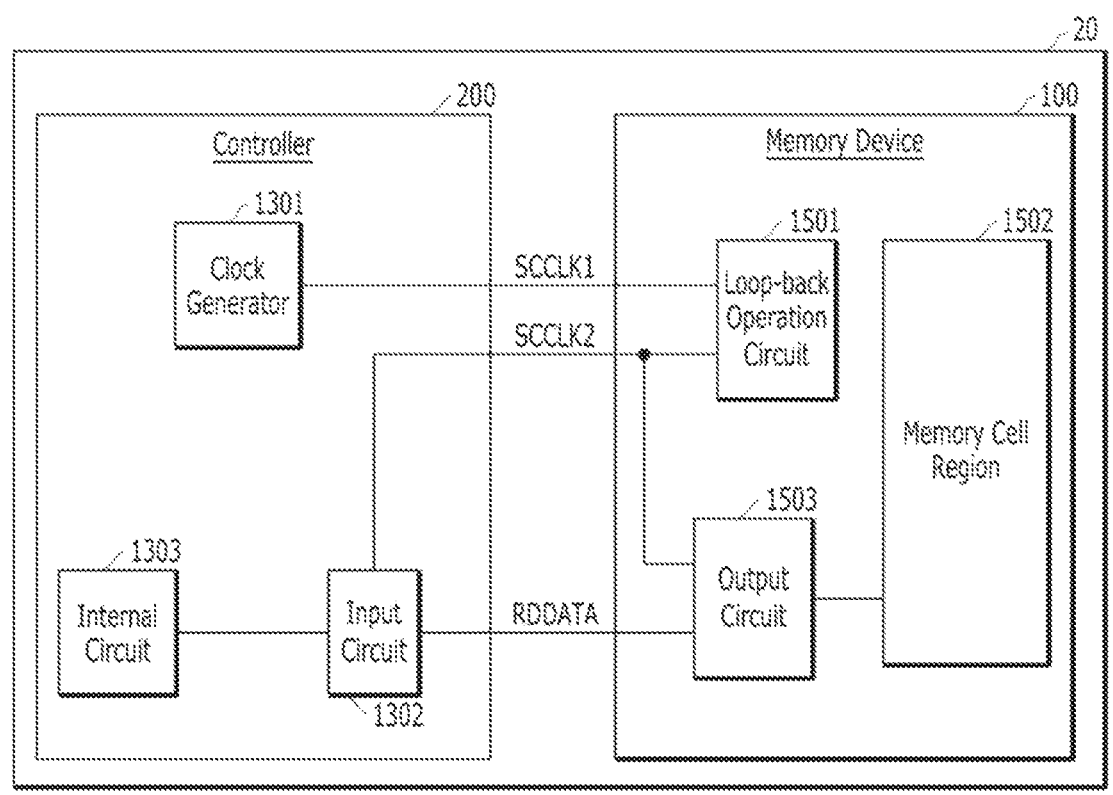
FIG. 43 is a block diagram illustrating an operation of a memory system in accordance with an embodiment of the present disclosure.

FIG. 43 is a block diagram illustrating an operation of a memory system 20 in accordance with an embodiment of the present disclosure.

Referring to FIG. 43, the memory system 20 may include a controller 200 and a memory device 100. The controller 200 may include a clock generator 1301, an input circuit 1302, and an internal circuit 1303. The memory device 100 may include a loop-back operation circuit 1501, a memory cell region 1502, and an output circuit 1503. The clock generator 1301 and the input circuit 1302 that are included in the controller 200 may be constituent elements corresponding to the memory interface unit 142 described as the constituent elements included in the controller 200 shown in FIG. 42. Also, the internal circuit 1303 included in the controller 200 may be a constituent element corresponding to one or more of the host interface unit 132, the processor 134, the error correction code (ECC) unit 138, the power management unit (PMU) 140, and the memory 144, which are described as the constituent elements included in the controller 200 in FIG. 42. The memory cell region 1502 included in the memory device 100 may be a constituent element corresponding to the memory blocks 152, 154, and 156 that are described in FIG. 42 to be included in the memory device 150. Also, it is illustrated in the drawing that one memory device 100 is included in the memory system 20. This is merely an example, and the memory system 20 may also include more than one memory devices.

To be specific, the memory device 100 may include a memory cell region 1502 for storing data, and the memory device 100 may loop back an external first source clock SCCLK1 to output a second source clock SCCLK2. Herein, the memory device 100 may synchronize read data RDDATA, which is read from the memory cell region 1502, with the second source clock SCCLK2 and output the resultant read data.

To be more specific, the memory device 100 may read the read data RDDATA from the memory cell region 1502 in response to a read command (not shown) inputted from the controller 130. Also, the memory device 100 may synchronize the read data RDDATA with the second source clock SCCLK2 which is obtained by looping back the first source clock SCCLK1 inputted from the controller 200 and output the synchronized read data. In other words, the loop-back operation circuit 1501 included in the memory device 100 may output the second source clock SCCLK2, which is obtained by looping back the first source clock SCCLK1 inputted from the controller 200, to the controller 200. Also, the output circuit 1503 included in the memory device 100 may output the read data RDDATA that is read from the memory cell region 1502 to the controller 200 in synchronization with the second source clock SCCLK2.

Herein, loop-back may refer to routing an input signal, digital data streams, or flows of items without intentional processing or modification.

The controller 200 may generate the first source clock SCCLK1, output the first source clock SCCLK1 to the memory device 100, and then receive the read data RDDATA which is transferred from the memory device 100 in response to the second source clock SCCLK2 which is transferred from the memory device 100.

To be more specific, the clock generator 1301 included in the controller 200 may generate the first source clock SCCLK1 and output the generated first source clock SCCLK1 to the memory device 150. The input circuit 1302 included in the controller 200 may receive the read data RDDATA which is transferred from the memory device 100 in response to the second source clock SCCLK2 which is transferred from the memory device 100. The internal circuit 1303 included in the controller 200 may use the read data RDDATA inputted through the input circuit 1302 according to a predetermined purpose. For example, the internal circuit 1303 may perform an operation of outputting the read data RDDATA to the host 300 in FIG. 42 in response to the host interface unit 132 in FIG. 42 and the processor 134 in FIG. 42.

Meanwhile, the size of the read data RDDATA requested by the controller 200 to the memory device 100 through one read command may have a predetermined size. For example, the predetermined size for the read data RDDATA may be approximately 2 KB. Herein, the predetermined size for the read data RDDATA may vary depending on the type of the memory device 100 or the selection of a designer.

Also, in order for the controller 200 to request the memory device 100 for data having a larger or smaller size than the predetermined size for the read data RDDATA, an additional operation may be required as shown in the following example.

For example, when the predetermined size for the read data RDDATA is approximately 2 KB and data of a size of approximately 10 KB which is larger than the predetermined size are to be read from the memory device 100, the controller 200 may transfer five read commands to the memory device 100 and then receive five read data RDDA-TAs each having a size of approximately 2 KB from the memory device 100.

Also, when the predetermined size for the read data RDDATA is approximately 2 KB and data of a size of approximately 512 bytes, which is smaller than the predetermined size, is to be read from the memory device 100, selection information for selecting data of approximately 512 bytes from the read data RDDATA of 2 KB corresponding to a single read command may be included in the single read command that is transferred to the memory device 100. In other words, the controller 200 may transfer the single read command including the selection information to the memory device 100 and then receive read data RDDATA of approximately 512 bytes from the memory device 100.

Meanwhile, when the read data RDDATA are read from the memory cell region 1502 included in the memory device 100, errors may occur in some bits. Also, the values of some bits may be lost or an error may occur while the read data RDDATA are outputted from the memory device 100 and transferred to the controller 200. As described above, some bits of the read data RDDATA transferred from the memory device 100 to the controller 200 may not be in a normal state, that is, errors may occur or the values of some bits may be lost. In this case, the controller 200 may control the memory device 100 to re-read the read data RDDATA from the memory cell region 1502 and output the read data RDDATA that are re-read.

Herein, since the read data RDDATA have a predetermined size, when it is determined that some abnormal bits are included in the read data RDDATA received from the memory device 100, the controller 200 may request the memory device 100 to read and transfer the read data RDDATA of the predetermined size again.

When the read data RDDATA are read back from the memory device 100 because some abnormal bits are included in the read data RDDATA, a portion of the read data RDDATA including the abnormal bits and having a given size smaller than a predetermined size can be read again and transferred to the controller 200. In this case, an operation of re-reading the portion of the read data RDDATA and transferring the portion of the read data RDDATA to the controller 200 may be more efficient than an operation of re-reading the entire read data RDDATA of the predetermined size and transferring the entire read data RDDATA to the controller 200. In order to efficiently perform the operation, the operation of selecting data of the given size including the abnormal bits from the read data RDDATA of the predetermined size and controlling the memory device 100 to read the selected data may be required. This may be realized through the following embodiments of the present invention.

Herein, when it is determined that some abnormal bits are included in the read data RDDATA received from the memory device 100, the controller 200 may include an error correction code unit (e.g., the ECC unit 138 in FIG. 42) and perform a recovery operation of recovering the read data RDDATA in an abnormal state into a normal state in the error correction code unit 138. For example, the ECC unit 138 may be included in the internal circuit 1303. However, the recovery operation of the error correction code unit 138 may require a relatively longer time than the repetitive read operation of re-reading the read data RDDATA from the memory device 100 and transferring the read data RDDATA to the controller 200. Therefore, when the read data RDDATA are still in the abnormal state even after the repetitive read operation of re-reading the read data RDDATA from the memory device 100 and transferring the read data RDDATA to the controller 200 is performed a predetermined number of times that is set by the designer, the recovery operation may be attempted through the error correction code unit 138.

Figure 44:
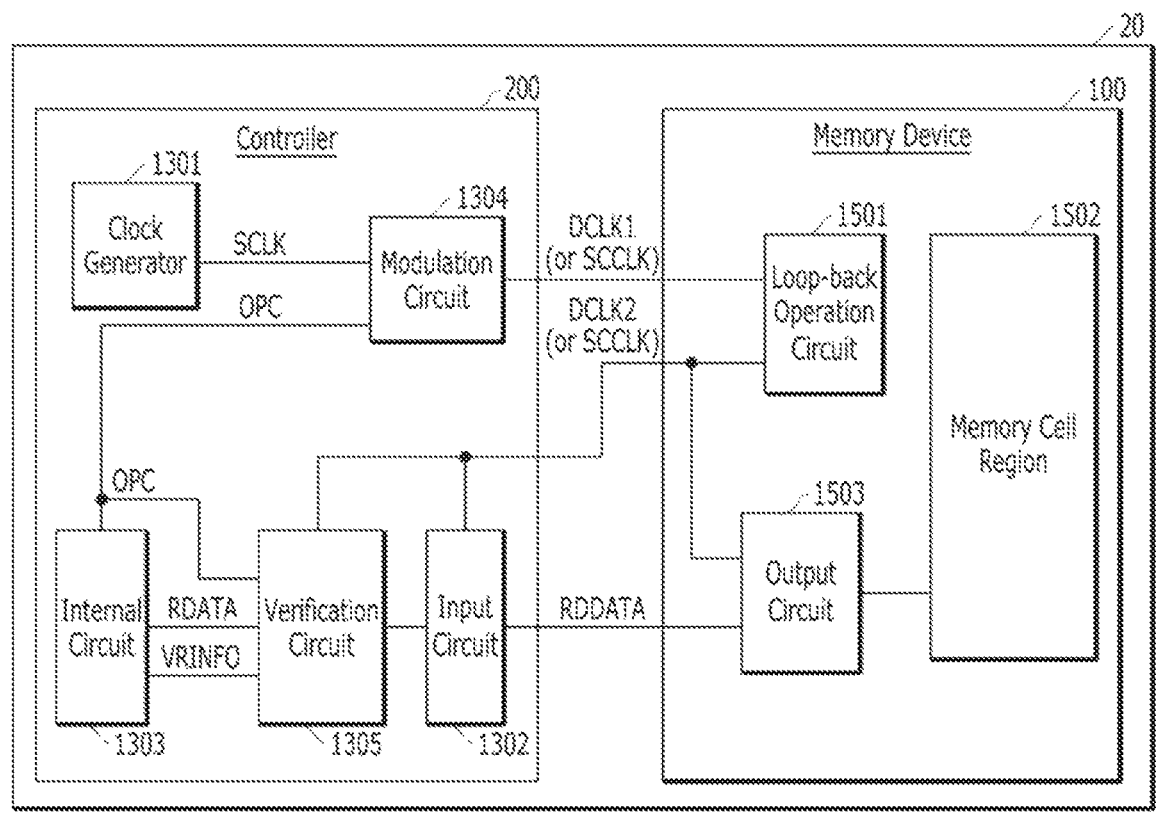
FIG. 44 is a block diagram illustrating an operation of a memory system in accordance with an embodiment of the present disclosure.

FIG. 44 is a block diagram illustrating an operation of a memory system 20 in accordance an embodiment of the present disclosure.

Referring to FIG. 44, the memory system 20 may include a controller 200 and a memory device 100. Herein, the controller 200 may include a clock generator 1301, an input circuit 1302, an internal circuit 1303, a modulation circuit 1304, and a verification circuit 1305. The memory device 100 may include a loop-back operation circuit 1501, a memory cell region 1502, and an output circuit 1503. Herein, the clock generator 1301, the input circuit 1302, the modulation circuit 1304, and the verification circuit 1305 included in the controller 200 may be constituent elements corresponding to the memory interface unit 142 that are described in FIG. 42 as the constituent elements included in the controller 200. Also, the internal circuit 1303 included in the controller 200 may be a constituent element corresponding to one or more of the host interface unit 132, the processor 134, the error correction code (ECC) unit 138, the power management unit (PMU) 140, and the memory 144 that are described in FIG. 42 as the constituent elements included in the controller 200. The memory cell region 1502 included in the memory device 100 may be a constituent element corresponding to a plurality of memory blocks 152, 154, and 156 that are described in FIG. 42 as the constituent elements included in the memory device 100. Also, it is described in the drawing that one memory device 100 is included in the memory system 20. However, embodiments of the present disclosure are not limited thereto. For example, a plurality of memory devices may be included in the memory system 20.

To be specific, the memory device 100 may include a memory cell region 1502 for storing data, and the memory device 100 may loop back an externally inputted first modulation clock DCLK1 to output a second modulation clock DCLK2. In this case, the memory device 100 may synchronize read data RDDATA that are read from the memory cell region 1502 with the second modulation clock DCLK2 and output resultant synchronized data.

To be more specific, the memory device 100 may read the read data RDDATA from the memory cell region 1502 in response to a read command (not shown) inputted from the controller 200. Also, the memory device 100 may synchronize the read data RDDATA with the second modulation clock DCLK2 that is obtained by looping back the first modulation clock DCLK1 inputted from the controller 200 and output the resultant synchronized data. In other words, the loop-back operation circuit 1501 included in the memory device 100 may obtain the second modulation clock DCLK2 by looping back the first modulation clock DCLK1 inputted from the controller 200 and output the second modulation clock DCLK2 to the controller 200. Also, the output circuit 1503 included in the memory device 100 may output the read data RDDATA that are read from the memory cell region 1502 to the controller 200 in synchronization with the second modulation clock DCLK2.

Herein, the word 'loop-back' (or loopback) may refer to routing an input signal that is received, digital data streams, or flows of items without intentional processing or modification. In an embodiment, the loop-back operation circuit 1501 may be implemented as a circuit that couples a first channel receiving the first modulation clock DCLK1 and a second channel transmitting the second modulation clock DCLK2. For example, the circuit may include a unity-gain buffer coupled between the first channel and the second channel.

The controller 200 may generate a first modulation clock DCLK1 which is divided into N consecutive modulation sections by performing a modulation operation on the source clock SCCLK according to a specific scheme, output the generated first modulation clock DCLK1 to the memory device 100, and then receive the read data RDDATA transferred from the memory device 100 in response to the second modulation clock DCLK2 transferred from the memory device 100. Herein, N may be a natural number equal to or greater than 2. Also, the controller 200 may verify the reliability of the read data RDDATA corresponding to the N modulation sections included in the second modulation clock DCLK2 for each modulation section through a demodulation operation according to a specific scheme.

Herein, the operation of verifying the reliability of the read data RDDATA in the controller 200 may include an operation of verifying whether or not abnormal data are included in the read data RDDATA inputted through the input circuit 1302. In other words, the controller 200 may detect each of the N modulation sections included in the second modulation clock DCLK2 by performing a demodulation operation on the second modulation clock DCLK2 according to a specific scheme, and verify whether there is an abnormal section data or not among the N section data (not shown) that are included in the read data RDDATA and respectively corresponding to the N modulation sections in the second modulation clock DCLK2. For example, abnormal section data in the read data RDDATA may include one or more abnormal bits.

To be more specific, the clock generator 1301 included in the controller 200 may generate a source clock SCCLK. Also, the modulation circuit 1304 included in the controller 200 may generate a first modulation clock DCLK1 including N modulation sections by performing a modulation operation on the source clock SCCLK according to a specific scheme, and then output the first modulation clock DCLK1 to the memory device 100. In an embodiment, the modulation circuit 1304 is implemented as a circuit including a frequency modulation circuit. For example, the modulation circuit 1304 may include a frequency modulator that receives a DC input and generates the first modulation signal DCLK1 in response to the DC input by varying a value of the DC input to generate the N modulation sections of the first modulation signal DCLK1 having different frequencies. The input circuit 1302 included in the controller 200 may receive the read data RDDATA transferred from the memory device 100 in response to the second modulation clock DCLK2 transferred from the memory device 100. Also, the verification circuit 1305 included in the controller 200 may verify the reliability of the read data RDDATA corresponding to the N modulation sections that are included in the second modulation clock DCLK2 for each modulation section by performing a demodulation operation on the second modulation clock DCLK2 which is transferred from the memory device 100 according to a specific scheme.

The internal circuit 1303 included in the controller 200 may perform an operation for securing the reliability of the read data RDDATA inputted through the input circuit 1302 based on the verification information VRINFO outputted from the verification circuit 1305, and then use the read data RDDATA inputted through the input circuit 1302 according to a predetermined purpose.

Herein, the operation that may be performed in the internal circuit 1303 to secure the reliability of the read data RDDATA inputted through the input circuit 1302 may be an operation of requesting the memory device 100 to selectively re-read and output only abnormal section data from the memory cell region 1502 among N section data included in the read data RDDATA respectively corresponding to the N modulation sections included in the second modulation clock DCLK2. In short, when it is assumed that the read data RDDATA have a predetermined size, it may be an operation of requesting the memory device 100 to re-read only some abnormal section data among the N section data included in the read data RDDATA.

For example, although not illustrated in detail in the drawing, the internal circuit 1303 may generate a read command for selectively re-reading abnormal section data and transfer the generated read command to the memory device 150. Subsequently, when the section data that are requested to be re-read are transferred to the controller 200 and the reliability is verified by the verification circuit 1305, the internal circuit 1303 may use the entire read data RDDATA including the re-read section data for a predetermined purpose. For example, referring back to FIG. 42, the internal circuit 1303 may perform an operation for outputting the read data RDDATA to the host 300 communicating with the host interface unit 132 and the processor 134.

Figure 46:
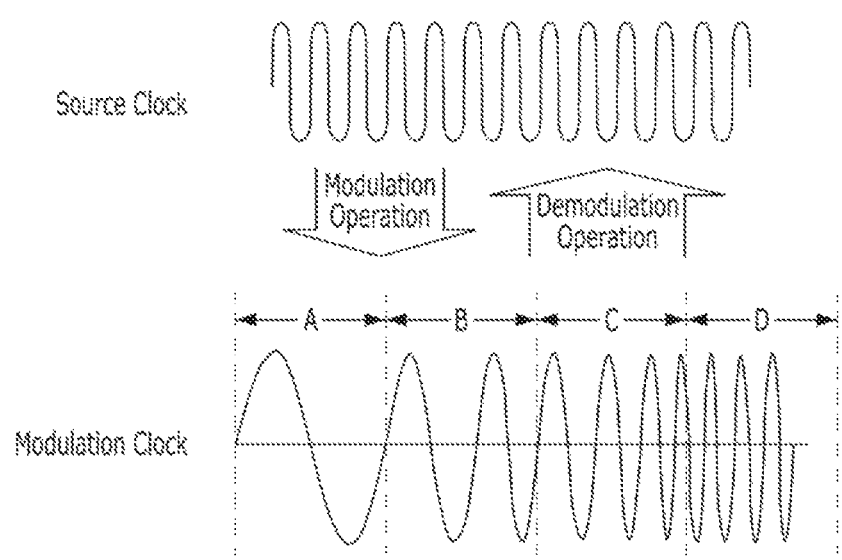
FIGS. 46 and 47 are waveform diagrams illustrating a clock modulation operation used in a memory system in accordance with an embodiment of the present disclosure.
Figure 47:
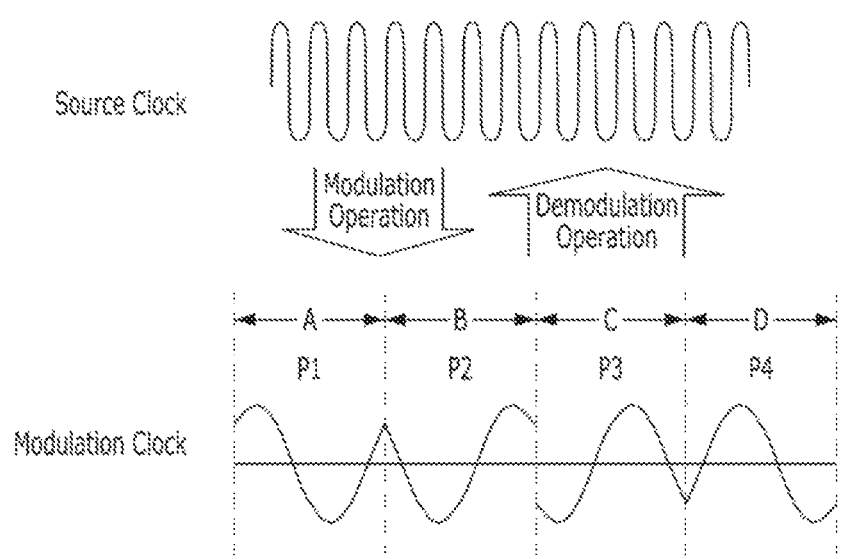

Meanwhile, FIGS. 44, 46, and 47 may be referred to in order to describe a modulation operation and a demodulation operation based on a specific scheme.

First of all, referring to FIGS. 44 and 46, the modulation operation and the demodulation operation based on the specific scheme may mean frequency modulation and frequency demodulation, respectively. In other words, the modulation operation based on the specific scheme may indicate a modulation operation using N different frequencies. Herein, it is assumed that N is a natural number equal to or greater than 2, and it is assumed in FIG. 46 that N is 4.

To be specific, for example, the source clock SCCLK generated by the clock generator 1301 of the controller 200 may have a substantially uniform frequency.

The modulation circuit 1304 included in the controller 200 may perform a frequency modulation operation of modulating the frequency of the source clock SCCLK to generate the first modulation clock DCLK1 that is divided into four modulation sections A, B, C, and D. Herein, the four modulation sections A, B, C, and D included in the first modulation clock DCLK1 may be detected according to their frequency differences. For example, the D section among the four modulation sections included in the first modulation clock DCLK1 may have substantially the same frequency as the source clock SCCLK, and the C section may have a lower frequency than the D section, and the B section may have a lower frequency than the C section, and the section A may have a lower frequency than the section B. That is, according to the embodiment shown in FIG. 46, frequencies may increase in the order of the A section, the B section, the C section, and the D section in the first modulation clock DCLK1. However, embodiments of the present disclosure are not limited thereto. For example, frequencies may decrease in the order of the A section, the B section, the C section, and the D section in the first modulation clock DCLK1. In an embodiment, the first modulation clock DCLK1 may include an odd number of modulation sections, rather than an even number (e.g., 4 in FIG. 46) of modulation sections. In an embodiment, a plurality of modulation sections of the first modulation clock DCLK1 have respective frequencies that are spaced apart at regular intervals.

Since the loop-back operation circuit 1501 included in the memory device 100 loops back the first modulation clock DCLK1 so as to produce the second modulation clock DCLK2 and outputs the second modulation clock DCLK2 to the controller 200, the second modulation clock DCLK2 may also include four modulation sections A, B, C, and D. Therefore, the four modulation sections A, B, C, and D included in the second modulation clock DCLK2 may also be detected according to their frequency differences.

The output circuit 1503 included in the memory device 100 may synchronize the read data RDDATA read from the memory cell region 1502 with each of the four modulation sections A, B, C, and D that are included in the second modulation clock DCLK2. Therefore, the value of the read data RDDATA may be determined based on each of the four modulation sections A, B, C, and D that are included in the second modulation clock DCLK2. For example, it may be assumed that the memory device 100 is a NAND flash memory and the read data RDDATA has a data size corresponding to four pages. In this case, a first portion of the read data RDDATA read from the first page (not shown) of the memory cell region 1502 included in the memory device 100 may be first section data that are synchronized with the A section among the four modulation sections A, B, C and D that are included in the second modulation clock DCLK2. A second portion of the read data RDDATA read from the second page (not shown) may be second section data that are synchronized with the B section. A third portion of the read data RDDATA read from the third page (not shown) may be third section data that are synchronized with the C section. A fourth portion of the read data RDDATA read from the fourth page (not shown) may be fourth section data that are synchronized with the D section.

To sum up, the read data RDDATA may include first to fourth section data. Also, the first to fourth section data included in the read data RDDATA may be respectively synchronized to the four modulation sections A, B, C, and D included in the second modulation clock DCLK2. Herein, since the four modulation sections A, B, C, and D included in the second modulation clock DCLK2 have different frequencies, the first to fourth section data included in the read data RDDATA may be in a state that they are respectively synchronized with clocks of different frequencies.

The input circuit 1302 included in the controller 200 may receive the read data RDDATA transferred from the memory device 100 in response to the second modulation clock DCLK2 which is transferred from the memory device 100.

The verification circuit 1305 included in the controller 200 may perform a frequency demodulation operation on the second modulation clock DCLK2 transferred from the memory device 100 to detect the four modulation sections A, B, C, and D included in the second modulation clock DCLK2. In other words, the verification circuit 1305 may detect a change in frequency by performing a frequency demodulation operation onto the second modulation clock DCLK2 so as to produce a detection result, and may detect the four consecutive modulation sections A, B, C, and D that are included in the second modulation clock DCLK2 based on the detection result. In an embodiment, the verification circuit 1305 may be implemented as a circuit including a frequency demodulation circuit whose transfer function is sensitive to frequency. For example, the verification circuit 1305 may include a frequency to voltage converter generating an output voltage that is proportional to a frequency of an input signal. The verification circuit 1305 may detect the first to fourth section data included in the read data RDDATA through an operation of detecting the four consecutive modulation sections A, B, C, and D that are included in the second modulation clock DCLK2 by each section. In other words, the verification circuit 1305 may determine a first portion of the read data RDDATA corresponding to the A section among the four consecutive modulation sections A, B, C, and D that are included in the second modulation clock DCLK2 as first section data, determine a second portion of the read data RDDATA corresponding to the B section as second section data, determine a third portion of the read data RDDATA corresponding to the C section as third section data, and determine a fourth portion of the read data RDDATA corresponding to the D section as fourth section data.

Also, the verification circuit 1305 may verify the reliability of the read data RDDATA for each modulation section by detecting the first to fourth section data that are included in the read data RDDATA. In other words, the verification circuit 1305 may independently verify whether each of the first to fourth section data that are included in the read data RDDATA is in a normal state or not.

For example, some bits included in the second section data among the first to fourth section data that are included in the read data RDDATA may be lost in the process of being transferred from the memory device 100 to the controller 200.

Herein, the verification circuit 1305 may verify that some bits of the second section data are missing among the first to fourth section data that are included in the read data RDDATA and the second section data are not in a normal state. Of course, the verification circuit 1305 may be able to verify that the remaining section data, which include the first, third, and fourth section data, are in a normal state. The verification circuit 1305 may generate verification information VRINFO, which represents a verification result that the second section data among the first to fourth section data included in the read data RDDATA are not in a normal state while the remaining first, third, and fourth section data are in a normal state and output the verification information VRINFO to the internal circuit 1303.

Accordingly, the internal circuit 1303 may be informed that the second section data among the first to fourth section data included in the read data RDDATA are not in a normal state in response to the verification information VRINFO outputted from the verification circuit 1305. As a result, the internal circuit 1303 may request the memory device 100 to selectively re-read and output only the second section data from the memory cell region 1502. For example, the internal circuit 1303 may generate a read command (not shown) for selectively re-reading only the second section data and transfer the read command to the memory device 100.

Herein, the internal circuit 1303 may stop the frequency modulation operation of the modulation circuit 1304 and the frequency demodulation operation of the verification circuit 1305 from a first time when the internal circuit 1303 requests the memory device 100 to perform a re-read operation to a second time when the re-read operation ends.

To be specific, the internal circuit 1303 may generate an operation selection signal OPC having a first value when the internal circuit 1303 requests the memory device 100 to re-read the second section data, and transfer the generated operation selection signal OPC to the modulation circuit 1304 and the verification circuit 1305. Herein, the modulation circuit 1304 may stop performing a frequency modulation operation in response to the operation selection signal OPC having the first value transferred from the internal circuit 1303. Similarly, the verification circuit 1305 may stop performing a frequency demodulation operation in response to the operation selection signal OPC having the first value transferred from the internal circuit 1303.

Herein, since the modulation circuit 1304 stops a frequency modulation operation, the source clock SCCLK generated by the clock generator 1301 may be transferred to the memory device 100 through the modulation circuit 1304. In this case, the loop-back operation circuit 1501 included in the memory device 100 may loop back the source clock SCCLK transferred from the controller 200 to transfer the result to the output circuit 1503 included in the controller 200 and the memory device 100. Accordingly, the output circuit 1503 may output the second section data that are re-read from the memory cell region 1502 to the controller 200 in synchronization with the source clock SCCLK.

Also, the input circuit 1302 included in the controller 200 may receive the second section data that are re-read from the memory device 100 in response to the source clock SCCLK transferred from the memory device 100.

The verification circuit 1305 included in the controller 200 may verify again whether the second section data that are re-read from the memory device 100 is in a normal state or not. In this case, the verification circuit 1305 may keep stopping the frequency demodulation operation since the modulation circuit 1304 stops the frequency modulation operation. Therefore, the verification circuit 1305 may verify whether the second section data transferred from the memory device 100 is in a normal state or not in response to the source clock SCCLK.

As a result of re-verifying the second section data transferred from the memory device 100 in the verification circuit 1305, when the second section data are in a normal state, verification information VRINFO indicating that the second section data are in a normal state may be generated and outputted to the internal circuit 1303. Accordingly, the internal circuit 1303 may combine the second section data that are re-read and verified to be in a normal state with the first, third, and fourth section data that are previously read and verified to be in a normal state, and thus it may be regarded that the read data RDDATA in which the first to fourth section data are all verified to be in a normal state are received. Therefore, the internal circuit 1303 may use the read data RDDATA whose first to fourth section data are all verified to be in a normal state according to a predetermined purpose. Also, the internal circuit 1303 may generate an operation selection signal OPC having a second value when the read data RDDATA whose first to fourth section data are all verified to be in a normal state are received, and transfer the generated operation selection signal OPC to the modulation circuit 1304 and the verification circuit 1305. Herein, the modulation circuit 1304 may resume performing the frequency modulation operation in response to the operation selection signal OPC having the second value transferred from the internal circuit 1303. Similarly, the verification circuit 1305 may resume performing the frequency demodulation operation in response to the operation selection signal OPC having the second value transferred from the internal circuit 1303.

When the verification circuit 1305 re-verifies the second section data transferred from the memory device 100 and it turns out that the second section data are still in an abnormal state, verification information VRINFO representing that the second section data are in an abnormal state may be generated again and outputted to the internal circuit 1303. In this case, the internal circuit 1303 may attempt a repetitive read operation of requesting the memory device 100 to selectively re-read and output the second section data or attempt a recovery operation of recovering the abnormal second section data into a normal state through an error correction code unit (e.g., the error correction code unit 138 in FIG. 42). Herein, which of the repetitive read operation and the recovery operation is to be performed in the internal circuit 1303 may be predetermined according to a designer's selection.

Referring to FIGS. 44 and 47, the modulation operation and the demodulation operation based on a specific scheme may mean phase modulation and phase demodulation, respectively. In other words, the modulation operation based on a specific scheme may mean a modulation operation using N different phases. Herein, it is assumed that N is a natural number equal to or greater than 2 and it is assumed in FIG. 47 that N is 4.

To be specific, for example, it may be regarded that the phase of the source clock SCCLK generated in the clock generator 1301 of the controller 200 has a reference phase.

The modulation circuit 1304 included in the controller 200 may perform a phase modulation operation of modulating the phase of the source clock SCCLK to generate a first modulation clock DCLK1 that is divided into four modulation sections A, B, C, and D. In this case, the four modulation sections A, B, C, and D included in the first modulation clock DCLK1 may be divided according to phase differences. For example, the section A among the four modulation sections included in the first modulation clock DCLK1 may have a phase difference of P1 with respect to the source clock SCCLK, the section B may have a phase difference of P2 with respect to the source clock SCCLK, the C section may have a phase difference of P3 with respect to the source clock SCCLK, and the section D may have a phase difference of P4 with respect to the source clock SCCLK. In an embodiment, the verification circuit 1305 may be implemented as a circuit including a phase demodulation circuit. In an embodiment, P1, P2, P3, and P4 may be approximately 45 degrees, 135 degrees, 225 degrees, and 315 degrees, respectively.

To sum up, the modulation operation and the demodulation operation based on a specific scheme' may represent frequency modulation and frequency demodulation, respectively, as described earlier with reference to FIGS. 44 and 46. Also, the modulation operation and the demodulation operation based on a specific scheme may mean phase modulation and phase demodulation, respectively, that are described with reference to FIGS. 44 and 47. As described above, the modulation operation and the demodulation operation based on a specific scheme may have a difference as shown in FIGS. 46 and 47, but the controller 200 and the memory device 100 of FIG. 44 operate similarly in that the controller 200 generates a modulation clock DCLK1 including N modulation sections by performing a modulation operation onto the source clock SCCLK, receives the read data RDDATA in synchronization with the modulation clock DCLK2, and performs an operation of verifying the reliability of the read data RDDATA corresponding to the N modulation sections that are included in the modulation clock DCLK2 by performing a demodulation operation. Therefore, detailed descriptions on the operation of the controller 200 and the memory device 100 of FIG. 44 based on the scheme of FIG. 47 that are similar to those described above with reference to FIGS. 44 and 47 may be omitted in the interest of brevity.

Figure 45:
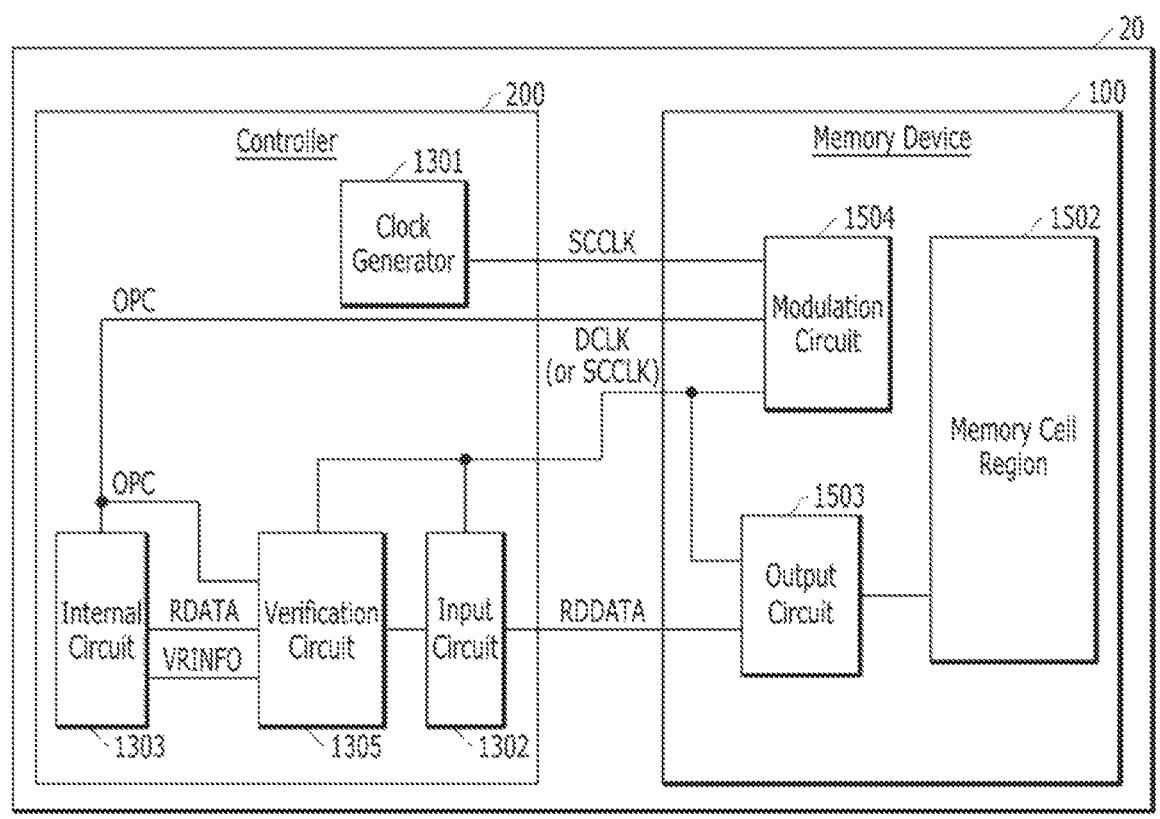
FIG. 45 is a block diagram illustrating an operation of a memory system in accordance with an embodiment of the present disclosure.

FIG. 45 is a block diagram illustrating an operation of a memory system 20 in accordance with an embodiment of the present disclosure.

Referring to FIG. 45, the memory system 20 may include a controller 200 and a memory device 100. Herein, the controller 200 may include a clock generator 1301, an input circuit 1302, an internal circuit 1303, and a verification circuit 1305. The memory device 100 may include a modulation circuit 1504, a memory cell region 1502, and an output circuit 1503. Herein, the clock generator 1301, the input circuit 1302, and the verification circuit 1305 included in the controller 200 may be constituent elements corresponding to the memory interface unit 142 which is described as a constituent element included in the controller 200 in FIG. 42. Also, the internal circuit 1303 included in the controller 200 may be a constituent element corresponding to one or more among the host interface unit 132, the processor 134, the error correction code (ECC) unit 138, the power management unit (PMU) 140, and the memory 144, which are described as the constituent elements included in the controller 200 in FIG. 42. The memory cell region 1502 included in the memory device 100 may be a constituent element corresponding to a plurality of memory blocks 152, 154, and 156 described as being included in the memory device 100 in FIG. 42. Also, FIG. 45 shows a structure in which one memory device 100 is included in the memory system 20. However, embodiments of the present disclosure are not limited thereto. For example, a plurality of memory devices may be included in the memory system 20.

To be specific, the memory device 100 may include a memory cell region 1502 for storing data, and generate a modulation clock DCLK including N modulation sections by performing a modulation operation on an externally inputted source clock SCCLK according to a specific scheme. Herein, N may be a natural number equal to or greater than 2. Also, the memory device 100 may output the read data RDDATA that are read from the memory cell region 1502 in synchronization with the modulation clock DCLK.

To be more specific, the memory device 100 may read the read data RDDATA from the memory cell region 1502 in response to a read command (not shown) inputted from the controller 200. Also, the memory device 100 may generate a modulation clock DCLK including N modulation sections by performing a modulation operation on the source clock SCCLK according to a specific scheme. Also, the memory device 100 may synchronize the read data RDDATA with the modulation clock DCLK and output the result to the controller 200. Also, the modulation circuit 1504 included in the memory device 100 may generate a modulation clock DCLK by performing a modulation operation on the source clock SCCLK according to a specific scheme and output the generated modulation clock DCLK to the controller 200. The output circuit 1503 included in the memory device 100 may read the read data RDDATA from the memory cell region 1502 in synchronization with the modulation clock DCLK and output the read data RDDATA to the controller 200.

The controller 200 may output the source clock SCCLK to the memory device 100, and then receive the read data RDDATA transferred from the memory device 100 in response to the modulation clock DCLK transferred from the memory device 100. Also, the controller 200 may verify the reliability of the read data RDDATA corresponding to the N modulation sections that are included in the modulation clock DCLK for each modulation section through a demodulation operation according to a specific scheme.

Herein, the operation of verifying the reliability of the read data RDDATA in the controller 200 may include an operation of verifying whether abnormal data are included in the read data RDDATA inputted through the input circuit 1302. In other words, the controller 200 may divide the modulation clock DCLK into N modulation sections through a demodulation operation based on a specific scheme, and verify whether there are abnormal section data among the N section data (not shown) included in the read data RDDATA and respectively corresponding to the N modulation sections in the modulation clock DCLK.

To be more specific, the clock generator 1301 included in the controller 200 may generate a source clock SCCLK. The modulation circuit 1504 included in the memory device 100 may receive the source clock SCCLK generated by the clock generator 1301, perform a modulation operation on the source clock SCCLK according to a specific scheme so as to generate the modulation clock DCLK including the N modulation sections, and output the modulation clock DCLK to the controller 200. In an embodiment, the modulation circuit 1504 is implemented to include a frequency modulation circuit. For example, the modulation circuit 1504 includes a frequency modulator that receives a DC input and generates the modulation signal DCLK in response to the DC input by varying a value of the DC input to generate the N modulation sections of the modulation signal DCLK having different frequencies. The output circuit 1503 included in the memory device 100 may output the read data RDDATA to the controller 200 in response to the modulation clock DCLK. The input circuit 1302 included in the controller 200 may receive the read data RDDATA transferred from the memory device 100 in response to the modulation clock DCLK transferred from the memory device 100. Also, the verification circuit 1305 included in the controller 200 may perform a demodulation operation on the modulation clock DCLK according to a specific scheme, and verify the reliability of the read data RDDATA corresponding to the N modulation sections included in the modulation clock DCLK for each modulation section.

The internal circuit 1303 included in the controller 200 may perform an operation for securing the reliability of the read data RDDATA inputted through the input circuit 1302 based on the verification information VRINFO outputted from the verification circuit 1305, and then use the read data RDDATA inputted through the input circuit 1302 according to a predetermined purpose.

Herein, the operation for securing the reliability of the read data RDDATA inputted through the input circuit 1302 may be an operation for requesting the memory device 100 to selectively re-read and output only abnormal section data among N section data included in the read data RDDATA respectively corresponding to the N modulation sections included in the modulation clock DCLK. In other words, when it is assumed that the read data RDDATA have a predetermined size, the operation may be an operation for requesting the memory device 100 to re-read only some section data that are abnormal among the N section data included in the read data RDDATA. For example, although not illustrated in detail in the drawing, the internal circuit 1303 may generate a read command for selectively re-reading abnormal section data and transfer the read command to the memory device 100. Subsequently, when some section data that are requested to be re-read are transferred to the controller 200 and the reliability of the section data is verified by the verification circuit 1305, the internal circuit 1303 may use the read data RDDATA including the section data that are re-read for a predetermined purpose. For example, referring back to FIG. 42, the internal circuit 1303 may perform an operation for outputting read data RDDATA to the host 102 communicating with the host interface unit 132 and the processor 134.

Meanwhile, FIGS. 45, 46, and 47 may be referred to in order to describe a modulation operation and a demodulation operation based on a specific scheme.

First, referring to FIGS. 45 and 46, the modulation operation and the demodulation operation based on the specific scheme may refer to frequency modulation and frequency demodulation, respectively. In other words, the modulation operation based on the specific scheme may mean a modulation operation using N different frequencies. Herein, it is assumed that N is a natural number equal to or greater than 2, and it is assumed in FIG. 46 that N is 4.

To be specific, for example, the source clock SCCLK generated by the clock generator 1301 of the controller 200 may have a substantially uniform frequency.

The modulation circuit 1504 included in the memory device 100 may perform a frequency modulation operation of modulating the frequency of the source clock SCCLK inputted from the controller 200 to generate the modulation clock DCLK that is divided into four modulation sections A, B, C, and D. The four modulation sections A, B, C, and D included in the modulation clock DCLK may be detected according to their frequency differences. For example, the section D of the four modulation sections included in the modulation clock DCLK may have substantially the same frequency as the source clock SCCLK, and the section C may have a lower frequency than the section D, and the section B may have a lower frequency than the section C, and the section A may have a lower frequency than the section B.

The output circuit 1503 included in the memory device 100 may output the read data RDDATA read from the memory cell region 1502 in synchronization with the respective four modulation sections A, B, C, and D included in the modulation clock DCLK. Therefore, the value of the read data RDDATA may be determined according to each of the four modulation sections A, B, C, and D included in the modulation clock DCLK. For example, it may be assumed that the memory device 100 is a NAND flash memory and the read data RDDATA have a data size corresponding to four pages. In this case, a first portion of the read data RDDATA read from the first page (not shown) of the memory cell region 1502 included in the memory device 100 may be first section data that are synchronized with the section A among the four modulation sections A, B, C, and D included in the modulation clock DCLK. A second portion of the read data RDDATA read from the second page (not shown) may be second section data that are synchronized with the section B. A third portion of the read data RDDATA read from the third page (not shown) may be third section data that are synchronized with the section C. A fourth portion of the read data RDDATA read from the fourth page (not shown) may be fourth section data that are synchronized with the section D.

To sum up, the read data RDDATA may include the first to fourth section data. Also, the first to fourth section data included in the read data RDDATA may be respectively synchronized with the four modulation sections A, B, C, and D included in the modulation clock DCLK. Herein, since the four modulation sections A, B, C, and D included in the modulation clock DCLK have different frequencies, the first to fourth section data included in the read data RDDATA may be synchronized with clocks of different frequencies, respectively.

The input circuit 1302 included in the controller 200 may receive the read data RDDATA transferred from the memory device 100 in response to the modulation clock DCLK transferred from the memory device 100.

The verification circuit 1305 included in the controller 200 may perform a frequency demodulation operation on the modulation clock DCLK transferred from the memory device 100, thereby providing four modulation sections A, B, C, and D. In other words, the verification circuit 1305 may detect a change in frequency by performing a frequency demodulation operation onto the modulation clock DCLK so as to produce a frequency change detection result. Based on the frequency change detection result, the four consecutive modulation sections A, B, C, and D that are included in the modulation clock DCLK may be distinguished. As such, the verification circuit 1305 may be able to detect the first to fourth section data that are included in the read data RDDATA through an operation of detecting the four consecutive modulation sections A, B, C, and D included in the modulation clock DCLK. To be specific, the verification circuit 1305 may detect a first portion of the read data RDDATA corresponding to the section A among the four consecutive modulation sections A, B, C, and D included in the modulation clock DCLK as the first section data, detect a second portion of the read data RDDATA corresponding to the section B as the second section data, detect a third portion of the read data RDDATA corresponding to the section C as the third section data, and detect a fourth portion of the read data RDDATA corresponding to the section D as the fourth section data.

Also, the verification circuit 1305 may be able to verify the reliability of the read data RDDATA for each modulation section by detecting the first to fourth section data included in the read data RDDATA. In other words, the verification circuit 1305 may be able to independently verify whether each of the first to fourth section data included in the read data RDDATA is in a normal state or not.

For example, some bits included in the second section data among the first to fourth section data included in the read data RDDATA may be lost in the process of being transferred from the memory device 100 to the controller 200.

In this case, the verification circuit 1305 may be able to verify that some bits of the second section data are missing among the first to fourth section data included in the read data RDDATA and thus the second section data are not in a normal state. Of course, the verification circuit 1305 may be able to verify that the remaining section data, i.e., the first, third and fourth section data, are in a normal state. The verification circuit 1305 may generate verification information VRINFO that represents the result verifying that the second section data are not in a normal state while the remaining first, third, and fourth section data are in a normal state, and output the generated verification information VRINFO to the internal circuit 1303.

Accordingly, the internal circuit 1303 may determine that the second section data among the first to fourth section data included in the read data RDDATA are not in a normal state based on the verification information VRINFO outputted from the verification circuit 1305. Subsequently, the internal circuit 1303 may request the memory device 100 to selectively re-read and output only the second section data from the memory cell region 1502. For example, the internal circuit 1303 may generate a read command (not shown) for selectively re-reading only the second section data and transfer the read command to the memory device 100.

Herein, the internal circuit 1303 may stop the frequency modulation operation of the modulation circuit 1504 included in the memory device 100 and the frequency demodulation operation of the verification circuit 1305 included in the controller 200 from the moment when it requests the memory device 100 to perform the re-read operation until the re-read operation is complete.

To be specific, the internal circuit 1303 may generate an operation selection signal OPC having the first value when the internal circuit 1303 requests the memory device 100 to re-read the second section data, and then transfer the generated operation selection signal OPC to the modulation circuit 1504 and the verification circuit 1305. Herein, the modulation circuit 1504 included in the memory device 100 may stop performing the frequency modulation operation in response to the operation selection signal OPC having the first value transferred from the internal circuit 1303. Also, the verification circuit 1305 may stop performing the frequency demodulation operation in response to the operation selection signal OPC having the first value transferred from the internal circuit 1303.

Herein, since the modulation circuit 1504 has stopped the frequency modulation operation, the modulation circuit 1504 included in the memory device 100 may transfer the source clock SCCLK generated by the clock generator 1301 included in the controller 200 back to the controller 200. To be specific, the modulation circuit 1504 included in the memory device 100 may transfer the source clock SCCLK from the controller 200 to the output circuit 1503 included in the memory device 100 and the controller 200. Accordingly, the output circuit 1503 may output the second section data re-read from the memory cell region 1502 to the controller 200 in synchronization with the source clock SCCLK.

Also, the input circuit 1302 included in the controller 200 may receive the second section data that are re-read from the memory device 100 in response to the source clock SCCLK which is transferred from the memory device 100.

The verification circuit 1305 included in the controller 200 may verify again whether the second section data re-read from the memory device 100 are in a normal state or not. Herein, the verification circuit 1305 may keep stopping the frequency demodulation operation since the moment when the modulation circuit 1504 stops the frequency modulation operation. Therefore, the verification circuit 1305 may verify whether the second section data transferred from the memory device 100 are in a normal state or not in response to the source clock SCCLK.

As a result of verifying the second section data transferred from the memory device 100 in the verification circuit 1305, when it turns out that the second section data are in a normal state, verification information VRINFO indicating that the second section data are in a normal state may be generated and outputted to the internal circuit 1303. Accordingly, the internal circuit 1303 may combine the second section data that are re-read and verified to be in a normal state with the first, third, and fourth section data that are previously read and verified to be in a normal state. As a result, the internal circuit 1303 may receive the read data RDDATA whose first to fourth section data are all verified to be in a normal state. Therefore, the internal circuit 1303 may be able to use the read data RDDATA whose first to fourth section data included therein are all verified to be in a normal state according to a predetermined purpose. Also, the internal circuit 1303 may generate an operation selection signal OPC having a second value when the read data RDDATA which is verified to have all the first to fourth section data in a normal state and transfer the generated operation selection signal OPC to the modulation circuit 1504 included in the memory device 100 and the verification circuit 1305 included in the controller 200. Herein, the modulation circuit 1504 included in the memory device 100 may resume performing the frequency modulation operation in response to the operation selection signal OPC having the second value transferred from the internal circuit 1303. Also, the verification circuit 1305 included in the controller 200 may resume performing the frequency demodulation operation in response to the operation selection signal OPC having the second value transferred from the internal circuit 1303.

Herein, although the operation selection signal OPC is illustrated as being directly inputted to the modulation circuit 1504 included in the memory device 100, this is because the drawing is briefly illustrated to facilitate understanding of embodiments of the present disclosure. However, embodiments of the present disclosure are not limited thereto. For example, the operation selection signal OPC generated by the internal circuit 1303 may be transferred to the modulation circuit 1504 included in the memory device 100 in a form that the operation selection signal OPC is included in a particular command transferred from the controller 200 to the memory device 100.

As a result of re-verifying the second section data transferred from the memory device 100 in the verification circuit 1305, when the second section data are still in an abnormal state, verification information VRINFO indicating that the second section data are in an abnormal state is re-generated and outputted to the internal circuit 1303. In this case, the internal circuit 1303 may attempt a repetitive read operation of requesting the memory device 100 to selectively re-read and output the second section data, and may attempt a recovery operation of recovering the abnormal second section data into a normal state through an error correction code unit (e.g., the error correction code unit 138 in FIG. 42) that may be included therein. Herein, which operation between the repetitive read operation and the recovery operation is to be performed in the internal circuit 1303 may be predetermined according to a designer's selection.

Referring to FIGS. 45 and 47, the modulation operation and the demodulation operation based on a specific scheme may mean phase modulation and phase demodulation, respectively. In short, the modulation operation based on a specific scheme may mean a modulation operation using N different phases. Herein, it is assumed that N is a natural number equal to or greater than 2 and it is assumed in FIG. 47 that N is 4.

To be specific, for example, it may be regarded that the phase of the source clock SCCLK generated in the clock generator 1301 of the controller 200 has a reference phase.

The modulation circuit 1504 included in the memory device 100 may generate a modulation clock DCLK that is divided into four phase modulation operations A, B, C, and D by performing a phase modulation operation of modulating the phase of the source clock SCCLK inputted from the controller 200. Herein, the four modulation sections A, B, C, and D included in the modulation clock DCLK may be detected according to their phase differences. For example, the section A among the four modulation sections included in the modulation clock DCLK may have a phase difference of P1 with respect to the source clock SCCLK, the section B may have a phase difference of P2 with respect to the source clock SCCLK, the section C may have a phase difference of P3 with respect to the source clock SCCLK, and the section D may have a phase difference of P4 with respect to the source clock SCCLK. In an embodiment, P1, P2, P3, and P4 may be approximately 45 degrees, 135 degrees, 225 degrees, and 315 degrees, respectively.

To sum up, the modulation operation and the demodulation operation based on a specific scheme may refer to frequency modulation and frequency demodulation, respectively, which are described earlier with reference to FIGS. 45 and 46. Also, the modulation operation and the demodulation operation based on a specific scheme may refer to phase modulation and phase demodulation, respectively, which are described with reference to FIGS. 45 and 47. As described above, although the modulation operation and the demodulation operation based on a specific scheme may be different from each other, as shown in FIGS. 46 and 47, the controller 200 and the memory device 100 of FIG. 45 operate similarly in that after the memory device 100 generates the modulation clock DCLK1 including the N modulation sections by performing a modulation operation on the source clock SCCLK, the controller 200 receives the read data RDDATA transferred in a state synchronized to the modulation clock DCLK2 and performs an operation of verifying the reliability of the read data RDDATA corresponding to the N modulation sections included in the modulation clock DCLK2 for each modulation section by performing a demodulation operation in the controller 200. Therefore, detailed descriptions on the operation of the controller 200 and the memory device 100 of FIG. 45 based on the scheme of FIG. 47 that are similar to those described above with reference to FIGS. 45 and 46 may be omitted in the interest of brevity.

According to the embodiment of the present disclosure described above, a data clock may be modulated through a modulation operation based on a specific scheme to generate a modulated data clock, and verification information for verifying the reliability of the read data RDDATA that are read from the memory device 100 may be included in the modulated data clock. Herein, since the read data are synchronized with the modulated data clock and outputted from the memory device 100, the verification information may be detected in the outside of the memory device by demodulating the modulated data clock through a demodulation operation based on a specific scheme. The reliability of the read data may be verified based on the detected verification information.

According to the embodiments of the present disclosure, verification information for verifying the reliability of read data that are read from a memory device may be included in a modulated data clock by modulating a data clock through a modulation operation based on a specific scheme and generating a modulated data clock.

Herein, since the read data are outputted from the memory device after being synchronized with the modulated data clock, the verification information may be obtained by demodulating the modulated data clock through a demodulation operation based on a specific scheme, and the reliability of the read data may be verified based on the obtained verification information. For example, a memory system according to an embodiment of the present disclosure may perform a modulation operation on a clock signal to generate a modulation clock signal that includes a plurality of modulation sections. When read data are read in synchronization with the modulation clock signal, the memory system performs a demodulation operation on the modulation clock signal to distinguish the plurality of modulation sections in the modulation clock signal, and thus a plurality of section data of the read data respectively corresponding to the plurality of modulation sections of the modulation clock signal can be distinguished. In other words, the memory system indexes the read data by the plurality of modulation sections of the modulation clock signal that respectively correspond to the plurality of section data of the read data. When specific section data of the read data includes one or more abnormal bits, the specific section data may be re-read from a memory cell region, rather than re-reading the entire read data, thereby increasing the efficiency of performing a read operation compared to a conventional memory system.

While the present disclosure has been shown and described with reference to certain embodiments thereof, it will be understood by those skilled in the art that various changes in form and details may be made therein without departing from the spirit and scope of the present invention as defined by the appended claims and their equivalents. Therefore, the scope of the present invention should not be limited to the above-described embodiments but should be determined by the appended claims including equivalents thereof.

In the above-described embodiments, steps may be selectively performed or some steps or portions thereof may be omitted. Steps need not necessarily be performed in accordance with the described order in all embodiments. The disclosed embodiments are provided to facilitate an understanding of the present invention, not to limit it. That is, it should be apparent to those skilled in the art that various modifications can be made on the basis of the technological scope of the present disclosure.

Although specific terminologies are used herein, they are used only to explain the embodiments of the present disclosure. Therefore, the present disclosure is not restricted to the above-described embodiments, as those skilled in the art will recognize that many variations are possible within the spirit and scope of the present disclosure. The present invention encompasses all modifications and variations of any disclosed embodiment that fall within the scope of the appended claims.

What is claimed is:

1. A memory system, comprising:
 a memory device including a memory cell region for storing data, the memory device looping back a first clock to generate a second clock and outputting read data that are read from the memory cell region in synchronization with the second clock; and
 a memory controller generating the first clock that includes a plurality of modulation sections by performing a modulation operation on a source clock according to a specific scheme, outputting the first clock to the memory device, and receiving the read data in response to the second clock,
 wherein the read data includes a plurality of section data corresponding to the plurality of modulation sections included in the second clock, respectively, and the memory controller verifies reliability of each of the plurality of section data included in the read data by performing a demodulation operation on the second clock according to the specific scheme.

2. The memory system of claim 1, wherein the modulation operation according to the specific scheme includes a frequency modulation operation using a plurality of frequencies.

3. The memory system of claim 1, wherein the plurality of modulation sections included in the first clock is detected based on a frequency difference.

4. The memory system of claim 1, wherein the modulation operation according to the specific scheme includes a phase modulation operation using a plurality of phases.

5. The memory system of claim 1, wherein the plurality of modulation sections included in the first clock is detected based on a phase difference.

6. The memory system of claim 1, wherein the memory controller detects the plurality of modulation sections included in the second clock through the demodulation operation, and verifies whether one or more abnormal section data exist among the plurality of section data.

7. The memory system of claim 1, wherein the memory controller requests the memory device to selectively re-read and output abnormal section data.

8. The memory system of claim 1, wherein the first clock is generated without performing the modulation operation on the source clock, the first clock and the source clock have substantially a same frequency and a same phase, and the source clock is transferred to be the first clock without performing the modulation operation.

9. The memory system of claim 1, wherein each of the plurality of section data has a same and predetermined size.

10. The memory system of claim 1, wherein the memory controller includes an error correction code (ECC) decoder to verify the reliability of each of the plurality of section data by performing error correction decoding.

11. The memory system of claim 1, wherein the memory controller includes an internal circuit and a modulation circuit, and
 wherein, when detecting an abnormal state, the internal circuit generates a selection signal having a first value to request a re-read operation and pause the modulation operation to the modulation circuit.

12. The memory system of claim 11, wherein, when the selection signal has the first value, the source clock bypasses the modulation circuit and is transferred to the memory device.

13. The memory system of claim 11, wherein, when the selection signal has first value, the internal circuit sends a re-read command with selection information to the memory device to re-read a selected portion from the memory cell region.

14. The memory system of claim 11, wherein the memory controller further includes a verification circuit, and
 wherein the verification circuit sends a verification signal indicating a verification result of a re-read portion to the internal circuit.

15. The memory system of claim 14, wherein the internal circuit generates a selection signal corresponding to the verification result of the re-read portion, and wherein, when the selection signal corresponding to the verification result of the re-read portion has a second value, the internal circuit resumes the modulation operation of the modulation circuit.

16. The memory system of claim 14, wherein, when the selection signal has a second value, the internal circuit combines a selected portion and a previously read portion and sends the selection signal to the modulation circuit, or the verification circuit, or both.

17. The memory system of claim 1, wherein the memory controller includes a verification circuit which generates an output voltage that is proportional to a phase or a frequency of an input signal.

18. The memory system of claim 11, wherein the memory controller includes an idle time monitor configured to check an idle time interval between an end time of a previous operation of the memory device and a start time of a current operation.

19. The memory system of claim 18, wherein the modulation circuit is configured to generate the first clock based on the idle time interval and output the first clock to the memory device through a channel to perform the current operation.

20. The memory system of claim 1, wherein the memory controller further includes a dummy manager configured to output a request for controlling a dummy pulse to be applied to channels of selected memory devices according to device information among a plurality of channels.

21. The memory system of claim 20, wherein the memory controller further includes a dummy pulse generator configured to apply the dummy pulse to the channels coupled to the selected memory devices based on the request for controlling the dummy pulse.

* * * * *